United States Patent
Onuki et al.

(10) Patent No.: US 11,711,922 B2
(45) Date of Patent: Jul. 25, 2023

(54) MEMORY DEVICE WITH MEMORY CELLS COMPRISING MULTIPLE TRANSISTORS

(71) Applicant: SEMICONDUCTOR ENERGY LABORATORY CO., LTD., Atsugi (JP)

(72) Inventors: Tatsuya Onuki, Kanagawa (JP); Takanori Matsuzaki, Kanagawa (JP); Shunpei Yamazaki, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 315 days.

(21) Appl. No.: 16/925,648

(22) Filed: Jul. 10, 2020

(65) Prior Publication Data

US 2021/0013223 A1    Jan. 14, 2021

(30) Foreign Application Priority Data

Jul. 12, 2019 (JP) ................. 2019-129816
Jul. 19, 2019 (JP) ................. 2019-133529

(51) Int. Cl.
| | | |
|---|---|---|
| G11C 16/10 | (2006.01) | |
| H10B 43/40 | (2023.01) | |
| G11C 16/26 | (2006.01) | |
| G11C 16/08 | (2006.01) | |
| G11C 16/24 | (2006.01) | |
| H10B 43/10 | (2023.01) | |

(Continued)

(52) U.S. Cl.
CPC ............. *H10B 43/40* (2023.02); *G11C 16/08* (2013.01); *G11C 16/10* (2013.01); *G11C 16/24* (2013.01); *G11C 16/26* (2013.01); *H10B 43/10* (2023.02); *H10B 43/27* (2023.02); *H10B 43/35* (2023.02)

(58) Field of Classification Search
CPC ......... H01L 27/11573; H01L 27/11565; H01L 27/1157; H01L 27/11582; H01L 27/108; H01L 27/1225; G11C 16/08; G11C 16/10; G11C 16/24; G11C 16/26; G11C 16/0408; G11C 11/40; G11C 16/0458; H10B 43/40; H10B 43/10; H10B 43/27; H10B 43/35; H10B 12/00
See application file for complete search history.

(56) References Cited

U.S. PATENT DOCUMENTS

| | | |
|---|---|---|
| 7,674,650 B2 | 3/2010 | Akimoto et al. |
| 8,455,868 B2 | 6/2013 | Yamazaki et al. |

(Continued)

FOREIGN PATENT DOCUMENTS

| | | |
|---|---|---|
| JP | 2007-123861 A | 5/2007 |
| JP | 2011-151383 A | 8/2011 |
| JP | 2016-115387 A | 6/2016 |

*Primary Examiner* — Jerome Leboeuf
(74) *Attorney, Agent, or Firm* — Nixon Peabody LLP; Jeffrey L. Costellia

(57) ABSTRACT

A memory device with large storage capacity is provided. A NAND memory device includes a plurality of connected memory elements each provided with a writing transistor and a reading transistor. An oxide semiconductor is used in a semiconductor layer of the writing transistor, whereby a storage capacitor is not necessary or the size of the storage capacitor can be reduced. The reading transistor includes a back gate. When a reading voltage is applied to the back gate, data stored in the memory element is read out.

19 Claims, 37 Drawing Sheets

(51) Int. Cl.
*H10B 43/27* (2023.01)
*H10B 43/35* (2023.01)

(56) References Cited

U.S. PATENT DOCUMENTS

| | | | |
|---|---|---|---|
| 9,318,374 | B2 | 4/2016 | Atsumi et al. |
| 9,570,116 | B2 | 2/2017 | Kato |
| 9,748,274 | B2 | 8/2017 | Ishizu et al. |
| 9,947,777 | B2 | 4/2018 | Yamazaki et al. |
| 10,741,679 | B2 | 8/2020 | Yamazaki et al. |
| 2016/0351243 | A1* | 12/2016 | Ishizu ................ H01L 27/1207 |
| 2016/0351572 | A1* | 12/2016 | Atsumi ............... H01L 27/1251 |
| 2020/0081283 | A1 | 3/2020 | Kondo et al. |
| 2020/0184137 | A1 | 6/2020 | Tsutsui et al. |
| 2020/0203489 | A1 | 6/2020 | Tochibayashi et al. |

* cited by examiner

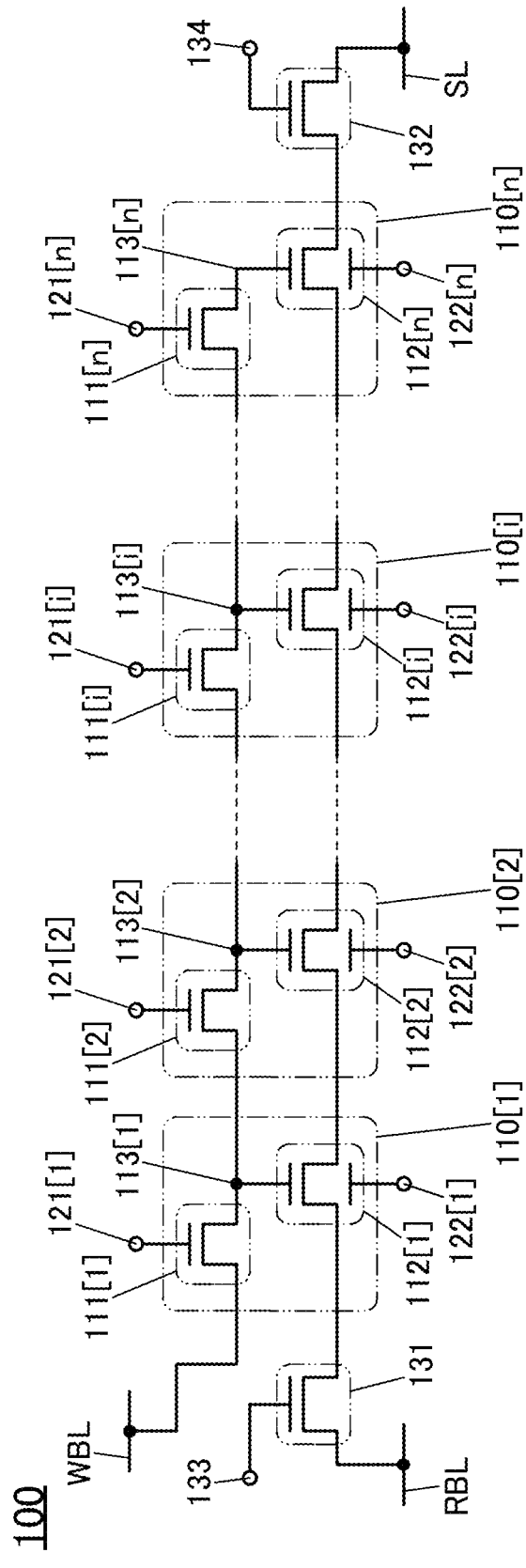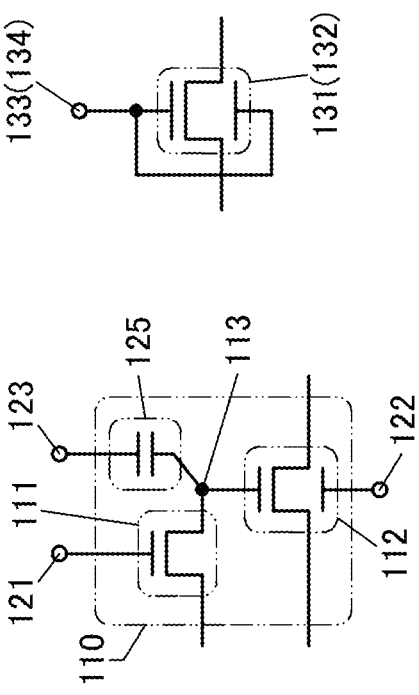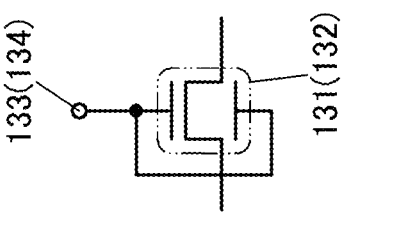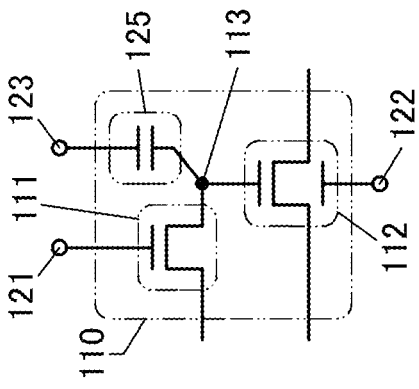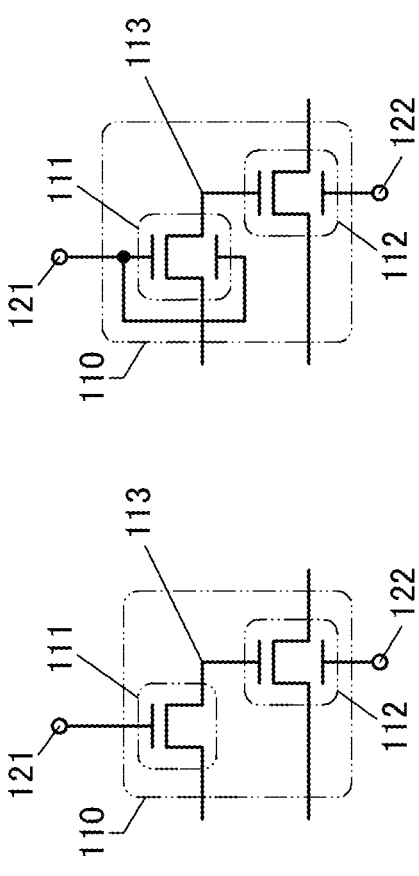

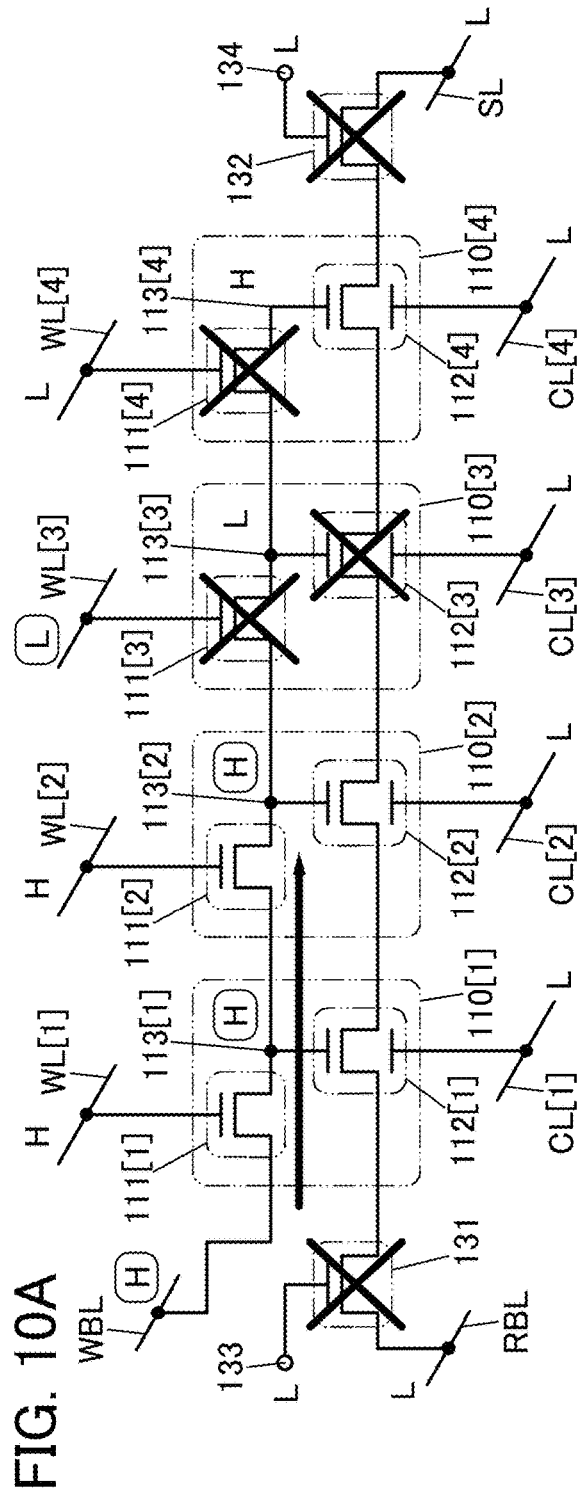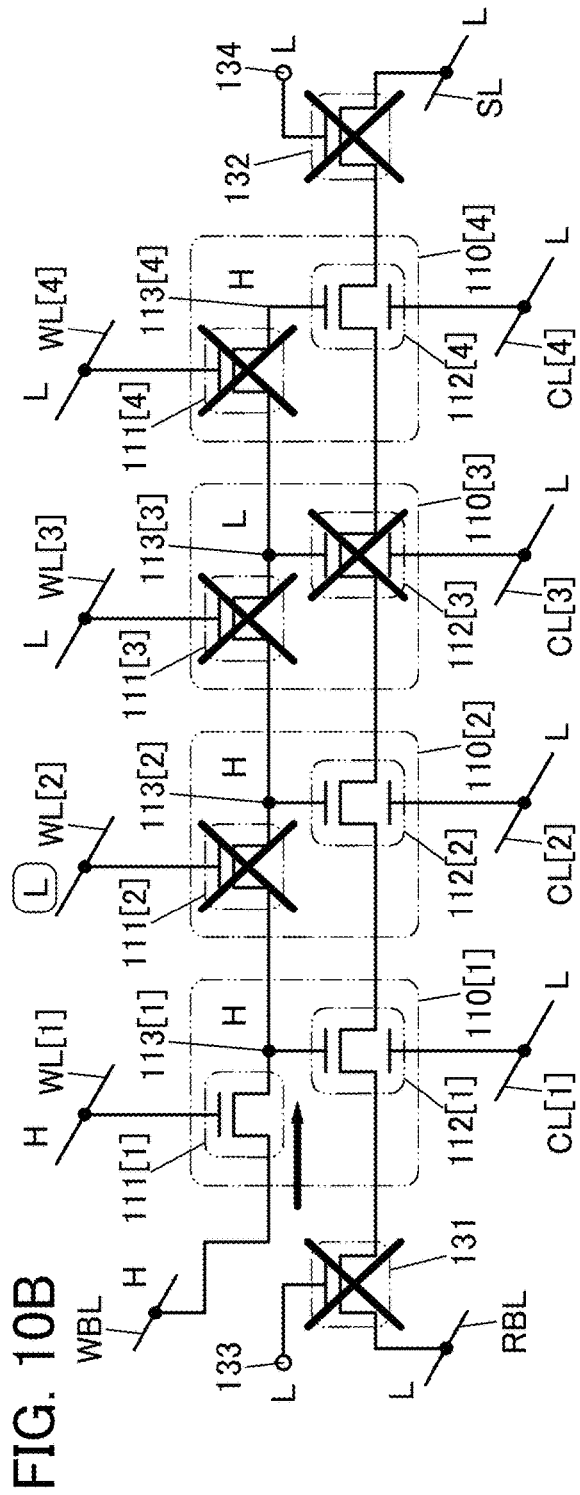

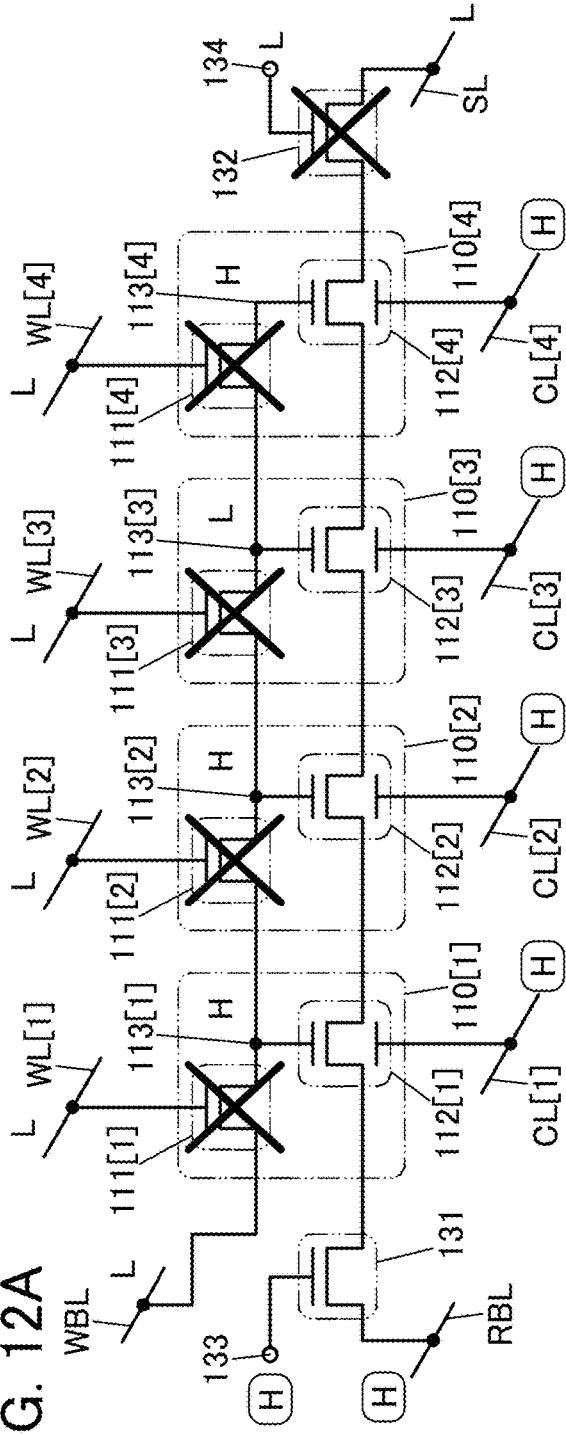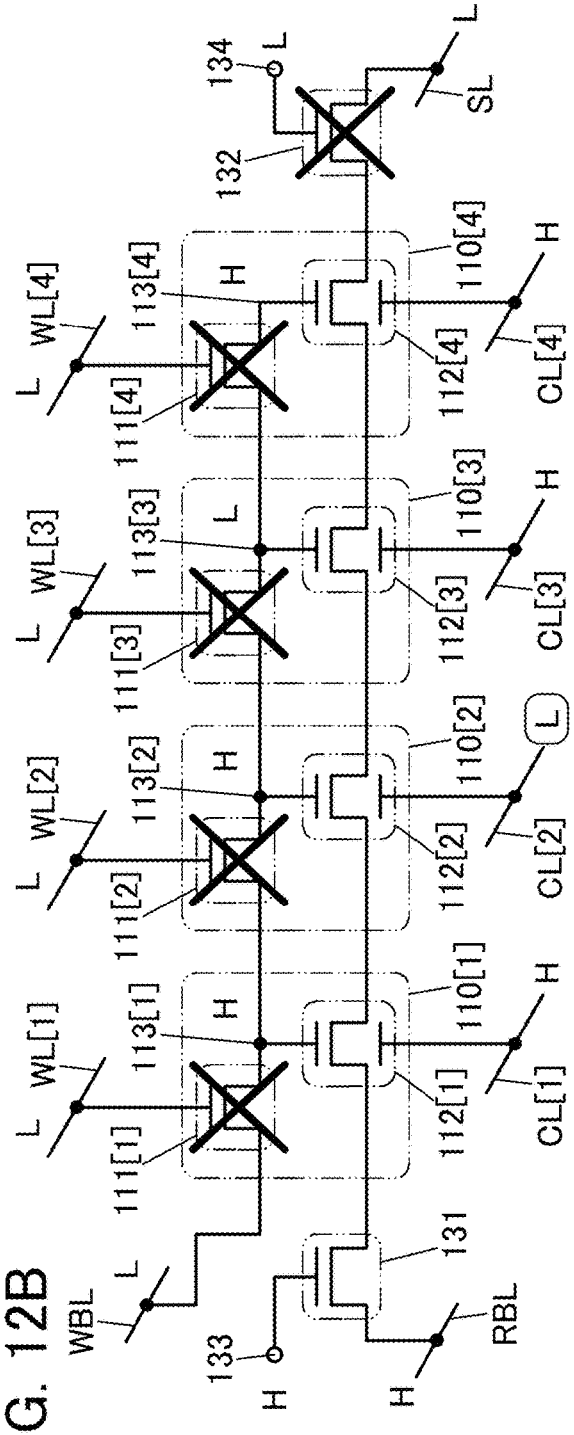

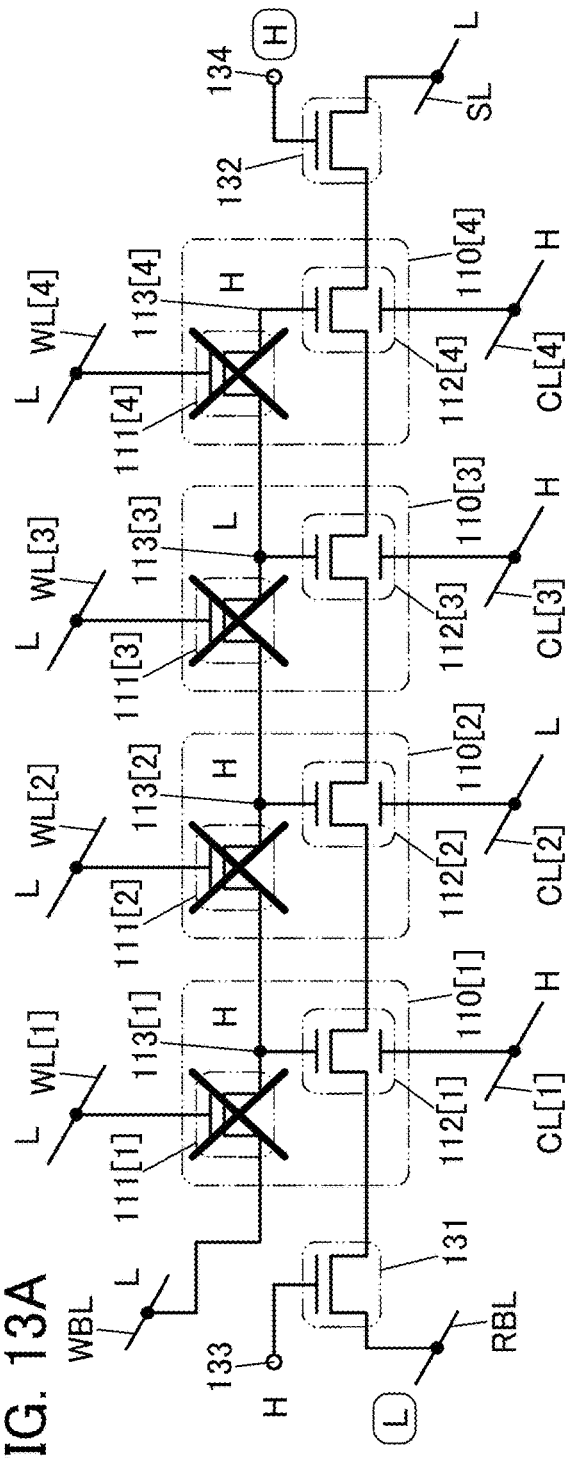
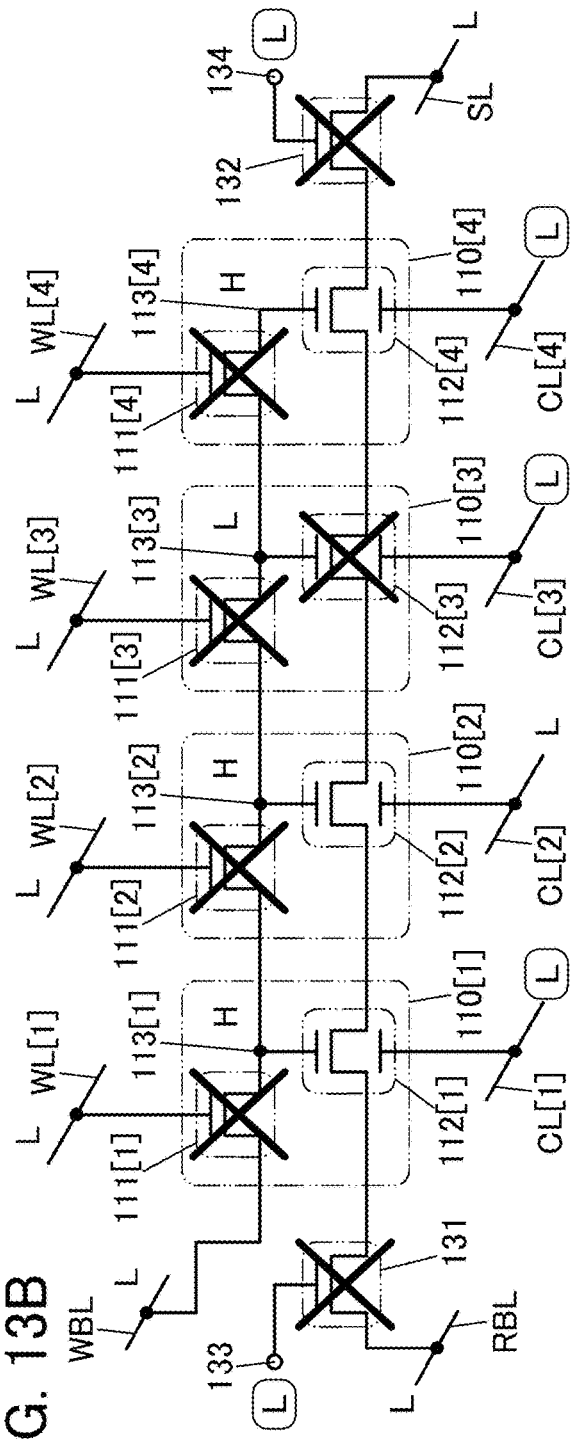

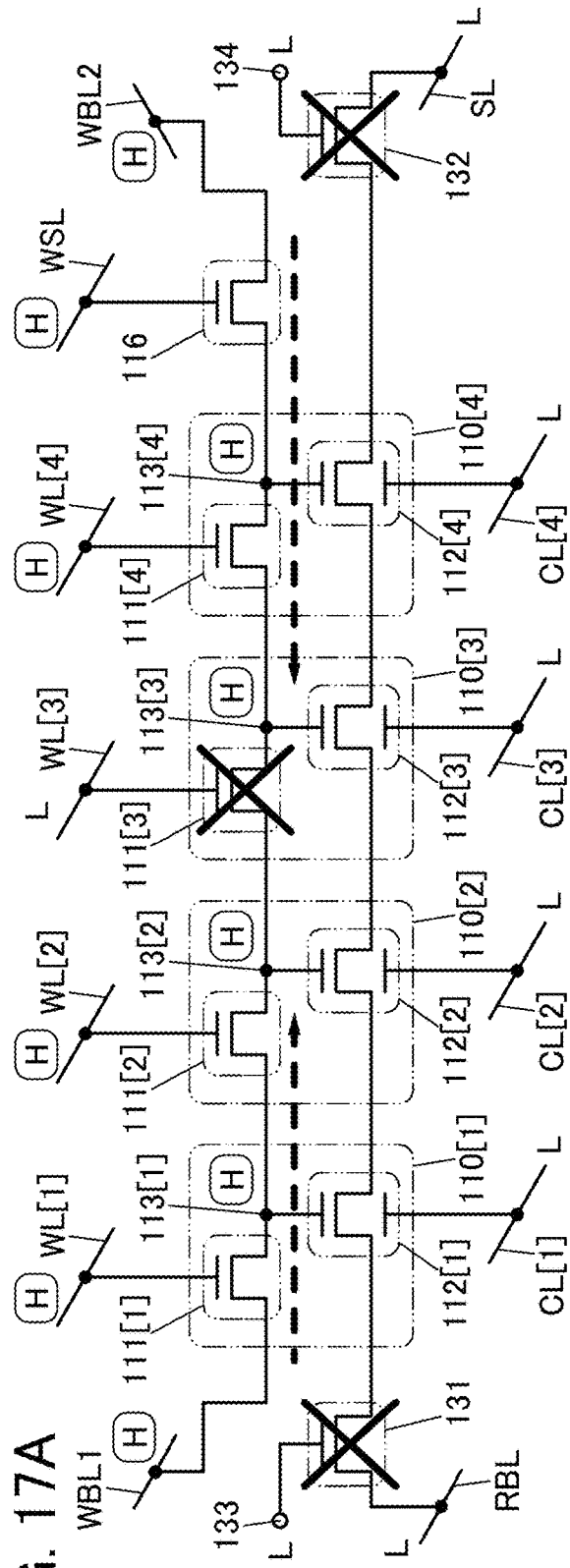
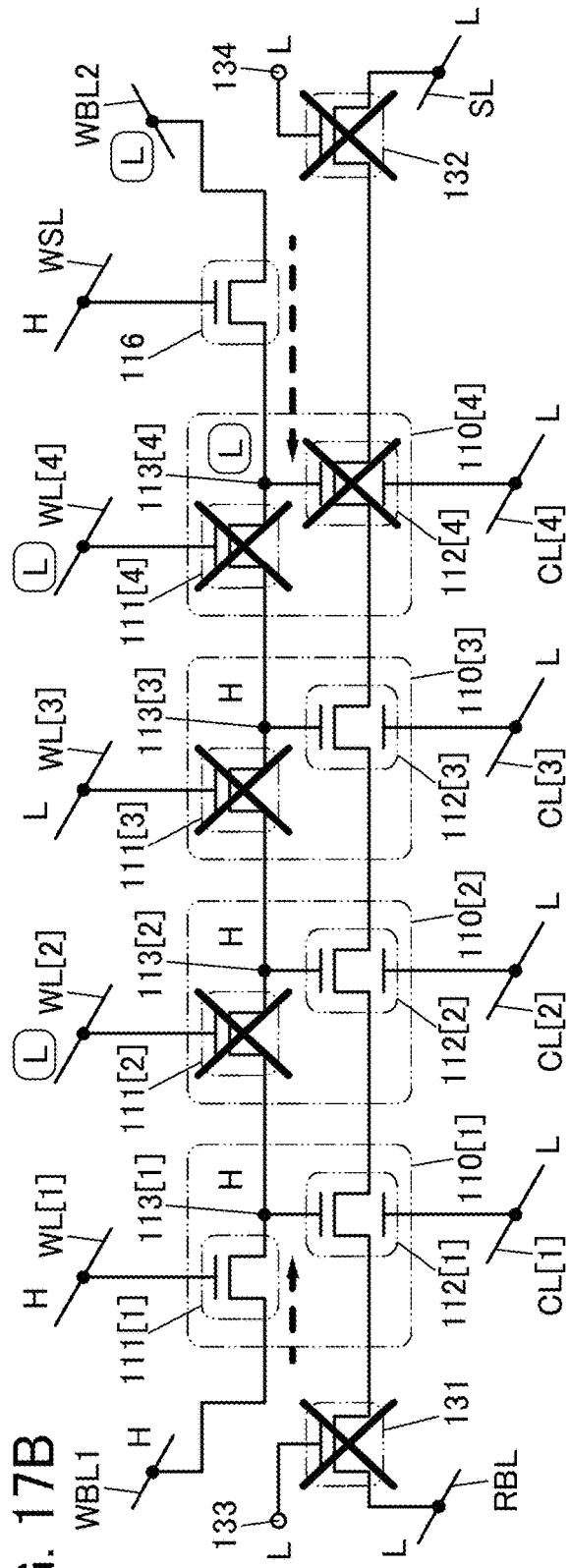

FIG. 27A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 27B
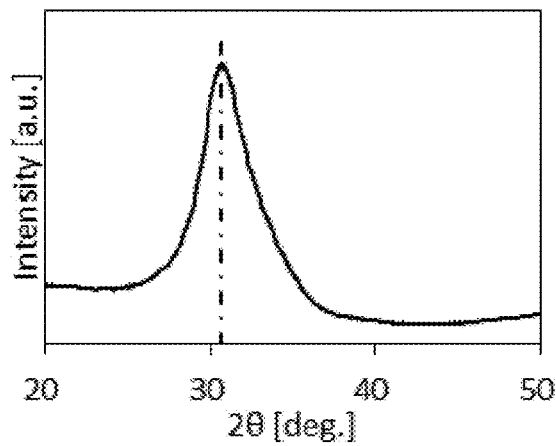
FIG. 27C
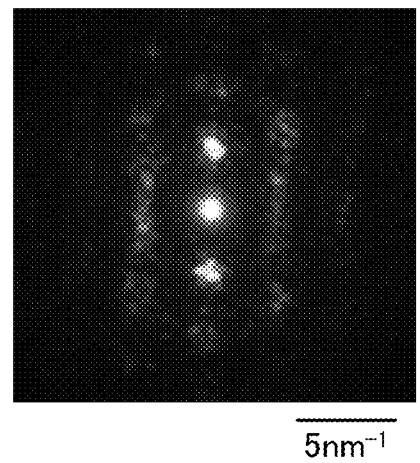

MEMORY DEVICE WITH MEMORY CELLS COMPRISING MULTIPLE TRANSISTORS

BACKGROUND OF THE INVENTION

1. Field of the Invention

One embodiment of the present invention relates to a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

Note that in this specification and the like, a semiconductor device generally means a device that can function by utilizing semiconductor characteristics. Thus, a semiconductor element such as a transistor or a diode and a circuit including the semiconductor element are semiconductor devices. A display device, a light-emitting device, a lighting device, an electro-optical device, a communication device, an electronic device, and the like may include a semiconductor element or a semiconductor circuit. Therefore, a display device, a light-emitting device, a lighting device, an electro-optical device, an imaging device, a communication device, an electronic device, and the like are referred to as a semiconductor device in some cases.

2. Description of the Related Art

In recent years, transistors including oxide semiconductors or metal oxides in their channel formation regions (oxide semiconductor transistors, hereinafter also referred to as "OS transistors" or "OS-FETs") have attracted attention (Patent Document 1).

The OS transistor has an extremely low off-state current. A nonvolatile memory using this feature is disclosed in Patent Documents 2 and 3. The nonvolatile memory including the OS transistor does not have a limit on the number of times of data rewriting and consumes low power in data rewriting.

Note that in this specification, the nonvolatile memory including the OS transistor is sometimes referred to as a NOSRAM (registered trademark). The NOSRAM stands for "nonvolatile oxide semiconductor RAM", which is a RAM including a gain cell (2T or 3T) memory cell.

REFERENCES

Patent Documents

[Patent Document 1] Japanese Published Patent Application No. 2007-123861
[Patent Document 2] Japanese Published Patent Application No. 2011-151383
[Patent Document 3] Japanese Published Patent Application No. 2016-115387

SUMMARY OF THE INVENTION

An object of one embodiment of the present invention is to provide a highly reliable memory device. Another object of one embodiment of the present invention is to provide a memory device with large storage capacity. Another object of one embodiment of the present invention is to provide a memory device that occupies a small area. Another object of one embodiment of the present invention is to provide a memory device with low production costs. Another object of one embodiment of the present invention is to provide a highly reliable semiconductor device. Another object of one embodiment of the present invention is to provide a semiconductor device with low production costs. Another object of one embodiment of the present invention is to provide a novel semiconductor device.

Note that the description of these objects does not preclude the existence of other objects. In one embodiment of the present invention, there is no need to achieve all the objects. Other objects will be apparent from and can be derived from the description of the specification, the drawings, the claims, and the like.

One embodiment of the present invention is a NAND memory device including a plurality of connected memory elements (also referred to as "memory cells") each provided with a writing transistor and a reading transistor. When an oxide semiconductor is used in a semiconductor layer of the writing transistor, a storage capacitor is not necessary or the size of the storage capacitor can be reduced. The reading transistor includes a back gate. When a reading voltage is applied to the back gate, data stored in the memory element can be read.

Another embodiment of the present invention is a memory device including a first memory cell, a second memory cell, a first wiring, a second wiring, a third wiring, a first transistor, and a second transistor. The first memory cell and the second memory cell each include a third transistor and a fourth transistor. A source of the third transistor included in the first memory cell is electrically connected to the third wiring; a drain of the third transistor included in the first memory cell is electrically connected to the source of the third transistor included in the second memory cell; a gate of the third transistor included in the first memory cell is electrically connected to the first wiring; the gate of the third transistor included in the second memory cell is electrically connected to the second wiring; a source of the fourth transistor included in the first memory cell is electrically connected to the first transistor; a drain of the fourth transistor included in the first memory cell is electrically connected to the source of the fourth transistor included in the second memory cell; a gate of the fourth transistor included in the first memory cell is electrically connected to the drain of the third transistor included in the first memory cell; the gate of the fourth transistor included in the second memory cell is electrically connected to the drain of the third transistor included in the second memory cell; and the drain of the fourth transistor included in the second memory cell is electrically connected to the second transistor. The fourth transistor included in the first memory cell and the fourth transistor included in the second memory cell each include a back gate.

Another embodiment of the present invention is a memory device including n (n is an integer of 3 or more) memory cells, n word lines, a bit line, a first transistor, and a second transistor. The n memory cells each include a third transistor and a fourth transistor. A source of the third transistor included in a first memory cell is electrically connected to the bit line; a drain of the third transistor included in the first memory cell is electrically connected to the source of the third transistor included in a second memory cell; a gate of the third transistor included in the first memory cell is electrically connected to a first word line; a source of the fourth transistor included in the first memory cell is electrically connected to the first transistor; a drain of the fourth transistor included in the first memory cell is electrically connected to the source of the fourth transistor included in the second memory cell; a gate of the fourth transistor included in the first memory cell is electrically connected to the drain of the third transistor included in the first memory cell; the source of the third transistor included in an i-th (i is an integer greater than or equal to 2 and less than n) memory cell is electrically connected to the drain of the third transistor included in an i−1-th memory cell; the drain of the third transistor included in the i-th memory cell is electrically connected to the source of the third transistor included in an i+1-th memory cell; the gate of the third transistor included in the i-th memory cell is electrically connected to an i-th word line; the source of the fourth transistor included in the i-th memory cell is electrically connected to the drain of the fourth transistor included in the i−1-th memory cell; the drain of the fourth transistor included in the i-th memory cell is electrically connected to the source of the fourth transistor included in the i+1-th memory cell; the gate of the fourth transistor included in the i-th memory cell is electrically connected to the drain of the third transistor included in the i-th memory cell; the source of the third transistor included in an n-th memory cell is electrically connected to the drain of the third transistor included in an n−1-th memory cell; the gate of the third transistor included in the n-th memory cell is electrically connected to an n-th word line; the source of the fourth transistor included in the n-th memory cell is electrically connected to the drain of the fourth transistor included in the n−1-th memory cell; the drain of the fourth transistor included in the n-th memory cell is electrically connected to the second transistor; and the gate of the fourth transistor included in the n-th memory cell is electrically connected to the drain of the third transistor included in the n-th memory cell. The fourth transistor included in each of the n memory cells includes a back gate.

Another embodiment of the present invention is a memory device including n (n is an integer of 3 or more) memory cells, n word lines, a first wiring, a first bit line, a second bit line, a first transistor, a second transistor, and a fifth transistor. The n memory cells each include a third transistor and a fourth transistor. A source of the third transistor included in a first memory cell is electrically connected to the first bit line; a drain of the third transistor included in the first memory cell is electrically connected to the source of the third transistor included in a second memory cell; a gate of the third transistor included in the first memory cell is electrically connected to a first word line; a source of the fourth transistor included in the first memory cell is electrically connected to the first transistor; a drain of the fourth transistor included in the first memory cell is electrically connected to the source of the fourth transistor included in the second memory cell; a gate of the fourth transistor included in the first memory cell is electrically connected to the drain of the third transistor included in the first memory cell; the source of the third transistor included in an i-th (i is an integer greater than or equal to 2 and less than n) memory cell is electrically connected to the drain of the third transistor included in an i−1-th memory cell; the drain of the third transistor included in the i-th memory cell is electrically connected to the source of the third transistor included in an i+1-th memory cell; the gate of the third transistor included in the i-th memory cell is electrically connected to an i-th word line; the source of the fourth transistor included in the i-th memory cell is electrically connected to the drain of the fourth transistor included in the i−1-th memory cell; the drain of the fourth transistor included in the i-th memory cell is electrically connected to the source of the fourth transistor included in the i+1-th memory cell; the gate of the fourth transistor included in the i-th memory cell is electrically connected to the drain of the third transistor included in the i-th memory cell; the source of the third transistor included in an n-th memory cell is electrically connected to the drain of the third transistor included in an n−1-th memory cell; the gate of the third transistor included in the n-th memory cell is electrically connected to an n-th word line; the source of the fourth transistor included in the n-th memory cell is electrically connected to the drain of the fourth transistor included in the n−1-th memory cell; the drain of the fourth transistor included in the n-th memory cell is electrically connected to the second transistor; the gate of the fourth transistor included in the n-th memory cell is electrically connected to the drain of the third transistor included in the n-th memory cell; the drain of the third transistor included in the n-th memory cell is electrically connected to a source of the fifth transistor; a drain of the fifth transistor is electrically connected to the second bit line; and a gate of the fifth transistor is electrically connected to the first wiring. The fourth transistor included in each of the n memory cells includes a back gate.

The drain of the third transistor included in each of the memory cells may be provided with a capacitor. The third transistor preferably includes an oxide semiconductor in a semiconductor layer. The fourth transistor preferably includes an oxide semiconductor in a semiconductor layer.

According to one embodiment of the present invention, a highly reliable memory device can be provided. According to another embodiment of the present invention, a memory device with large storage capacity can be provided. According to another embodiment of the present invention, a memory device that occupies a small area can be provided. According to another embodiment of the present invention, a memory device with low production costs can be provided. According to another embodiment of the present invention, a highly reliable semiconductor device can be provided. According to another embodiment of the present invention, a semiconductor device with low production costs can be provided. According to another embodiment of the present invention, a novel semiconductor device can be provided.

Note that the description of these effects does not preclude the existence of other effects. In one embodiment of the present invention, there is no need to achieve all the effects. Other effects will be apparent from and can be derived from the description of the specification, the drawings, the claims, and the like.

BRIEF DESCRIPTION OF THE DRAWINGS

In the accompanying drawings:

FIG. 1A is a circuit diagram showing a configuration example of a memory device, FIGS. 1B to 1D are circuit diagrams showing configuration examples of a memory element, and FIG. 1E is a circuit diagram showing a configuration example of a transistor;

FIGS. 10A and 10B are circuit diagrams for describing the writing operation of the memory device;

FIGS. 12A and 12B are circuit diagrams for describing the reading operation of the memory device;

FIGS. 13A and 13B are circuit diagrams for describing the reading operation of the memory device;

FIGS. 17A and 17B are circuit diagrams for describing the writing operation of the memory device;

FIG. 27A shows classification of IGZO crystal structures, FIG. 27B shows an XRD spectrum of a CAAC-IGZO film, and FIG. 27C shows a nanobeam electron diffraction pattern of the CAAC-IGZO film;

DETAILED DESCRIPTION OF THE INVENTION

Figure 2:
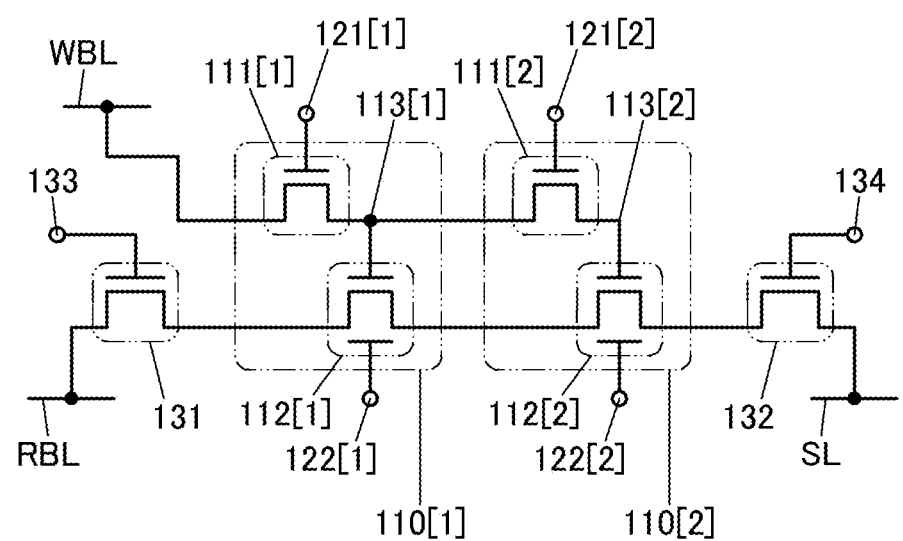
FIG. 2 is a circuit diagram showing a configuration example of a memory device.

Embodiments will be described in detail with reference to the drawings. Note that the present invention is not limited to the following description, and it will be readily appreciated by those skilled in the art that modes and details can be modified in various ways without departing from the spirit and the scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a resist mask or the like might be unintentionally reduced in size by treatment such as etching, which is not illustrated in some cases for easy understanding.

In a top view (also referred to as a "plan view"), a perspective view, or the like, some components might not be illustrated for easy understanding of the drawings.

In this specification and the like, the term such as "electrode" or "wiring" does not limit the function of a component. For example, an "electrode" is used as part of a "wiring" in some cases, and vice versa. Furthermore, the term "electrode" or "wiring" can also mean a combination of a plurality of electrodes or wirings provided in an integrated manner, for example.

In this specification and the like, a "terminal" in an electric circuit refers to a portion that inputs or outputs current or voltage or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is on and in direct contact with the insulating layer A and can mean the case where another component is provided between the insulating layer A and the electrode B.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, the term "parallel" indicates that the angle formed between two straight lines is greater than or equal to −10° and less than or equal to 10°, for example, and accordingly also includes the case where the angle is greater than or equal to −5° and less than or equal to 5°. The terms "perpendicular" and "orthogonal" indicate that the angle formed between two straight lines is greater than or equal to 80° and less than or equal to 100°, for example, and accordingly also includes the case where the angle is greater than or equal to 85° and less than or equal to 95°.

In this specification and the like, the terms "identical", "same", "equal", "uniform", and the like used in describing calculation values and actual measurement values allow for a margin of error of ±20% unless otherwise specified.

A voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" can be replaced with an "insulator". In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" can be replaced with a "conductor". In that case, a "semiconductor" and a "conductor" cannot be strictly distinguished from each other because a border therebetween is not clear. Accordingly, a "semiconductor" and a "conductor" in this specification can be replaced with each other in some cases.

Note that the ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

Note that in this specification and the like, an "on state" of a transistor refers to a state in which a source and a drain of the transistor are electrically short-circuited (also referred to as a "conduction state"). Furthermore, an "off state" of the transistor refers to a state in which the source and the drain of the transistor are electrically disconnected (also referred to as a "non-conduction state").

In this specification and the like, in some cases, "on-state current" means a current that flows between a source and a drain when a transistor is in an on state, and "off-state current" means a current that flows between a source and a drain when a transistor is in an off state.

In this specification and the like, a high power supply potential VDD (hereinafter, also simply referred to as "VDD", "H potential", or "H") is a power supply potential higher than a low power supply potential VSS (hereinafter, also simply referred to as "VSS", "L potential", or "L"). Moreover, VSS is a power supply potential lower than VDD. A ground potential (hereinafter, also simply referred to as "GND" or "GND potential") can be used as VDD or VSS. For example, in the case where a ground potential is used as VDD, VSS is lower than the ground potential, and in the case where a ground potential is used as VSS, VDD is higher than the ground potential.

Unless otherwise specified, transistors described in this specification and the like are enhancement (normally-off) n-channel field-effect transistors. Thus, the threshold voltage (also referred to as "Vth") is higher than 0 V. Unless otherwise specified, the phrase "an H potential is supplied to a gate of a transistor" means that "the transistor is turned on" in some cases. Also, unless otherwise specified, the phrase "an L potential is supplied to a gate of a transistor" means that "the transistor is turned off" in some cases.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

Furthermore, functions of a source and a drain might be switched depending on operation conditions, e.g., when a transistor of opposite polarity is employed or a direction of current flow is changed in circuit operation. Therefore, it is difficult to define which is a source or a drain. Thus, the terms "source" and "drain" can be interchanged with each other in this specification. For easy understanding of the description in one embodiment of the present invention, one of a source and a drain is referred to as a "source" and the other is referred to as a "drain" in some cases in this specification and the like.

In the drawings and the like, for easy understanding of the potential of a wiring, an electrode, or the like, "H" representing an H potential or "L" representing an L potential is sometimes written near the wiring, the electrode, or the like. In addition, enclosed "H" or "L" is sometimes written near a wiring, an electrode, or the like whose potential changes. Moreover, a symbol "x" is sometimes written on a transistor in an off state.

In this specification and the like, a "resistor element" can be, for example, a circuit element or a wiring having a resistance higher than 0Ω. Hence, in this specification and the like, a "resistor element" includes a wiring having a resistance, a transistor with a source-drain current, a diode, a coil, and the like. Thus, the term "resistor element" can be replaced with a "resistor", a "load", a "region having a resistance", and the like, and the terms "resistor", "load", and "region having a resistance" can be replaced with a "resistor element" and the like. The resistance is preferably, for example, greater than or equal to 1 mΩ and less than or equal to 10Ω, further preferably greater than or equal to 5 mΩ and less than or equal to 5Ω, and still further preferably greater than or equal to 10 mΩ and less than or equal to 1Ω. Alternatively, the resistance can be, for example, greater than or equal to 1Ω and less than or equal to $1 \times 10^9 \Omega$.

In this specification and the like, a "capacitor element" can be, for example, a circuit element having an electrostatic capacitance higher than 0 F, a wiring region having an electrostatic capacitance, parasitic capacitance, or the gate capacitance of a transistor. Thus, in this specification and the like, a "capacitor element" includes not only a circuit element including a pair of electrodes and a dielectric between the electrodes, but also parasitic capacitance between wirings, gate capacitance between a gate and one of a source and a drain of a transistor, and the like. The terms such as "capacitor", "parasitic capacitance", and "gate capacitance" can be replaced with a "capacitor" and the like, and the term "capacitor" can be replaced with a "capacitor element", "parasitic capacitance", "gate capacitance", and the like. The term "a pair of electrodes" of "a capacitor" can be replaced with "a pair of conductors", "a pair of conductive regions", "a pair of regions", and the like. The electrostatic capacitance can be, for example, greater than or equal to 0.05 fF and less than or equal to 10 pF. Alternatively, the electrostatic capacitance can be, for example, greater than or equal to 1 pF and less than or equal to 10 μF.

Embodiment 1

FIG. 1A shows a circuit diagram of a memory device 100 of one embodiment of the present invention. The memory device 100 includes a plurality of memory elements 110 between a transistor 131 and a transistor 132. FIG. 1B shows a circuit diagram of the memory element 110. The memory element 110 includes a transistor 111 and a transistor 112. The transistor 112 has a back gate.

In this embodiment and the like, a first memory element 110 is denoted as a memory element 110[1] and an n-th (n is an integer of 3 or more) memory element 110 is denoted as a memory element 110[n]. An i-th (i is an integer greater than or equal to 2 and less than n) memory element 110 is denoted as a memory element 110[i]. Note that the "memory element 110" is also simply used in the case of description common to the memory element 110[1] to the memory element 110[n].

Also in this embodiment and the like, the transistor 111 included in the memory element 110[1] is denoted as a transistor 111[1], the transistor 111 included in the memory element 110[i] is denoted as a transistor 111[i], and the transistor 111 included in the memory element 110[n] is denoted as a transistor 111[n]. Note that the "transistor 111" is also simply used in the case of description common to the transistor 111[1] to the transistor 111[n]. The transistor 112, a node 113 described later, and the like are also denoted in a manner similar to that of the transistor 111.

<Configuration Example of Memory Device>

A circuit configuration example of the memory device 100 shown in FIG. 1A will be described in detail. One of a source and a drain of the transistor 111[1] included in the memory element 110[1] is electrically connected to a wiring WBL, and the other is electrically connected to a node 113[1]. A gate of the transistor 111[1] is electrically connected to a terminal 121[1]. One of a source and a drain of a transistor 112[1] is electrically connected to the transistor 131 and the other is electrically connected to one of a source and a drain of a transistor 112[2]. A gate of the transistor 112[1] is electrically connected to the node 113[1]. A back gate of the transistor 112[1] is electrically connected to a terminal 122[1].

One of a source and a drain of the transistor 131 is electrically connected to a wiring RBL and the other is electrically connected to the one of the source and the drain of the transistor 112[1]. A gate of the transistor 131 is electrically connected to a terminal 133.

One of a source and a drain of a transistor 111[2] included in a memory element 110[2] is electrically connected to the node 113[1], and the other is electrically connected to a node 113[2]. A gate of the transistor 111[2] is electrically connected to a terminal 121[2]. One of the source and the drain of the transistor 112[2] is electrically connected to the other of the source and the drain of the transistor 112[1], and a gate of the transistor 112[2] is electrically connected to the node 113[2]. A back gate of the transistor 112[2] is electrically connected to a terminal 122[2].

One of a source and a drain of the transistor 111[i] included in the memory element 110[i] is electrically connected to a node 113[i−1] (not illustrated), and the other is electrically connected to a node 113 [i] (not illustrated). A gate of the transistor 111[i] is electrically connected to a terminal 121[i]. One of a source and a drain of a transistor 112[i] is electrically connected to one or the other of a source and a drain of a transistor 112[i−1] (not illustrated). A gate of the transistor 112[i] is electrically connected to the node 113[i] and a back gate of the transistor 112[i] is electrically connected to a terminal 122[i].

One of a source and a drain of the transistor 111[n] included in the memory element 110[n] is electrically connected to a node 113[n−1] (not illustrated). The other of the source and the drain of the transistor 111[n] is electrically connected to a node 113[n]. A gate of the transistor 111[n] is electrically connected to a terminal 121[n].

One of a source and a drain of a transistor 112[n] is electrically connected to a source or a drain of a transistor 112[n−1] (not illustrated). The other of the source and the drain of the transistor 112[n] is electrically connected to one of a source and a drain of the transistor 132. A gate of the transistor 112[n] is electrically connected to the node 113[n] and a back gate of the transistor 112[n] is electrically connected to a terminal 122[n].

The other of the source and the drain of the transistor 132 is electrically connected to a wiring SL. A gate of the transistor 132 is electrically connected to a terminal 134.

The memory device 100 illustrated in FIG. 1A includes the n memory elements 110 between the transistor 131 and the transistor 132. The transistor 111[1] to the transistor 111[n] are connected in series while the source of one transistor and the drain of the adjacent transistor are shared (electrically connected). The transistor 112[1] to the transistor 112[n] are also connected in series while the source of one transistor and the drain of the adjacent transistor are shared (electrically connected).

More specifically, the source of the transistor 111[i] is electrically connected to a drain of a transistor 111[i−1] and the drain of the transistor 111[i] is electrically connected to a source of a transistor 111[i+1]. The source of the transistor 112[*i*] is electrically connected to a drain of a transistor 112[*i*−1] and the drain of the transistor 112[*i*] is electrically connected to a source of a transistor 112[*i*+1].

In this specification and the like, in some cases, a gate of a transistor is referred to as a first terminal; one of a source and a drain, a second terminal; the other of the source and the drain, a third terminal; and a back gate, a fourth terminal. For example, the following description is possible: a second terminal of the transistor 111[*i*] is electrically connected to a third terminal of the transistor 111[*i*−1]; a third terminal of the transistor 111[*i*] is electrically connected to a second terminal of the transistor 111[*i*+1]; and the third terminal of the transistor 111[*i*] is electrically connected to a first terminal of the transistor 112[*i*].

Such a configuration of the memory elements 110, in which a transistor in one memory element 110 is connected in series with a transistor in the adjacent memory element 110, is referred to as a "string", a "cell string", or a "memory cell string" in some cases. For example, one memory device 100 is sometimes referred to as "one string" or simply a "string". Note that the words "string", "cell string", and "memory cell string" are also used as units in some cases.

[Memory Element]

The memory element 110 (see FIG. 1B) has a function of retaining a potential (charge) written to the node 113. Specifically, a voltage for turning on the transistor 111 is supplied to a gate of the transistor 111, and charge for setting the node 113 to a predetermined voltage is supplied to the node 113 through a source and a drain of the transistor 111. Then, a voltage for turning off the transistor 111 is supplied to the gate of the transistor 111. The charge written to the node 113 can be retained when the transistor 111 is turned off.

For semiconductor layers of the transistor 111 and the transistor 112, a single crystal semiconductor, a polycrystalline semiconductor, a microcrystalline semiconductor, an amorphous semiconductor, or the like can be used alone or in combination. As a semiconductor material, silicon, germanium, or the like can be used. Alternatively, a compound semiconductor such as silicon germanium, silicon carbide, gallium arsenide, an oxide semiconductor, or a nitride semiconductor can be used. Similar semiconductor materials can be used for semiconductor layers of the transistor 131 and the transistor 132.

Note that the semiconductor layers may be stacked in the transistor. In that case, the stacked semiconductor layers may include different semiconductor materials or semiconductors with different crystal states.

In particular, the transistor 111 is preferably an OS transistor. The oxide semiconductor has a band gap of 2 eV or more, achieving an extremely low off-state current. When the OS transistor is used as the transistor 111, the charge written to the node 113 can be retained for a long period. In the case where the OS transistor is used as the transistor 111, the memory element 110 can be referred to as an "OS memory".

The OS memory can retain data written thereto for a year or more, or ten years or more even after power supply is stopped. Hence, the OS memory can be regarded as a nonvolatile memory.

Since the amount of charge written to the OS memory hardly changes for a long period, multilevel (multi-bit) data as well as binary (1-bit) data can be retained in the OS memory.

In addition, charge is written to a node through an OS transistor in the OS memory, which eliminates the need for a high voltage that has been necessary in conventional flash memories and achieves high-speed writing. The OS memory does not require an erasing operation that is performed in flash memories before data rewriting. Furthermore, the OS memory does not conduct charge injection and extraction to and from a floating gate or a charge-trap layer, substantially allowing an unlimited number of times of data writing and reading. The OS memory is less likely to deteriorate and has higher reliability than conventional flash memories.

Unlike a magneto-resistive memory (MRAM), a resistance-change memory (ReRAM), and the like, the OS memory does not undergo a structure change at the atomic level. Hence, the OS memory has higher write endurance than the magneto-resistive memory and the resistance-change memory.

The off-state current of the OS transistor hardly increases even in high-temperature environments, specifically, at higher than or equal to room temperature and lower than or equal to 200° C. In addition, the on-state current of the OS transistor is unlikely to decrease even in high-temperature environments. A memory device including the OS memory achieves a stable operation and high reliability even in high-temperature environments. Furthermore, the withstand voltage between the source and the drain of the OS transistor is high. With the use of the OS transistor, a semiconductor device can operate stably and have high reliability even in high-temperature environments.

As illustrated in FIG. 1C, the transistor 111 included in the memory element 110 may have a back gate. FIG. 1C shows an example in which the gate and the back gate of the transistor 111 are electrically connected.

As illustrated in FIG. 1D, a capacitor 125 may be provided between the node 113 and a terminal 123. In the case where the capacitor 125 is provided, a fixed potential is preferably supplied to the terminal 123. The capacitor 125 contributes to a reduction in the potential change of the node 113 and an increase in the reliability of the memory device 100. The memory element 110 is preferably provided with the capacitor 125 particularly when storing multilevel data.

As illustrated in FIG. 1E, the transistor 131 and/or the transistor 132 may have a back gate. FIG. 1E shows an example in which the gate and the back gate of the transistor are electrically connected.

Note that the memory device 100 may have a configuration including two memory elements 110, the transistor 131, and the transistor 132, i.e., n may be 2. FIG. 2 shows a circuit configuration example of the memory device 100 with n being 2.

The gate of the transistor 111 may be electrically connected to a wiring WL. Alternatively, the gate of the transistor 111 may be electrically connected to the wiring WL through the terminal 121. The back gate of the transistor 112 may be electrically connected to a wiring CL. Alternatively, the back gate of the transistor 112 may be electrically connected to the wiring CL through the terminal 122. The wiring WL is supplied with a signal for controlling a writing operation that will be described later. The wiring CL is supplied with a signal for controlling a reading operation that will be described later.

Figure 3:
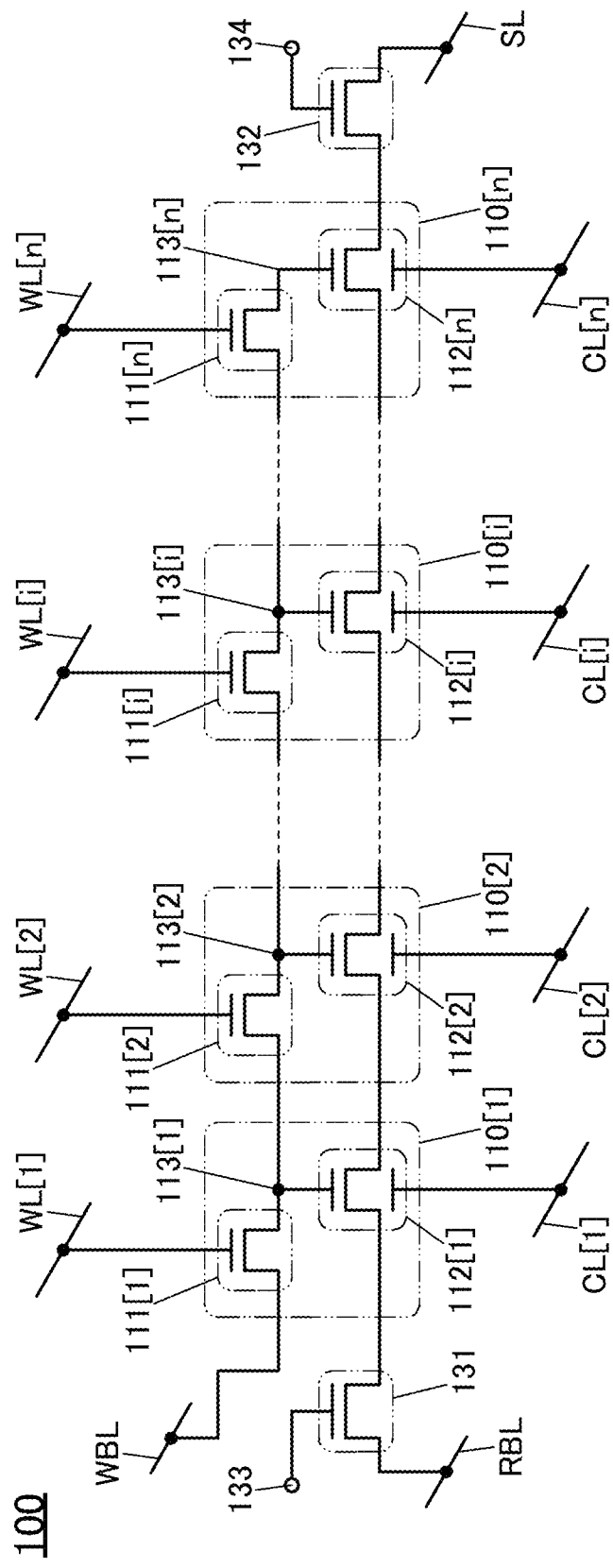
FIG. 3 is a circuit diagram showing a configuration example of a memory device.

FIG. 3 shows an example in which the gate of the transistor 111[1] is electrically connected to a wiring WL[1], the gate of the transistor 111[2] is electrically connected to a wiring WL[2], the gate of the transistor 111[*i*] is electrically connected to a wiring WL[i], and the gate of the transistor 111[*n*] is electrically connected to a wiring WL[n].

FIG. 3 also shows an example in which the back gate of the transistor 112[1] is electrically connected to the wiring CL[1], the back gate of the transistor 112[2] is electrically connected to a wiring CL[2], the back gate of the transistor 112[$i$] is electrically connected to a wiring CL[i], and the back gate of the transistor 112[n] is electrically connected to a wiring CL[n].

The use of a plurality of memory devices 100 increases the storage capacity of a semiconductor device including the memory devices 100. In other words, an increase in the number of strings increases the storage capacity of the semiconductor device.

Figure 4:
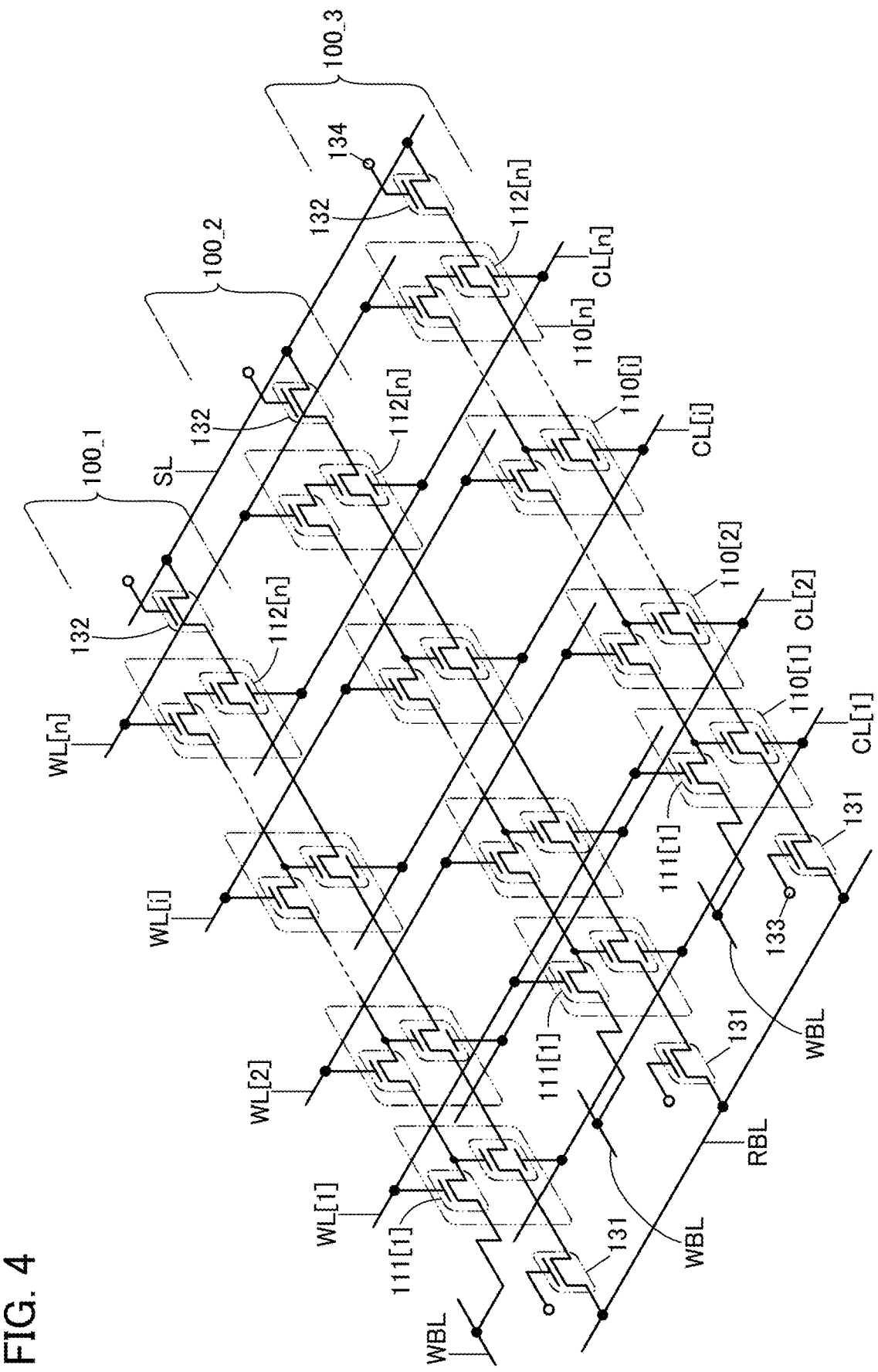
FIG. 4 is a perspective circuit diagram showing a configuration example of a memory device.

As an example, FIG. 4 shows a perspective circuit diagram including three memory devices 100 (three strings) connected in parallel. In FIG. 4, a first memory device 100, a second memory device 100, and a third memory device 100 are denoted as a memory device 100_1, a memory device 100_2, and a memory device 100_3, respectively.

In the case where each of the memory devices 100 includes the n memory elements 110, the wiring RBL, the wiring SL, n wirings WL, and n wirings CL can be used as wirings common to the plurality of memory devices 100.

For example, in FIG. 4, one of the source and the drain of the transistor 131 included in the memory device 100_1, one of the source and the drain of the transistor 131 included in the memory device 100_2, and one of the source and the drain of the transistor 131 included in the memory device 100_3 are electrically connected to the wiring RBL. The other of the source and the drain of the transistor 132 included in the memory device 100_1, the other of the source and the drain of the transistor 132 included in the memory device 100_2, and the other of the source and the drain of the transistor 132 included in the memory device 100_3 are electrically connected to the wiring SL.

The gate of the transistor 111[1] included in the memory device 100_1, the gate of the transistor 111[1] included in the memory device 100_2, and the gate of the transistor 111[1] included in the memory device 100_3 are electrically connected to the wiring WL[1]. The back gate of the transistor 112[n] included in the memory device 100_1, the back gate of the transistor 112[n] included in the memory device 100_2, and back gate of the transistor 112[n] included in the memory device 100_3 are electrically connected to the wiring CL[n].

Figure 5:
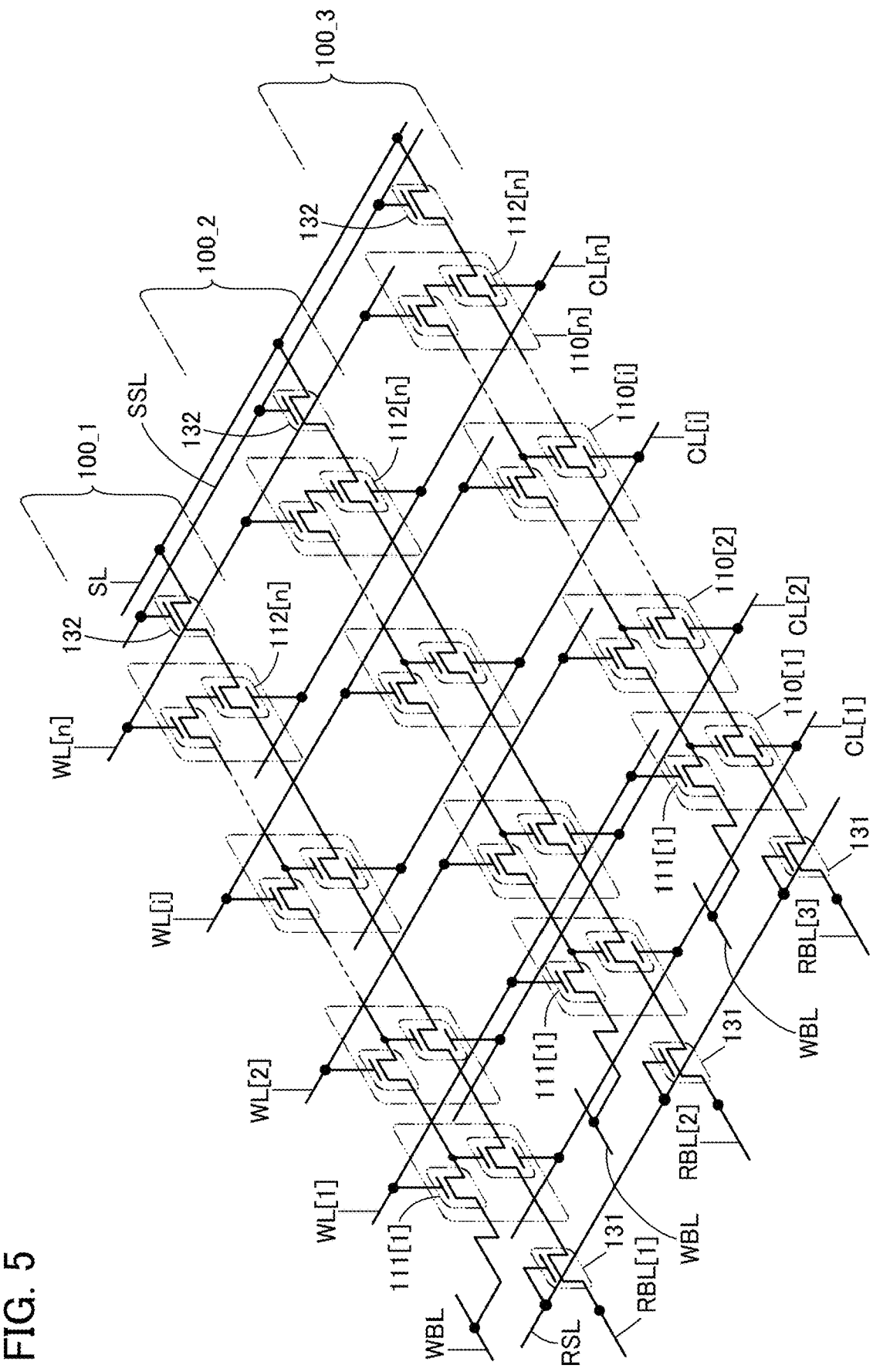
FIG. 5 is a perspective circuit diagram showing a configuration example of a memory device.

The memory device 100_1 to the memory device 100_3 may be electrically connected to the respective wirings RBL. FIG. 5 shows a modification example of the perspective circuit diagram of FIG. 4. In the perspective circuit diagram in FIG. 5, one of the source and the drain of the transistor 131 included in the memory device 100_1 is electrically connected to the wiring RBL[1], one of the source and the drain of the transistor 131 included in the memory device 100_2 is electrically connected to a wiring RBL[2], and one of the source and the drain of the transistor 131 included in the memory device 100_3 is electrically connected to a wiring RBL[3].

In that case, the gate of the transistor 131 included in each of the memory device 100_1 to the memory device 100_3 is electrically connected to a wiring RSL. Note that the gate of the transistor 131 may be electrically connected to the wiring RSL through the terminal 133.

As illustrated in FIG. 5, the gate of the transistor 132 included in each of the memory device 100_1 to the memory device 100_3 may be electrically connected to a wiring SSL. Note that the gate of the transistor 132 may be electrically connected to the wiring SSL through the terminal 134.

When the wiring RBL is provided for each memory device 100, data retained in the memory devices 100 can be read at a time. This results in an increase in the data reading speed of the semiconductor device including a plurality of memory devices 100.

Note that each string is usually provided extending in one direction. A wiring that controls writing or reading of data (e.g., the wiring WL and the wiring CL) usually extends in a direction perpendicular to the extending direction of the string.

Modification Example 1

Figure 6:
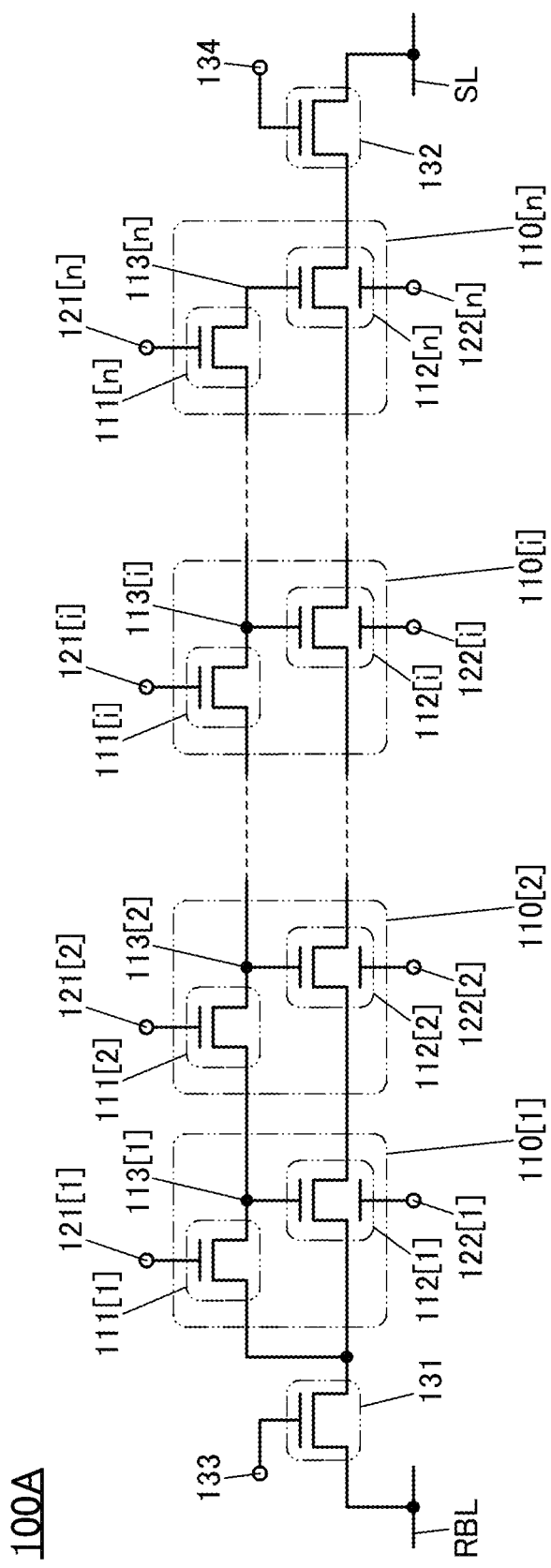
FIG. 6 is a circuit diagram showing a configuration example of a memory device.

FIG. 6 illustrates a memory device 100A, which is a modification example of the memory device 100. The memory device 100A is different from the memory device 100 in that one of the source and the drain of the transistor 111[1] is electrically connected to the other of the source and the drain of the transistor 131 and the wiring WBL is omitted. When the wiring WBL is omitted, the configuration of the memory device 100 can be simplified, reducing the area occupied by the memory device 100.

Modification Example 2

Figure 7:
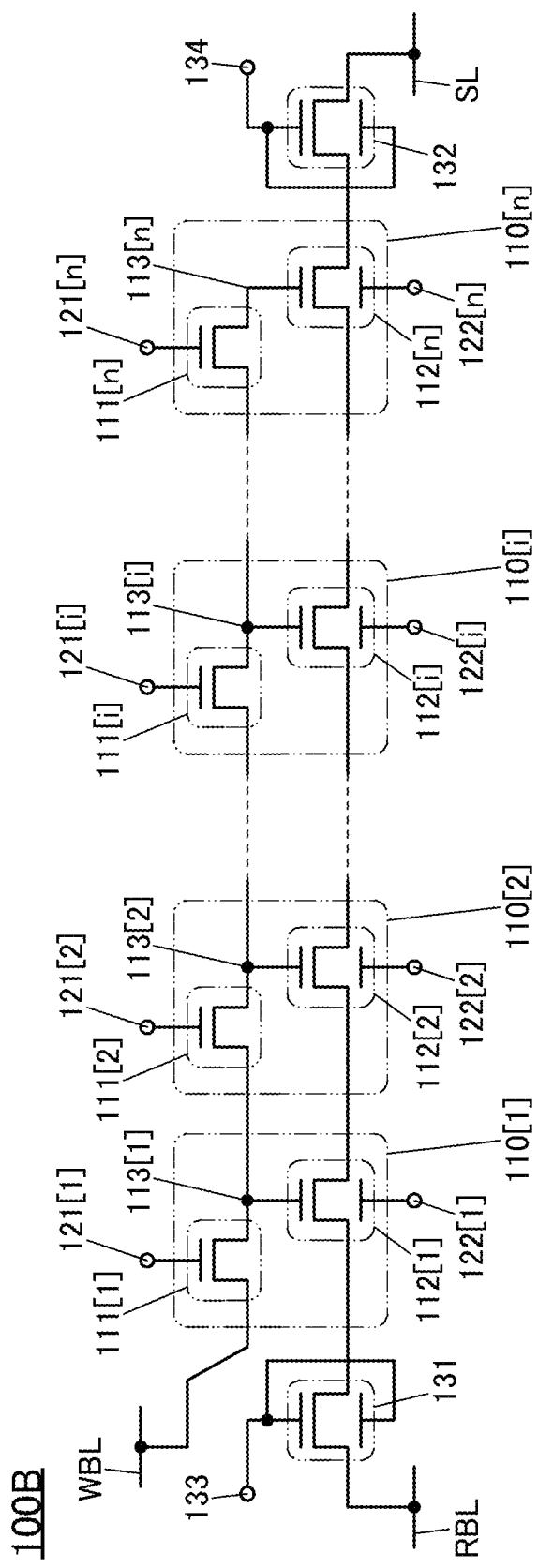
FIG. 7 is a circuit diagram showing a configuration example of a memory device.

FIG. 7 illustrates a memory device 100B, which is a modification example of the memory device 100. The memory device 100B is different from the memory device 100 in that the transistor 131 and the transistor 132 each have a back gate. FIG. 7 shows an example in which the gate and the back gate of the transistor 131 and/or the transistor 132 are electrically connected to each other.

<Operation Example of Memory Device>

An operation example of the memory device 100 will be described with reference to drawings. In this embodiment, the description is made on an example of the memory device 100 including four memory elements 110.

[Writing Operation]

Figure 8A:
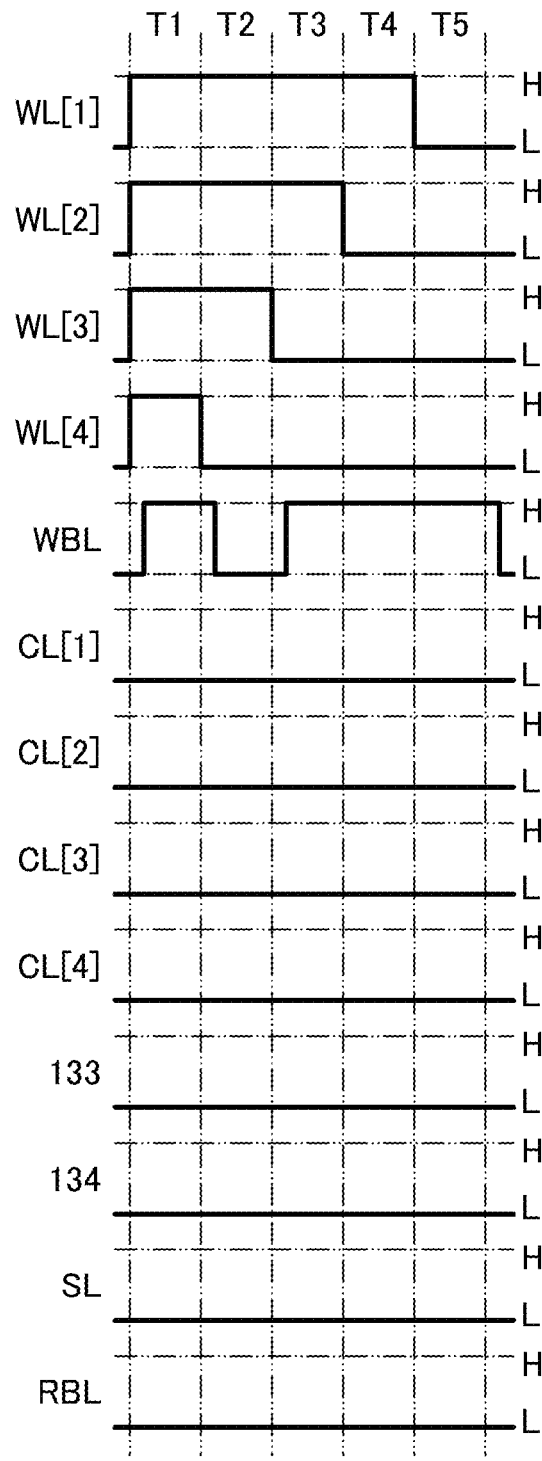
FIG. 8A is a timing chart showing a writing operation of a memory device and FIG. 8B is a timing chart showing a reading operation of the memory device.

In the operation example described in this embodiment, an H potential is written to the memory element 110[1], the memory element 110[2], and a memory element 110[4] whereas an L potential is written to a memory element 110[3]. FIG. 8A is a timing chart showing a writing operation of the memory device 100. FIGS. 9A and 9B, FIGS. 10A and 10B, and FIG. 11 are circuit diagrams for describing the writing operation of the memory device 100.

It is assumed that in the initial state, the L potential is written to the memory element 110[1] to the memory element 110[4], i.e., the node 113[1] to a node 113[4] have the L potential. It is also assumed that the L potential is supplied to the wiring WL[1] to a wiring WL[4], the wiring CL[1] to a wiring CL[4], the terminal 133, the terminal 134, the wiring SL, the wiring WBL, and the wiring RBL.

[Period T1]

Figure 9A:
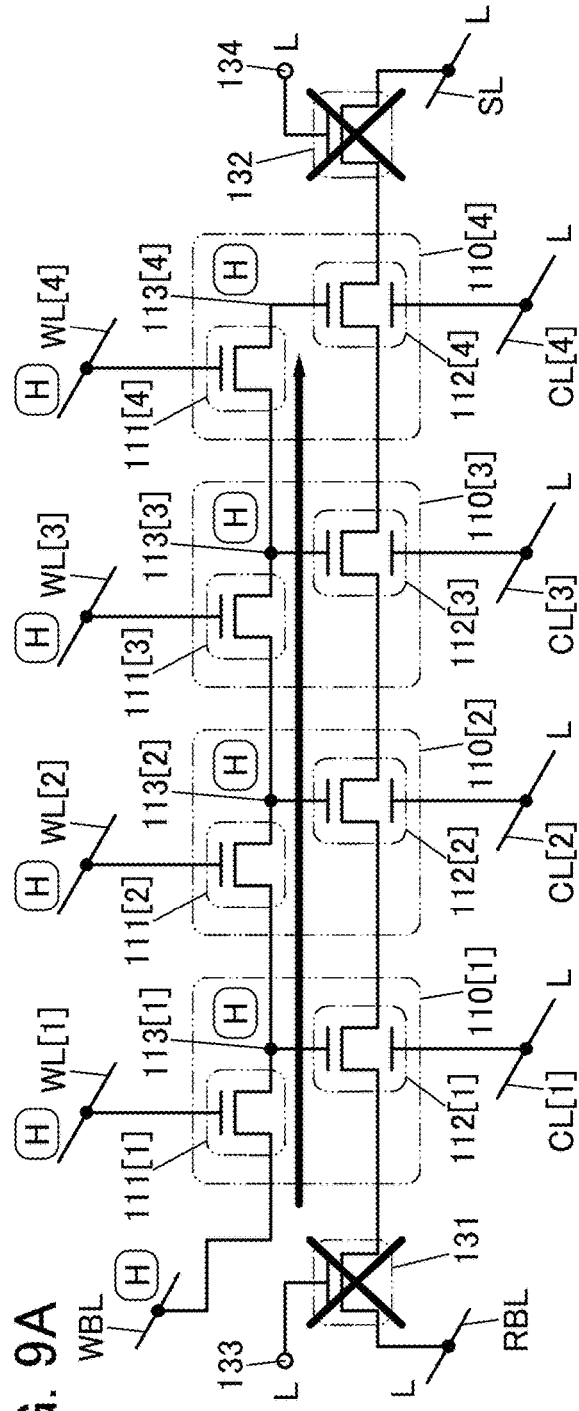
FIGS. 9A and 9B are circuit diagrams for describing the writing operation of the memory device.

In Period T1, the H potential is supplied to the wiring WL[1] to the wiring WL[4] and the wiring WBL (see FIG. 9A). Then, the node 113[1] to the node 113[4] have the H potential, so that the transistor 112[1] to a transistor 112[4] are turned on.

In the case where the potential of the wiring WBL is changed in Period T1, the potential of the wiring WBL is preferably changed after the transistor 112[1] to the transistor 112[4] are turned on.

[Period T2]

Figure 9B:
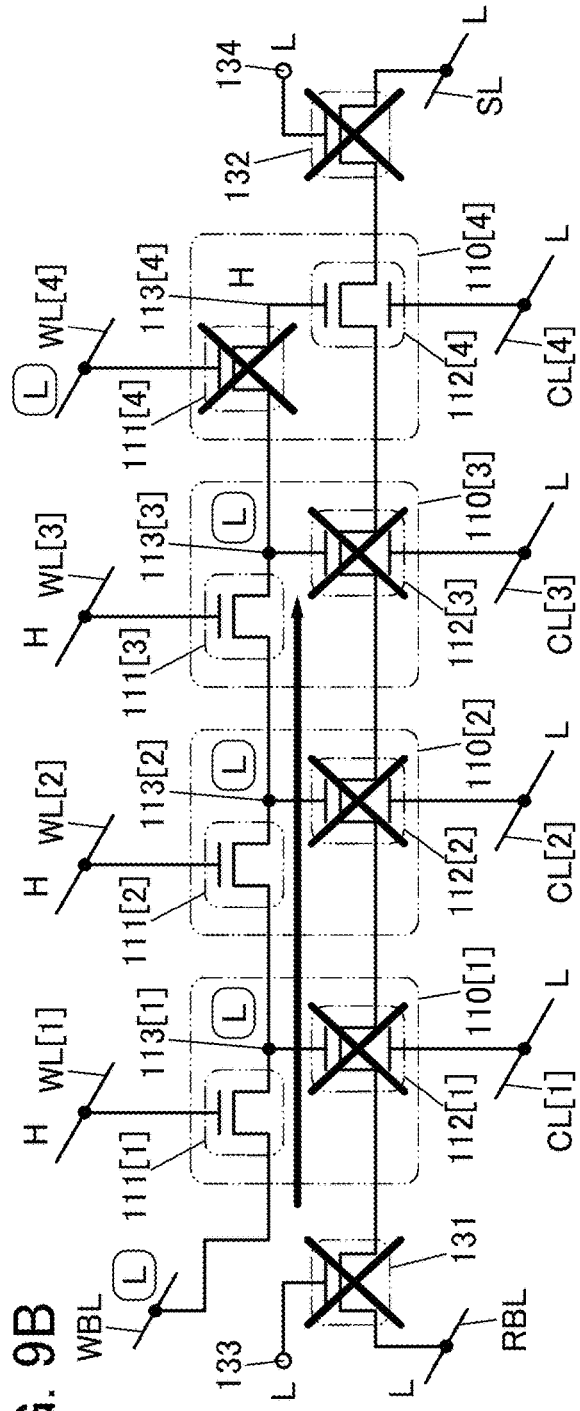

In Period T2, the L potential is supplied to the wiring WL[4] (see FIG. 9B). Then, a transistor 111[4] is turned off and charge written to the node 113[4] is retained. Here, the charge equivalent to the H potential is retained. In addition, the L potential is supplied to the wiring WBL.

In the case where the potential of the wiring WBL is changed in Period T2, the potential of the wiring WBL is changed after the transistor 111[4] is turned off. When the L potential is supplied to the wiring WBL, the node 113[1] to a node 113[3] have the L potential, so that the transistor 112[1] to a transistor 112[3] are turned off.

[Period T3]

In Period T3, the L potential is supplied to a wiring WL[3] (see FIG. 10A). Then, a transistor 111[3] is turned off and charge written to the node 113[3] is retained. Here, the charge equivalent to the L potential is retained. In addition, the H potential is supplied to the wiring WBL.

In the case where the potential of the wiring WBL is changed in Period T3, the potential of the wiring WBL is changed after the transistor 111[3] is turned off. When the H potential is supplied to the wiring WBL, the node 113[1] and the node 113[2] have the H potential, so that the transistor 112[1] and the transistor 112[2] are turned on.

[Period T4]

In Period T4, the L potential is supplied to the wiring WL[2] (see FIG. 10B). Then, the transistor 111[2] is turned off and charge written to the node 113[2] is retained. Here, the charge equivalent to the H potential is retained.

In this embodiment, the potential of the wiring WBL remains H because the H potential is written to the node 113[1] in Period T5. In the case where the potential of the wiring WBL is changed in Period T4, the potential of the wiring WBL is changed after the transistor 111[2] is turned off.

[Period T5]

Figure 11:
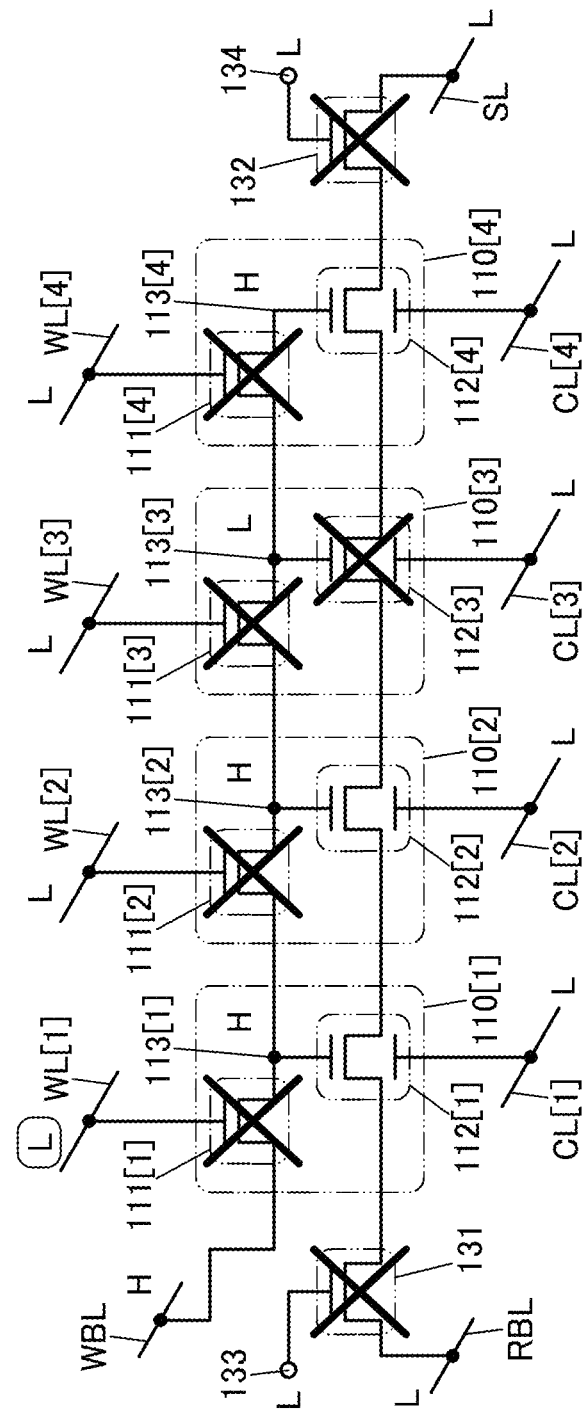
FIG. 11 is a circuit diagram for describing the writing operation of the memory device.

In Period T5, the L potential is supplied to the wiring WL[1] (see FIG. 11). Then, the transistor 111[1] is turned off and charge written to the node 113[1] is retained. Here, the charge equivalent to the H potential is retained. In this manner, data can be written to the memory element 110[1] to the memory element 110[4].

In the case where the potential of the wiring WBL is changed in Period T5, the potential of the wiring WBL is changed after the transistor 111[1] is turned off.

As mentioned above, the memory device 100 of one embodiment of the present invention does not require an erasing operation that is performed in flash memories before data rewriting. Hence, data rewriting can be performed in a manner similar to that of the above writing operation.

In the case where data is written to one of the memory elements 110 that is close to the wiring WBL, the data does not need to be written to the other memory elements 110 farther from the wiring WBL than the one memory element 110. For example, in the case where data is written to the memory element 110[1], the data does not need to be written to the memory element 110[2] to the memory element 110[4]. In the case where data is written to the memory element 110[2], the data does not need to be written to the memory element 110[3] and the memory element 110[4]. Thus, data that is rewritten frequently is stored in the memory element 110 close to the wiring WBL, so that the data can be written (rewritten) in a shorter time. That is, the speed of writing (rewriting) data can be increased.

[Reading Operation]

Figure 8B:
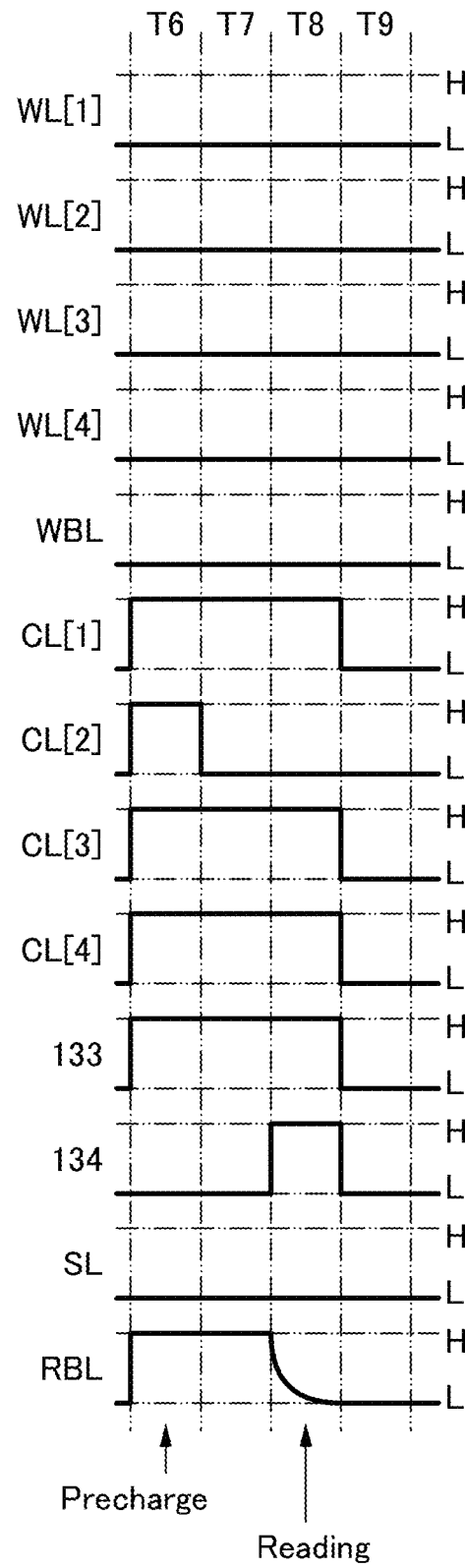

Described in this embodiment is an operation example of reading data retained in the memory element 110[2] among the data retained in the memory element 110[1] to the memory element 110[4]. It is assumed that an H potential is retained in the memory element 110[2]. FIG. 8B is a timing chart showing a reading operation. FIGS. 12A and 12B, and FIGS. 13A and 13B are circuit diagrams for describing the reading operation.

[Period T6]

In Period T6, the H potential is supplied to the wiring CL[1] to the wiring CL[4] and the terminal 133, so that the transistor 112[1] to the transistor 112[4] and the transistor 131 are turned on. Furthermore, the wiring RBL is pre-charged to the H potential (see FIG. 12A). Specifically, after the H potential is supplied to the wiring RBL, the wiring RBL is brought into a floating state.

[Period T7]

In Period T7, the L potential is supplied to the wiring CL[2] (see FIG. 12B). Since the H potential is retained in the node 113[2], the transistor 112[2] remains on.

[Period T8]

In Period T8, the H potential is supplied to the terminal 134, so that the transistor 132 is turned on (see FIG. 13A). The transistor 112[1] to the transistor 112[4] are all on; accordingly, electrical continuity is established between the wiring RBL and the wiring SL and the potential of the wiring RBL is changed to the L potential.

Note that in the case where the node 113 [2] has the L potential, the transistor 112[2] is turned off when the L potential is supplied to the wiring CL[2]. In that case, the potential of the wiring RBL remains H even when the transistor 132 is turned on. What data is retained in the memory element 110 is known from a change in the potential of the wiring RBL.

That is, in order to read data retained in the memory element 110, in Period T8, the L potential is supplied to the wiring CL corresponding to the memory element 110 from which the data is to be read.

[Period T9]

In Period T9, the L potential is supplied to the wiring CL[1] to the wiring CL[4], the terminal 133, and the terminal 134 (see FIG. 13B). Then, the transistor 112[1], the transistor 112[2], the transistor 112[4], the transistor 131, and the transistor 132 are turned off.

The memory device 100 shown in this embodiment and the like serves as a NAND memory device.

This embodiment can be implemented in combination with any of the structures described in the other embodiments and the like, as appropriate.

Embodiment 2

Described in this embodiment are other configuration examples of the memory device 100 shown in the above embodiment and operation examples thereof <Configuration Example of Memory Device>

Figure 14:
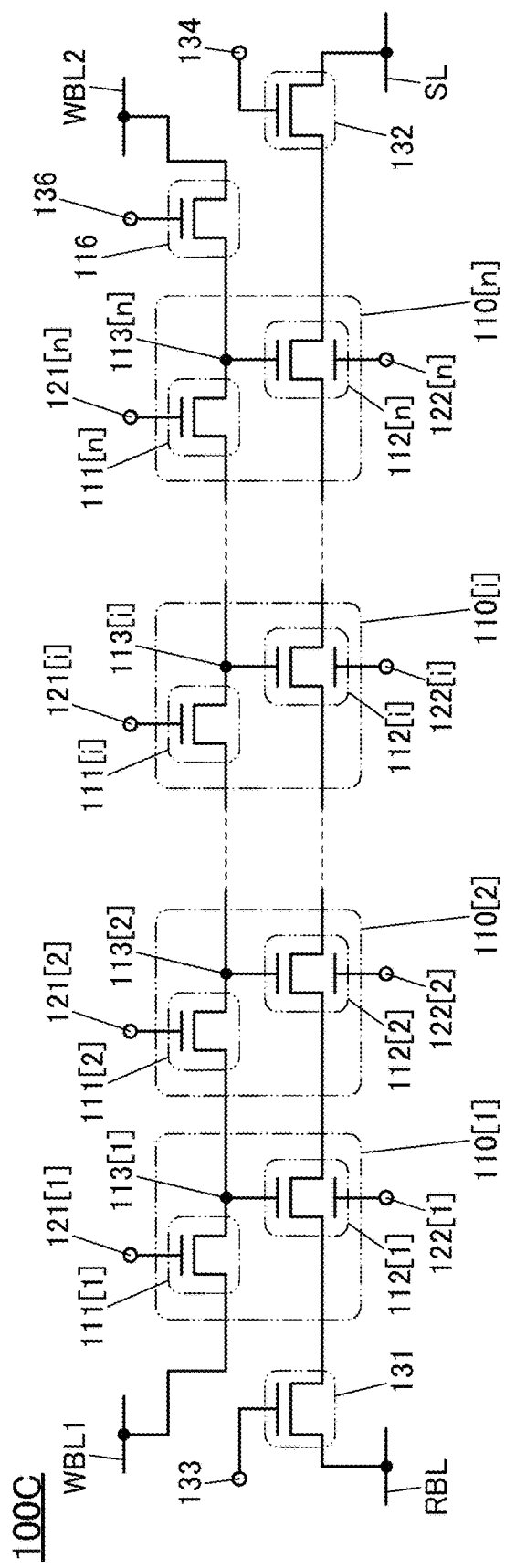
FIG. 14 is a circuit diagram showing a configuration example of a memory device.
Figure 15:
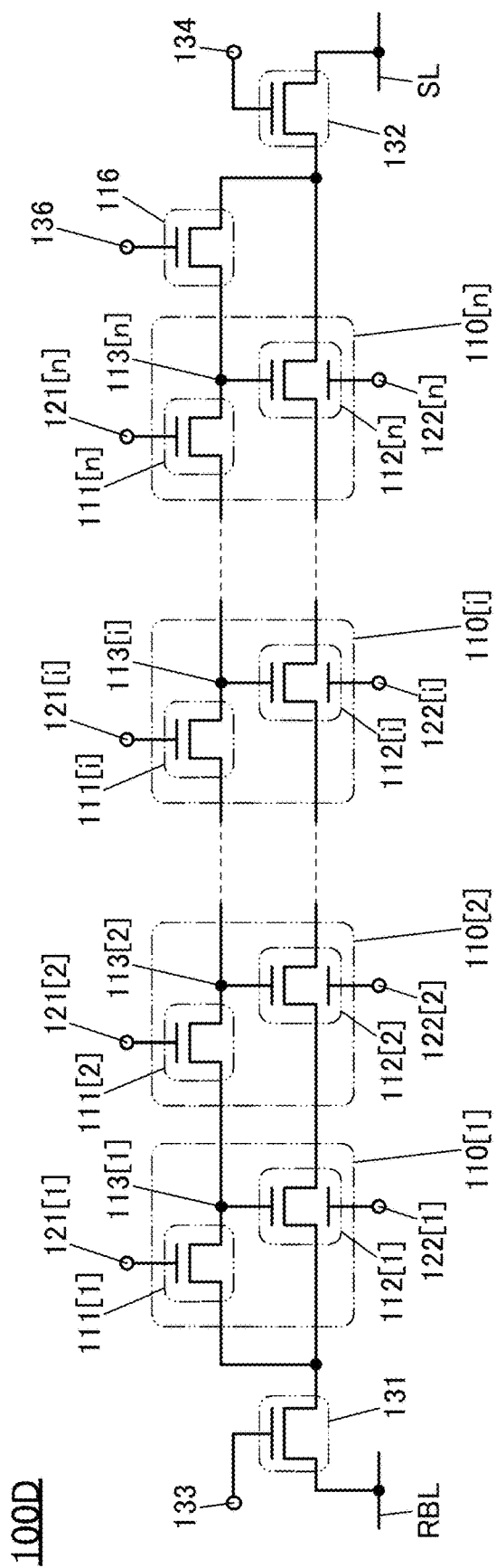
FIG. 15 is a circuit diagram showing a configuration example of a memory device.

FIG. 14 shows a circuit diagram of a memory device 100C. FIG. 15 shows a circuit diagram of a memory device 100D. The memory device 100C and the memory device 100D are modification examples of the memory device 100 shown in the above embodiment. In order to avoid repeated description, differences between the memory device 100 and the memory devices 100C and 100D will be explained mainly in this embodiment.

The memory device 100C and the memory device 100D each have a configuration in which a transistor 116 is added to the memory device 100.

In the memory device 100C illustrated in FIG. 14, one of the source and the drain of the transistor 111[1] is electrically connected to a wiring WBL1. One of a source and a drain of the transistor 116 is electrically connected to the node 113[*n*], and the other is electrically connected to a wiring WBL2. A gate of the transistor 116 is electrically connected to a terminal 136.

The memory device 100D illustrated in FIG. 15 is a modification example of the memory device 100C. In the memory device 100D, one of the source and the drain of the transistor 111[1] is electrically connected to the other of the source and the drain of the transistor 131. The other of the source and the drain of the transistor 116 is electrically connected to one of the source and the drain of the transistor 132.

As in the memory device 100, the gate of the transistor 111 may be electrically connected to the wiring WL in the memory device 100C and the memory device 100D. Alternatively, the gate of the transistor 111 may be electrically connected to the wiring WL through the terminal 121. The back gate of the transistor 112 may be electrically connected to the wiring CL. Alternatively, the back gate of the transistor 112 may be electrically connected to the wiring CL through the terminal 122. The gate of the transistor 116 may be electrically connected to a wiring WSL described later. Alternatively, the gate of the transistor 116 may be electrically connected to the wiring WSL through the terminal 136.

The same transistor can be used as the transistor 111 and the transistor 116. An OS transistor is preferably used as the transistor 116. The transistor may have a back gate.

<Operation Example of Memory Device>

An operation example of the memory device 100C will be described with reference to FIG. 16, FIGS. 17A and 17B, and FIG. 18. Here, the description is made on an example of the memory device 100C including four memory elements 110. In the memory device 100C, the gate of the transistor 111[1] is electrically connected to the wiring WL[1], the gate of the transistor 111[2] is electrically connected to the wiring WL[2], a gate of the transistor 111[3] is electrically connected to the wiring WL[3], a gate of the transistor 111[4] is electrically connected to the wiring WL[4], and the gate of the transistor 116 is electrically connected to the wiring WSL.

Also in the memory device 100C, the back gate of the transistor 112[1] is electrically connected to the wiring CL[1], a back gate the transistor 112[2] is electrically connected to the wiring CL[2], a back gate of the transistor 112[3] is electrically connected to a wiring CL[3], and a back gate of the transistor 112[4] is electrically connected to the wiring CL[4].

[Writing Operation]

Figure 16:
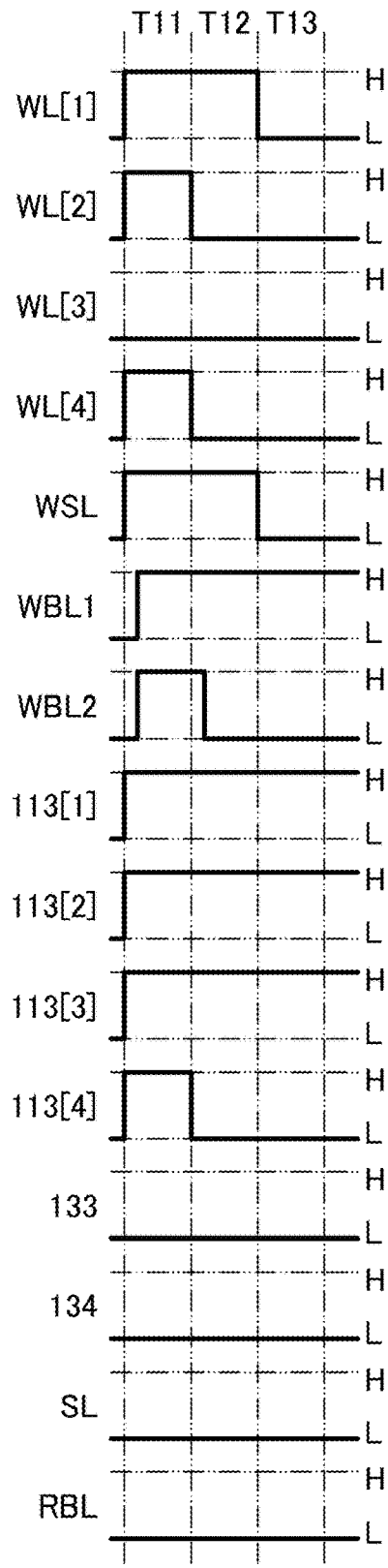
FIG. 16 is a timing chart showing a writing operation of a memory device.
Figure 18:
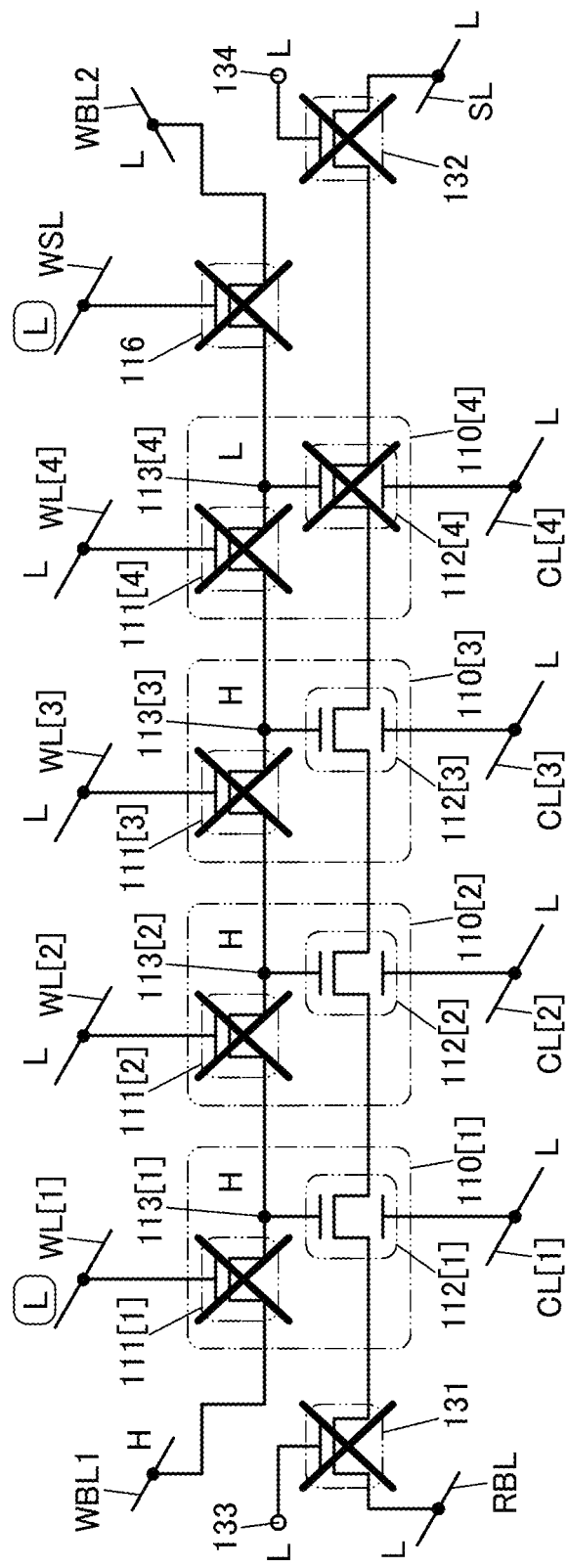
FIG. 18 is a circuit diagram for describing the writing operation of the memory device.

In the operation example described in this embodiment, an H potential is written to the memory element 110[1] to the memory element 110[3] whereas an L potential is written to the memory element 110[4]. FIG. 16 is a timing chart showing a writing operation of the memory device 100C. FIGS. 17A and 17B and FIG. 18 are circuit diagrams for describing the writing operation of the memory device 100C.

It is assumed that in the initial state, the L potential is written to the memory element 110[1] to the memory element 110[4], i.e., the node 113[1] to the node 113[4] have the L potential. It is also assumed that the L potential is supplied to the wiring WL[1] to the wiring WL[4], the wiring CL[1] to the wiring CL[4], the terminal 133, the terminal 134, the wiring SL, the wiring RBL, the wiring WSL, the wiring WBL1, and the wiring WBL2.

[Period T11]

In Period T11, the H potential is supplied to the wiring WL[1], the wiring WL[2], the wiring WL[4], the wiring WSL, the wiring WBL1, and the wiring WBL2 (see FIG. 17A). The potential of the wiring WL[3] remains L. Then, transistor 111[1], the transistor 111[2], the transistor 111[4], and the transistor 116 are turned on and the node 113[1] to the node 113[4] have the H potential, so that the transistor 112[1] to the transistor 112[4] are turned on.

In the case where the potential of the wiring WBL1 is changed in Period T11, the potential of the wiring WBL is preferably changed after the transistor 112[1] and the transistor 112[2] are turned on. In the case where the potential of the wiring WBL2 is changed in Period T11, the potential of the wiring WBL2 is preferably changed after the transistor 112[4] and the transistor 116 are turned on.

[Period T12]

In Period T12, the L potential is supplied to the wiring WL[2] and the wiring WL[4] (see FIG. 17B). Then, the transistor 111[2] and the transistor 111[4] are turned off and charge written to the node 113[2] and the node 113[3] is retained. In this embodiment, the charge equivalent to the H potential is retained. In addition, the L potential is supplied to the wiring WBL2.

In the case where the potential of the wiring WBL1 is changed in Period T12, the potential of the wiring WBL1 is changed after the transistor 111[2] is turned off. In the case where the potential of the wiring WBL2 is changed in Period T12, the potential of the wiring WBL2 is changed after the transistor 111[3] is turned off. When the L potential is supplied to the wiring WBL2, the node 113[4] has the L potential, so that the transistor 112[4] is turned off.

[Period T13]

In Period T13, the L potential is supplied to the wiring WL[1] and the wiring WSL (see FIG. 18). Then, the transistor 111[1] and the transistor 116 are turned off and charge written to the node 113[1] and the node 113[4] is retained. In this embodiment, the charge equivalent to the H potential is retained in the node 113[1], and the charge equivalent to the L potential is retained in the node 113 [4].

In the case where the potential of the wiring WBL1 is changed, the potential of the wiring WBL1 is changed after the transistor 111[1] is turned off In the case where the potential of the wiring WBL2 is changed, the potential of the wiring WBL2 is changed after the transistor 116 is turned off.

In the memory device 100C, data can be written from both the wiring WBL1 and the wiring WBL2, allowing the writing operation to be completed in a shorter time than in the memory device 100.

The memory device 100D can be operated in a manner similar to that of the memory device 100C. Note that in the memory device 100D, the wiring RBL functions as the wiring WBL1 and the wiring SL functions as the wiring WBL2 in the writing operation. In the memory device 100D, the transistor 131 and the transistor 132 are turned on in the writing operation. At this time, the L potential is supplied to at least one of the wirings CL, whereby a short circuit between the wiring RBL and the wiring SL can be prevented.

In the memory device 100C and the memory device 100D, n is preferably an even number. When n is an even number, a n/2+1-th transistor 111 is turned off in Period T11.

[Reading Operation]

The reading operation in the memory device 100C and the memory device 100D can be performed in a manner similar to that in the memory device 100; thus, the description is omitted in this embodiment.

Modification Example

Figure 19:
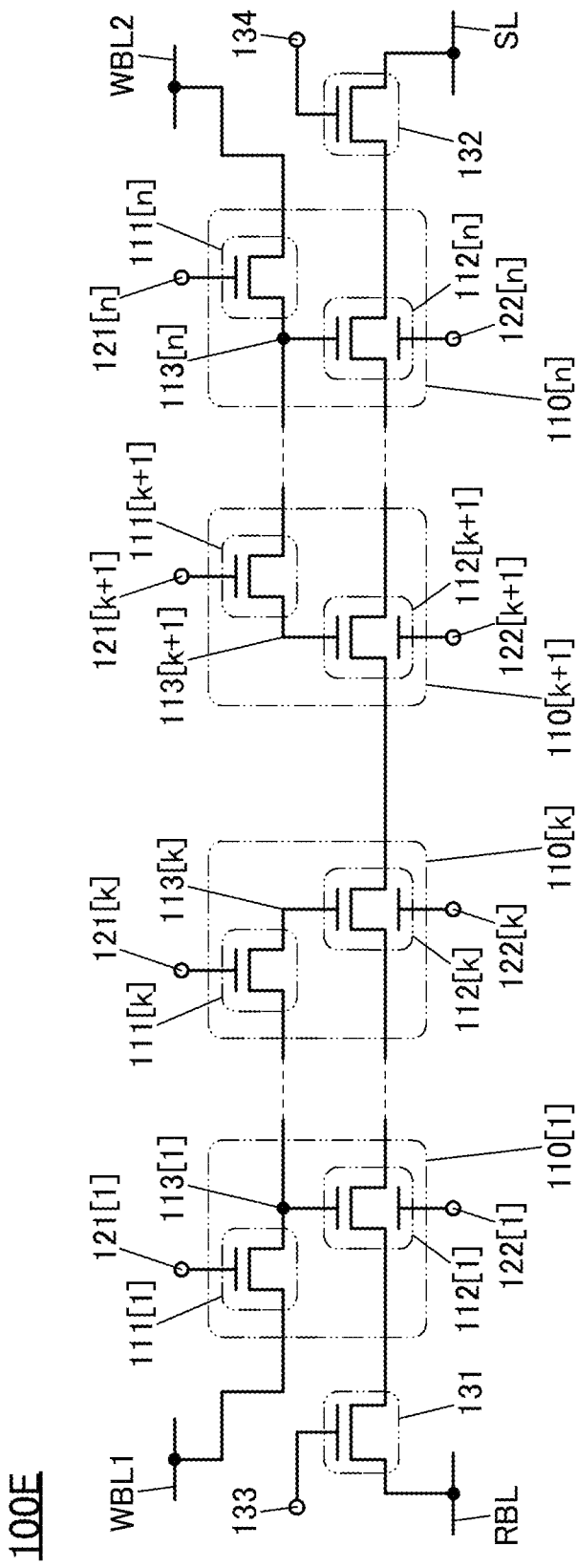
FIG. 19 is a circuit diagram showing a configuration example of a memory device.
Figure 20:
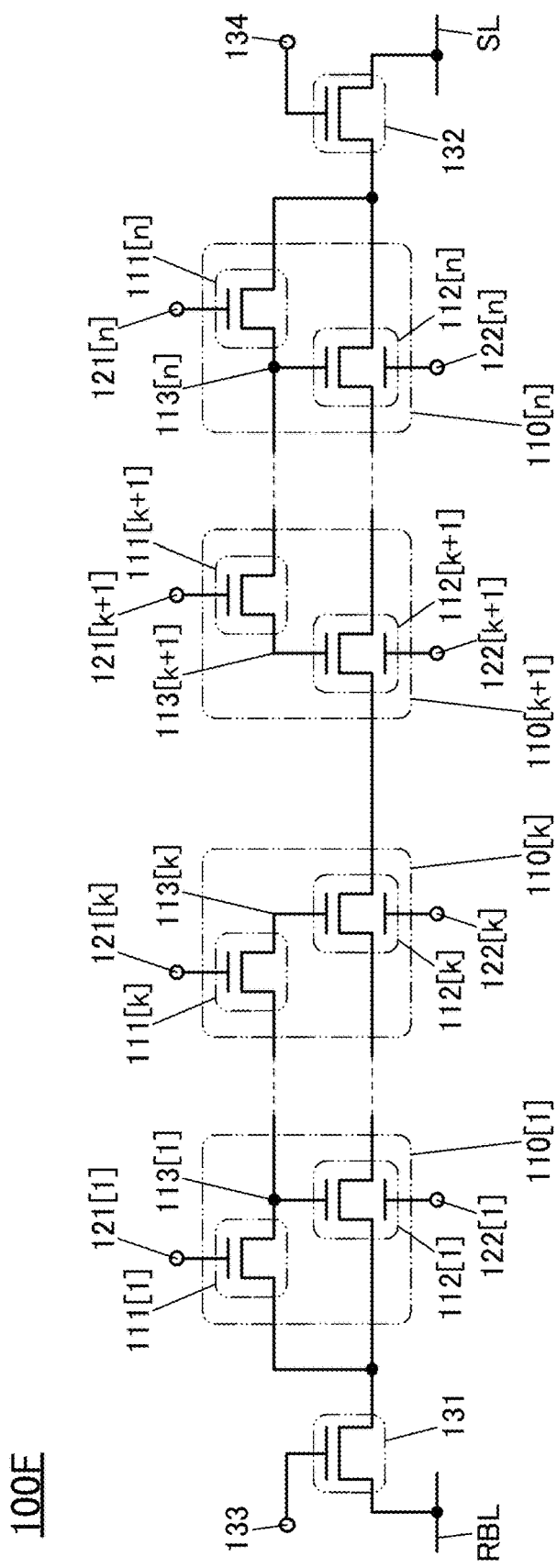
FIG. 20 is a circuit diagram showing a configuration example of a memory device.

As a modification example of the memory device 100C, a memory device 100E is shown in FIG. 19. As a modification example of the memory device 100D, a memory device 100F is shown in FIG. 20. The memory device 100E and the memory device 100F each have a configuration in which the transistor 116 is removed from the memory device 100C and the memory device 100D and a transistor 111[k] and a transistor 111[k+1] are electrically isolated from each other.

In the memory device 100E and the memory device 100F, n is preferably an even number. When n is an even number, k is n/2.

In a memory element 110[k+1], one of a source and a drain of the transistor 111[k+1] is electrically connected to a gate of a transistor 112[k+1], and the other is electrically connected to one of a source and a drain of a transistor 111[k+2].

In the memory element 110[n], one of the source and the drain of the transistor 111[n] is electrically connected to the gate of the transistor 112[n] and the other of a source and a drain of a transistor 111[n−1] (not illustrated).

In the memory element 110[k+1] to the memory element 110[n], a connection point between one of the source and the drain of the transistor 111 and the gate of the transistor 112 functions as the node 113.

The writing operation in the memory device 100E and the memory device 100F can be performed in a manner similar to that in the memory device 100C and the memory device 100D except that the transistor 111 (e.g., the transistor 111[3] in the above description of the writing operation) is not turned off in Period T11. The reading operation in the memory device 100E and the memory device 100F can also be performed in a manner similar to that in the memory device 100C and the memory device 100D.

In the memory device 100E and the memory device 100F, the writing operation in the memory element 110[1] to the memory element 110[k] and the writing operation in the memory element 110[k+1] to the memory element 110[n] can be performed separately. Accordingly, power consumption needed for the writing operation can be reduced.

This embodiment can be implemented in combination with any of the structures described in the other embodiments and the like, as appropriate.

Embodiment 3

In this embodiment, a configuration example of a semiconductor device 200 including the memory device 100 will be described.

Figure 21:
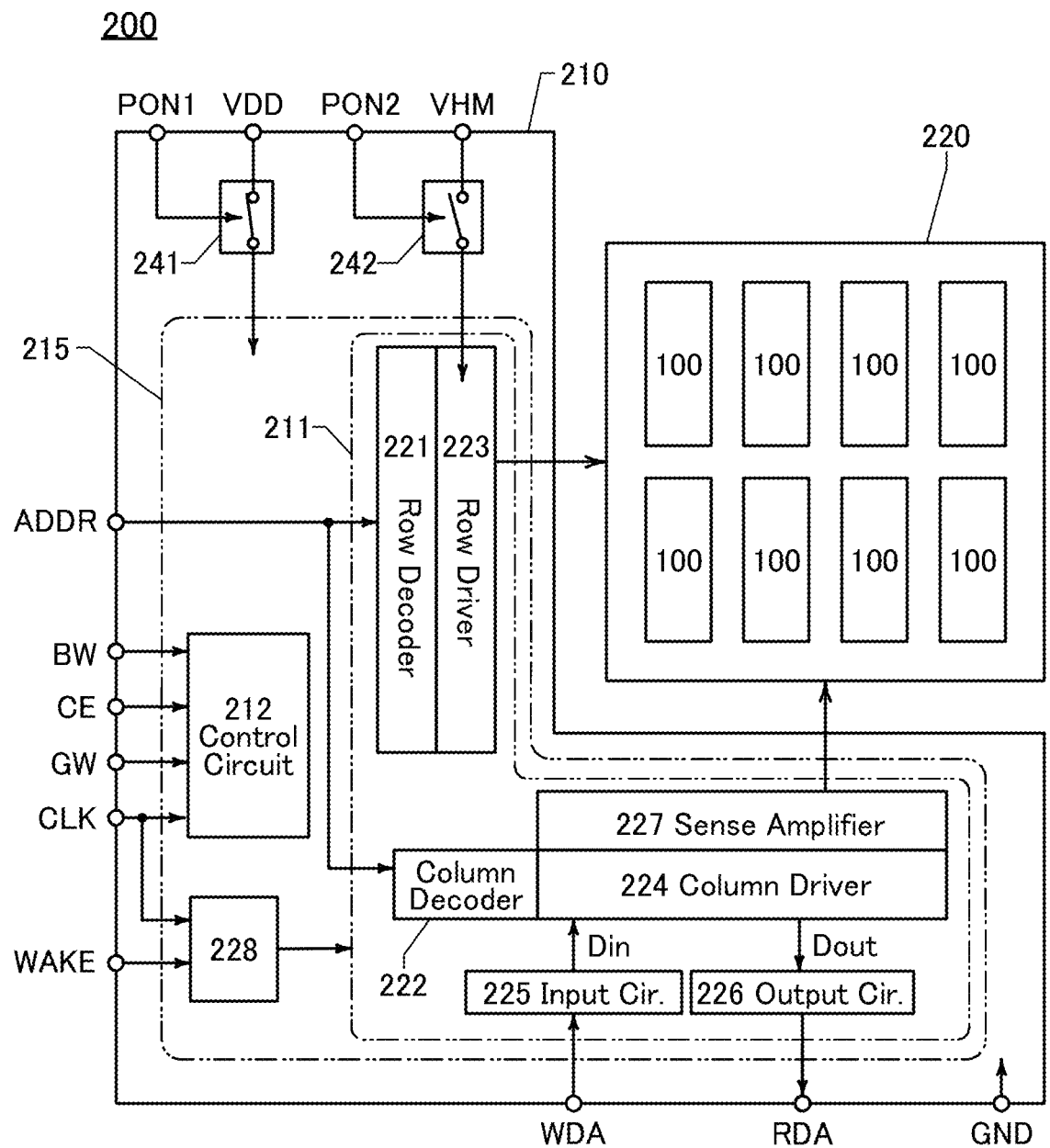
FIG. 21 is a block diagram showing a configuration example of a semiconductor device.

FIG. 21 is a block diagram showing a configuration example of the semiconductor device 200 of one embodiment of the present invention. The semiconductor device 200 shown in FIG. 21 includes a driver circuit 210 and a memory array 220. The memory array 220 includes at least one memory device 100. FIG. 21 shows an example in which the memory array 220 includes a plurality of memory devices 100 (a plurality of strings) arranged in a matrix.

The driver circuit 210 includes a PSW (power switch) 241, a PSW 242, and a peripheral circuit 215. The peripheral circuit 215 includes a peripheral circuit 211, a control circuit 212, and a voltage generation circuit 228.

In the semiconductor device 200, whether or not to use each circuit, each signal, and each voltage can be selected as appropriate. Another circuit or another signal may be added. Signals BW, CE, GW, CLK, WAKE, ADDR, WDA, PON1, and PON2 are input signals, and a signal RDA is an output signal. The signal CLK is a clock signal.

The signals BW, CE, and GW are control signals. The signal CE is a chip enable signal. The signal GW is a global write enable signal. The signal BW is a byte write enable signal. The signal ADDR is an address signal. The signal WDA is a write data signal, and the signal RDA is a read data signal. The signals PON1 and PON2 are power gating control signals. Note that the signals PON1 and PON2 may be generated in the control circuit 212.

The control circuit 212 is a logic circuit having a function of controlling the entire operation of the semiconductor device 200. For example, the control circuit performs a logical operation on the signals CE, GW, and BW to determine an operation mode (e.g., writing operation or reading operation) of the semiconductor device 200. The control circuit 212 generates a control signal for the peripheral circuit 211 so that the operation mode is executed.

The voltage generation circuit 228 has a function of generating a negative voltage. The signal WAKE has a function of controlling the input of the signal CLK to the voltage generation circuit 228. For example, when an H-level signal is applied as the signal WAKE, the signal CLK is input to the voltage generation circuit 228, and the voltage generation circuit 228 generates the negative voltage.

The peripheral circuit 211 is a circuit for writing and reading data to/from the memory device 100. The peripheral circuit 211 includes a row decoder 221, a column decoder 222, a row driver 223, a column driver 224, an input circuit 225, an output circuit 226, and a sense amplifier 227.

The row decoder 221 and the column decoder 222 have a function of decoding the signal ADDR. The row decoder 221 is a circuit for specifying a row to be accessed. The column decoder 222 is a circuit for specifying a column to be accessed. The row driver 223 has a function of selecting the wiring WL specified by the row decoder 221. The column driver 224 has a function of writing data to the memory device 100, reading data from the memory device 100, retaining the read data, and the like.

The input circuit 225 has a function of retaining the signal WDA. Data retained in the input circuit 225 is output to the column driver 224. Data output from the input circuit 225 is data (Din) to be written to the memory device 100. Data (Dout) read from the memory device 100 by the column driver 224 is output to the output circuit 226. The output circuit 226 has a function of retaining Dout. In addition, the output circuit 226 has a function of outputting Dout from the semiconductor device 200. The data output from the output circuit 226 is the signal RDA.

The PSW 241 has a function of controlling the supply of VDD to the peripheral circuit 215. The PSW 242 has a function of controlling the supply of VHM to the row driver 223. In the semiconductor device 200, a high power supply voltage is VDD and a low power supply voltage is GND (ground potential). VHM, which is a high power supply voltage used for setting the word line to a high level, is higher than VDD. The on/off of the PSW 241 is controlled by the signal PON1, and the on/off of the PSW 242 is controlled by the signal PON2. Although the number of power domains to which VDD is supplied is one in the peripheral circuit 215 in FIG. 21, it may be two or more. In that case, a power switch is provided for each power domain.

Figure 22A:
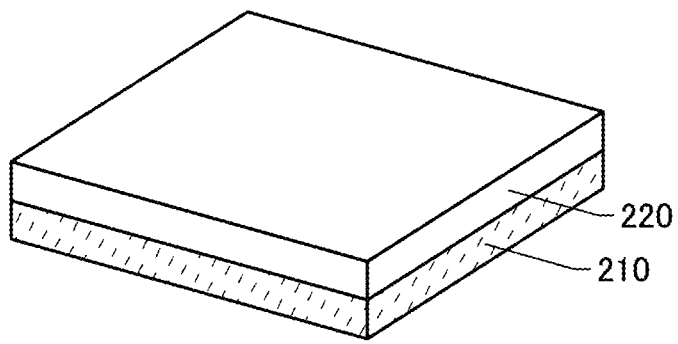
FIGS. 22A to 22C are perspective views showing configuration examples of a semiconductor device.
Figure 22B:
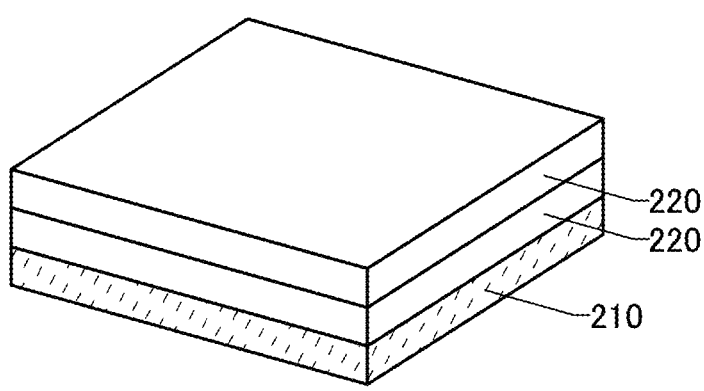

The driver circuit 210 and the memory array 220 may be provided on the same plane. As illustrated in FIG. 22A, the driver circuit 210 and the memory array 220 may be provided to overlap with each other. When the driver circuit 210 and the memory array 220 overlap with each other, the signal transmission distance can be shortened. Alternatively, a plurality of memory arrays 220 may be provided over the driver circuit 210 as illustrated in FIG. 22B.

Figure 22C:
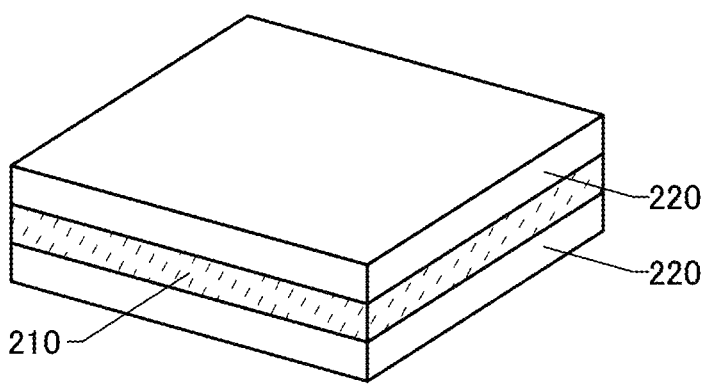

As illustrated in FIG. 22C, the memory array 220 may be provided over and under the driver circuit 210. FIG. 22C shows an example in which one memory array 220 is provided over and under the driver circuit 210. When the driver circuit 210 is interposed between the memory arrays 220, the signal transmission distance can be further shortened. The number of memory arrays 220 over the driver circuit 210 and the number of memory arrays 220 under the driver circuit 210 may each be one or more. The number of memory arrays 220 over the driver circuit 210 is preferably equal to the number of memory arrays 220 under the driver circuit 210.

This embodiment can be implemented in combination with any of the structures described in the other embodiments and the like, as appropriate.

Embodiment 4

In this embodiment, specific structure examples of the memory device 100 and a manufacturing method thereof will be described with reference to drawings.

<Structure Examples of Memory Device>

Figure 23A:
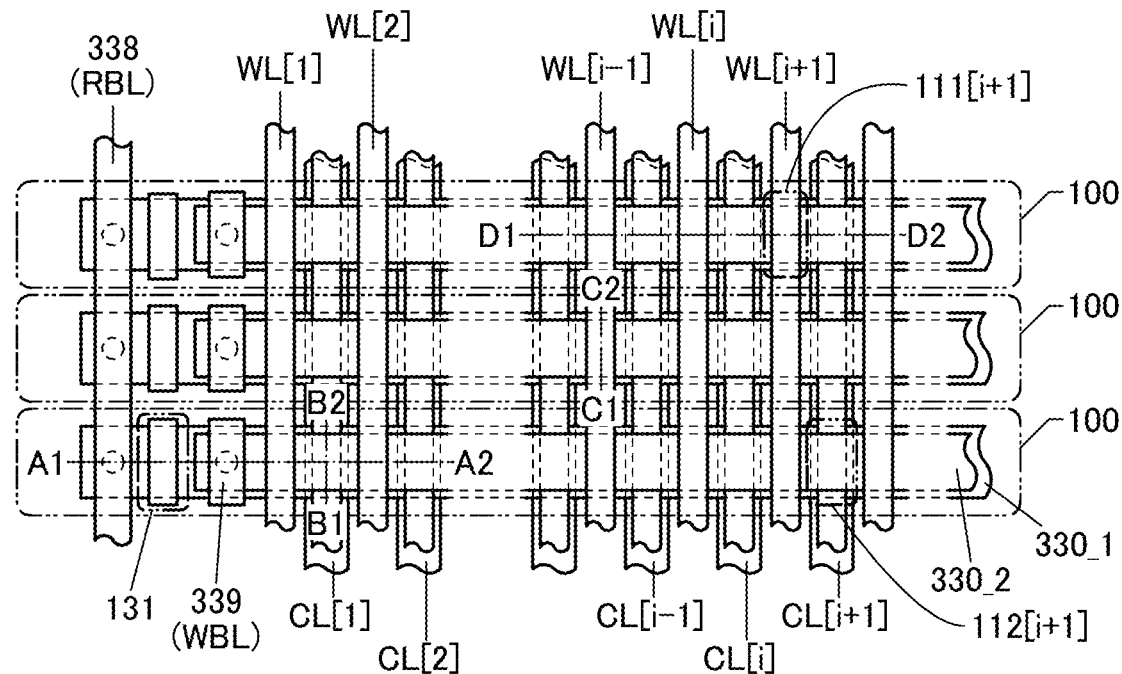
FIG. 23A is a top view showing a structure example of a memory device.
Figure 23B:
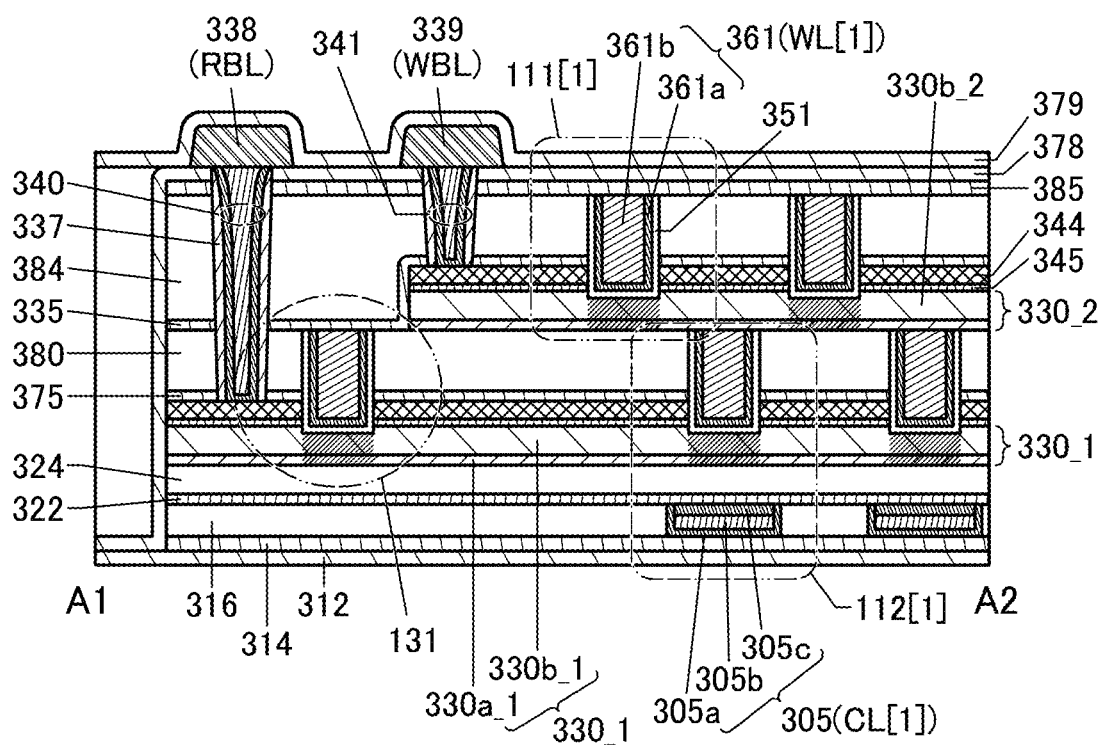
FIG. 23B is a cross-sectional view showing the structure example of the memory device.
Figure 24A:
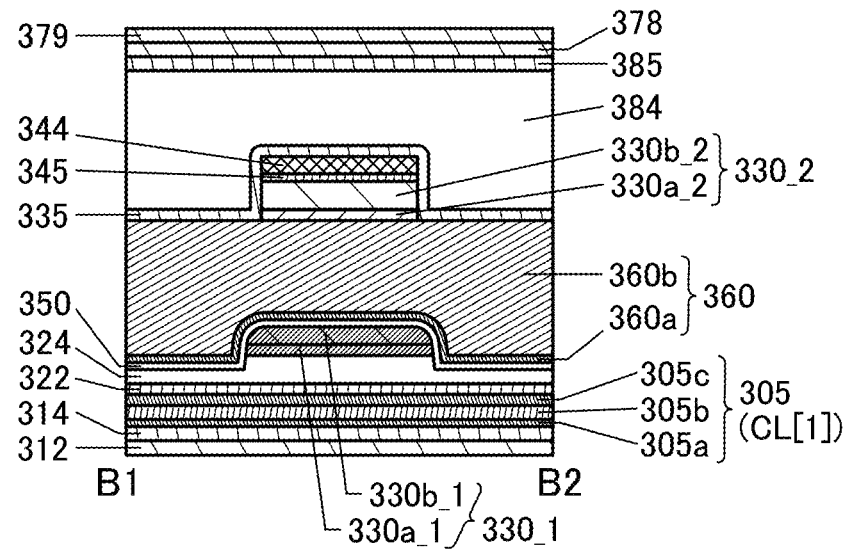
FIGS. 24A and 24B are cross-sectional views showing structure examples of a memory device.
Figure 24B:
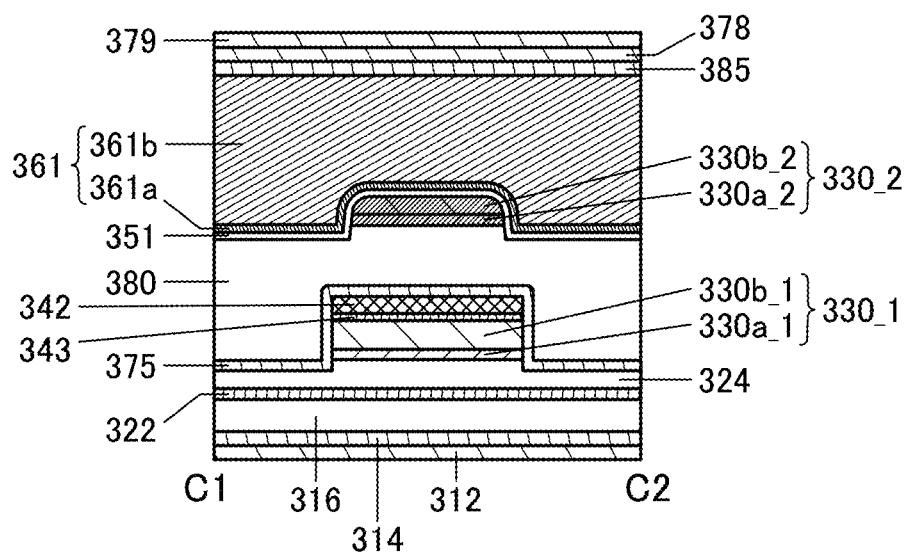
Figure 25:
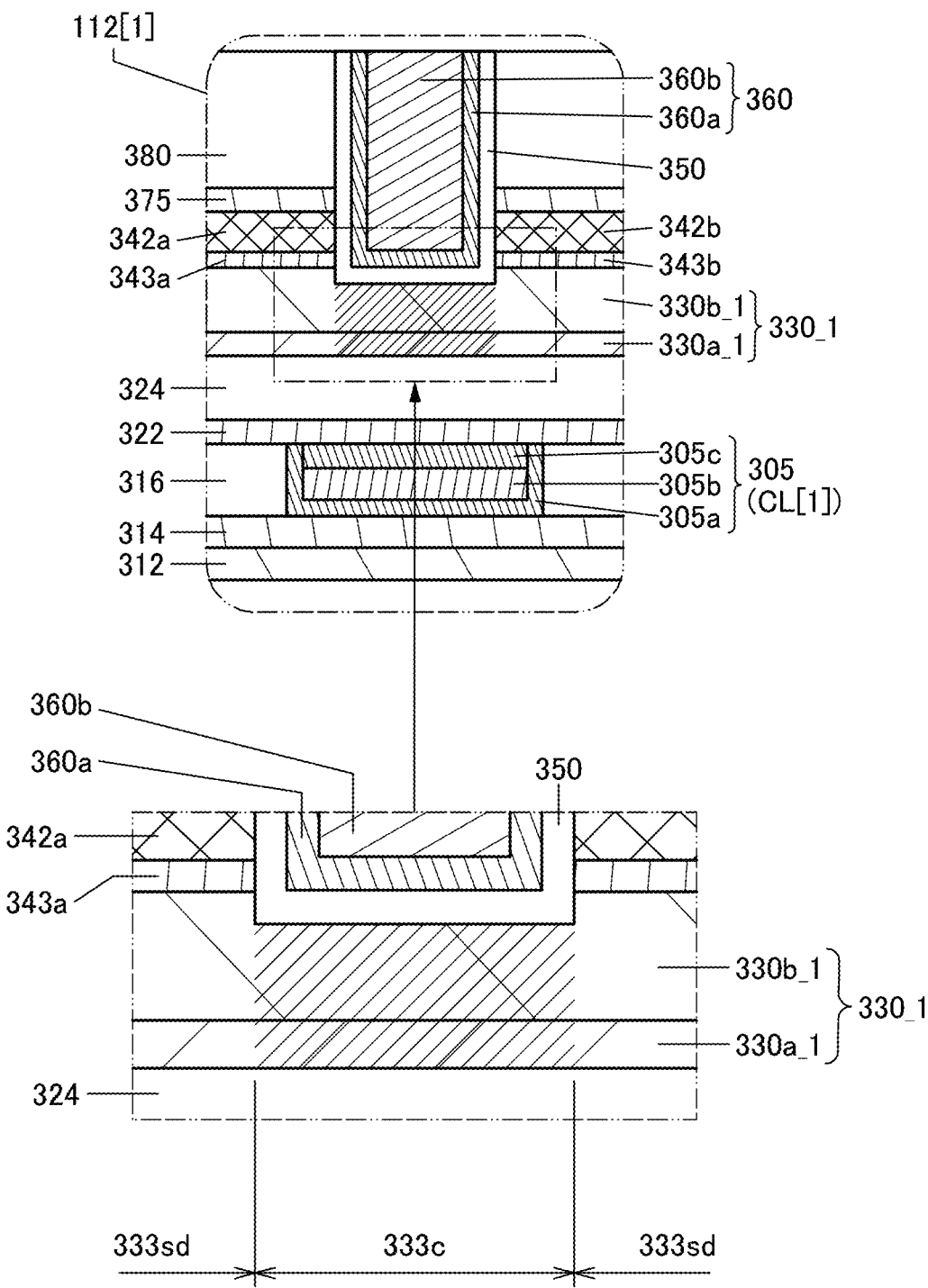
FIG. 25 is a cross-sectional view showing a structure example of a transistor.
Figure 26A:
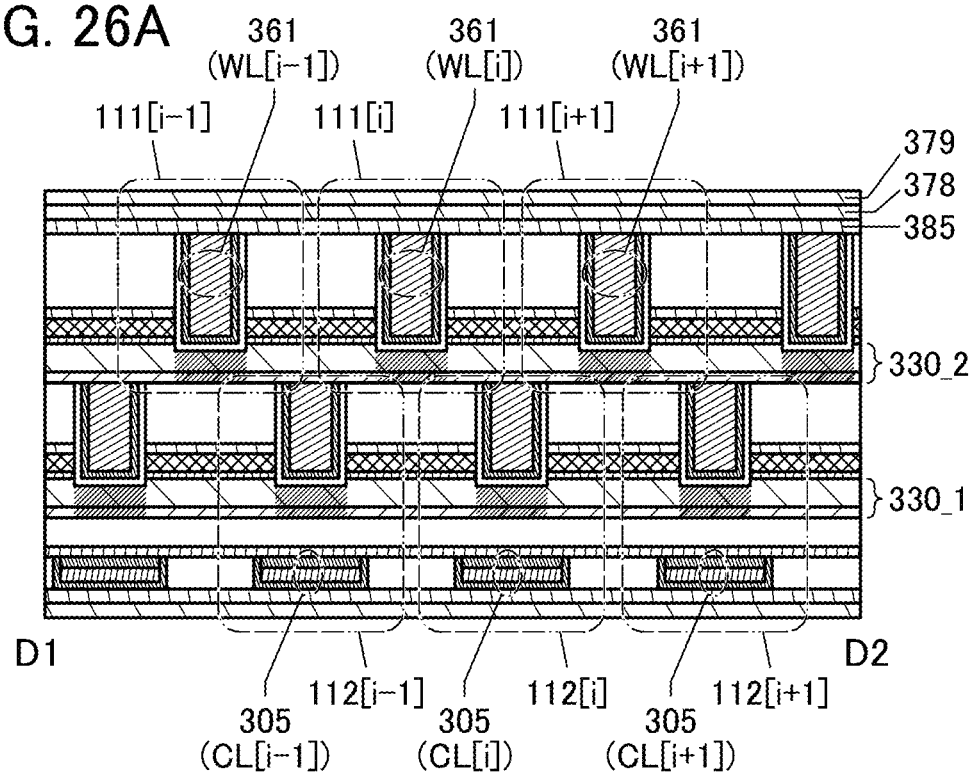
FIGS. 26A and 26B are cross-sectional views showing structure examples of a memory device.
Figure 26B:
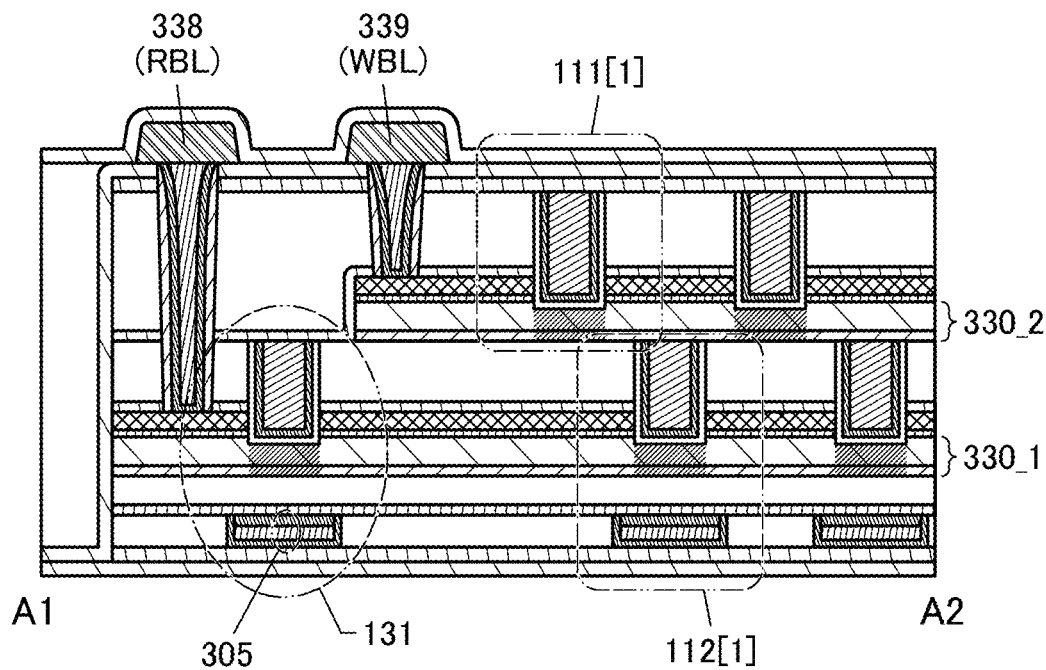
Figure 28A:
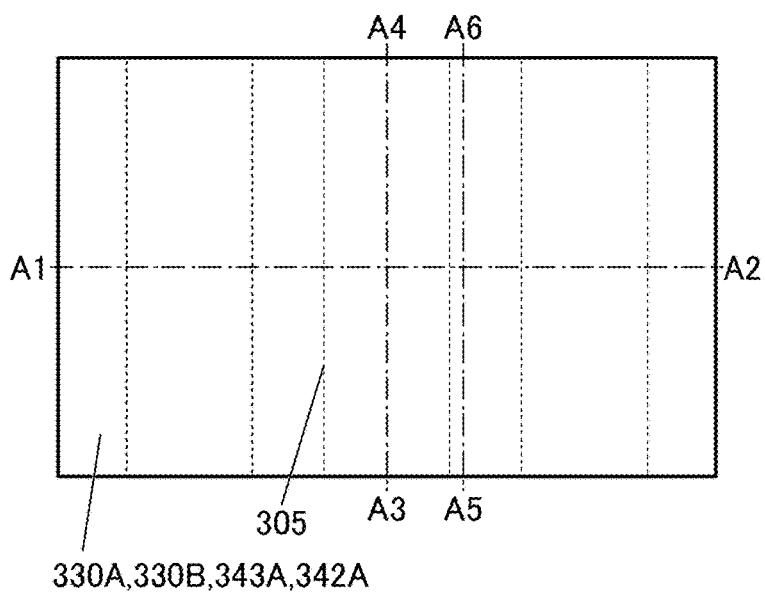
FIG. 28A is a top view for describing a manufacturing method example of a memory device.
Figure 28C:
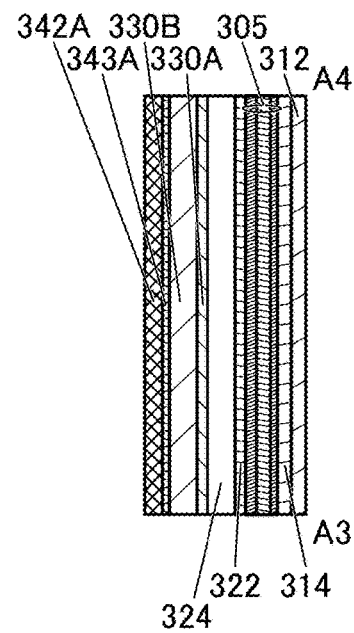
FIGS. 28B to 28D are cross-sectional views for describing the manufacturing method example of the memory device.
Figure 28B:
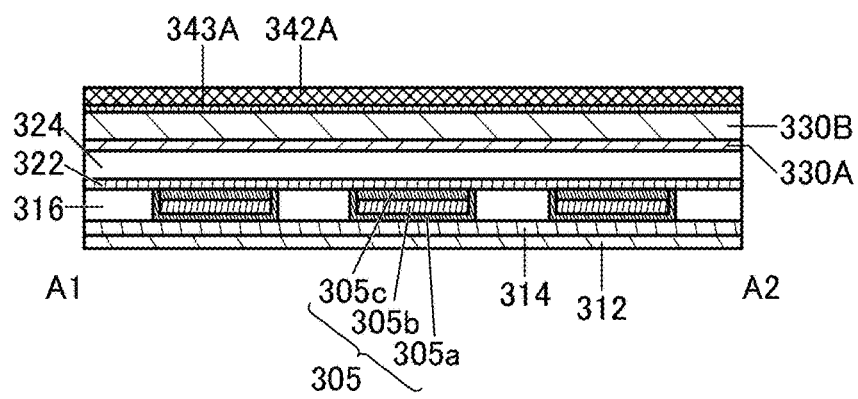
Figure 28D:
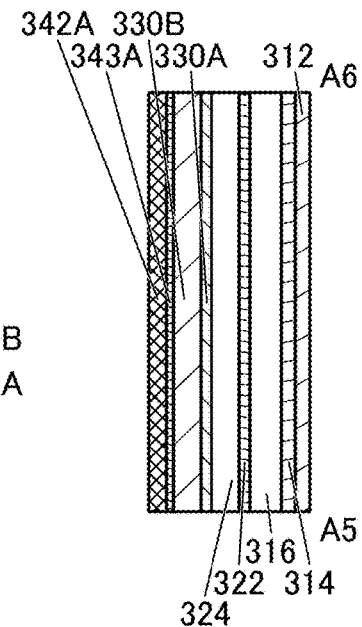
Figure 29A:
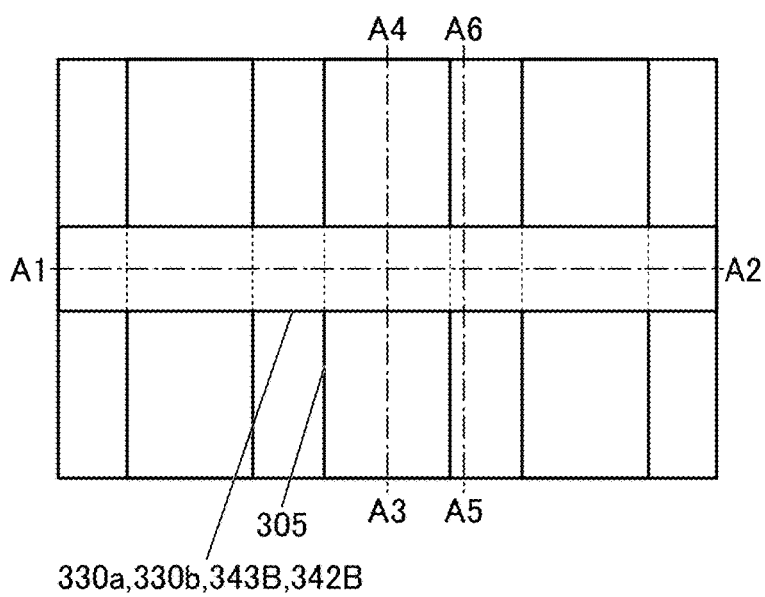
FIG. 29A is a top view for describing a manufacturing method example of a memory device.
Figure 29C:
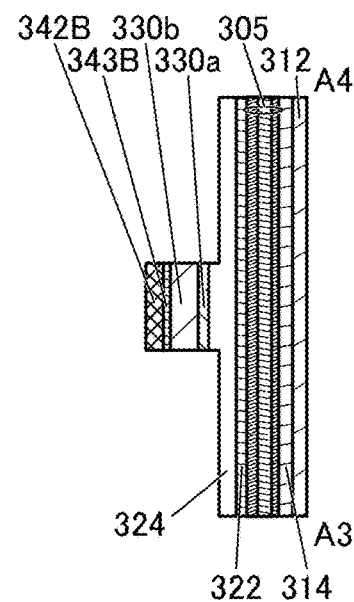
FIGS. 29B to 29D are cross-sectional views for describing the manufacturing method example of the memory device.
Figure 29B:
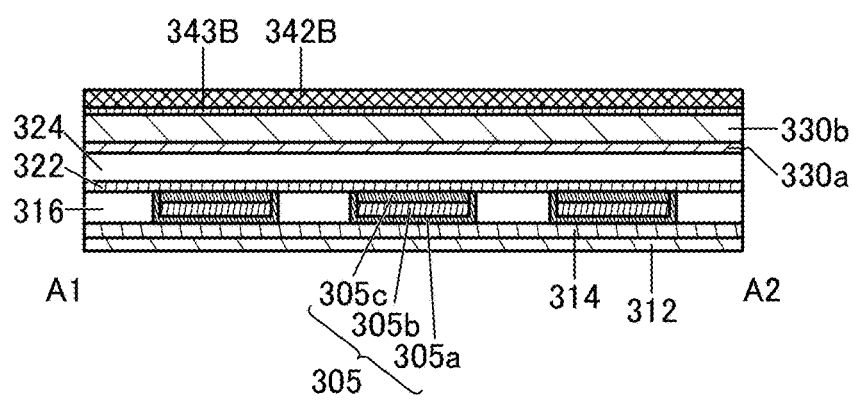
Figure 29D:
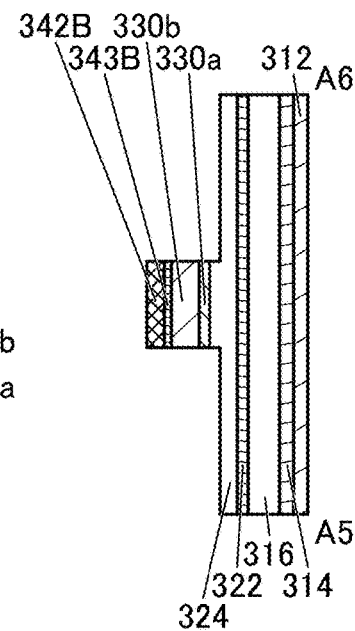
Figure 30A:
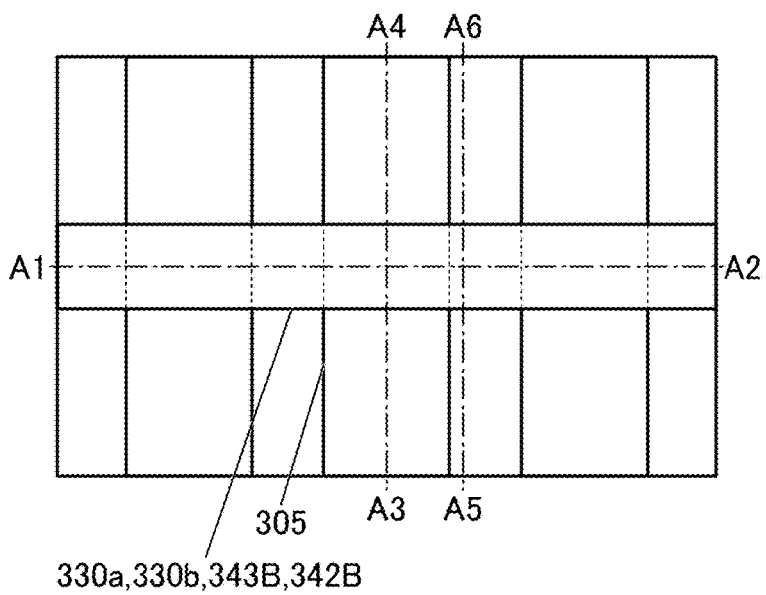
FIG. 30A is a top view for describing a manufacturing method example of a memory device.
Figure 30C:
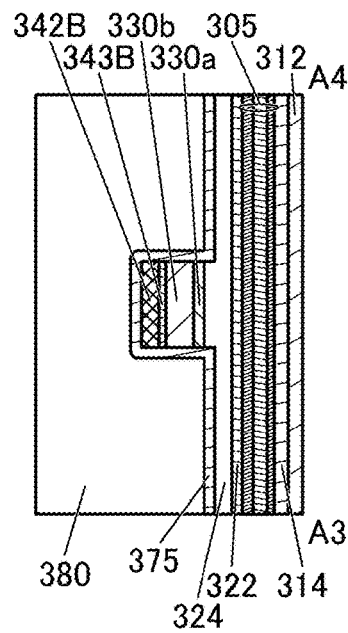
FIGS. 30B to 30D are cross-sectional views for describing the manufacturing method example of the memory device.
Figure 30B:
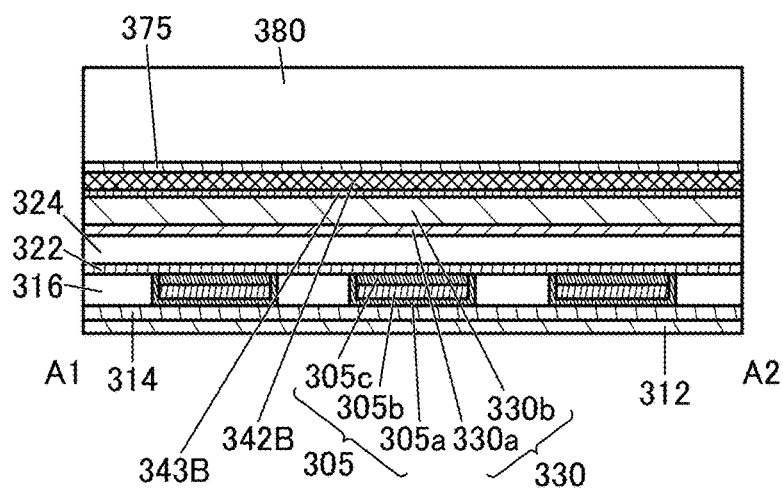
Figure 30D:
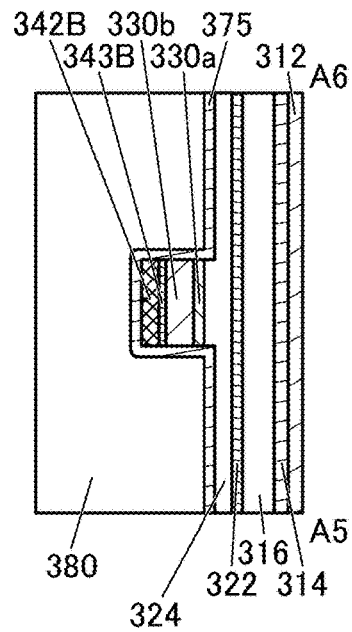
Figure 31A:
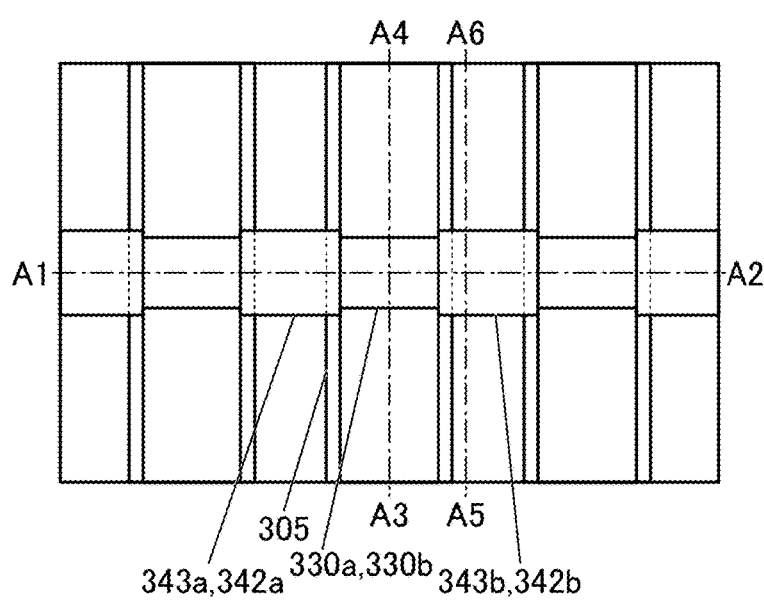
FIG. 31A is a top view for describing a manufacturing method example of a memory device.
Figure 31C:
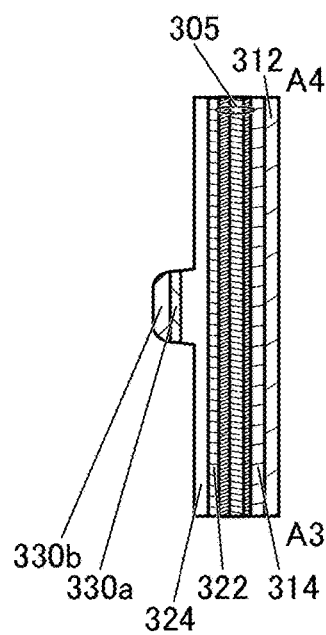
FIGS. 31B to 31D are cross-sectional views for describing the manufacturing method example of the memory device.
Figure 31B:
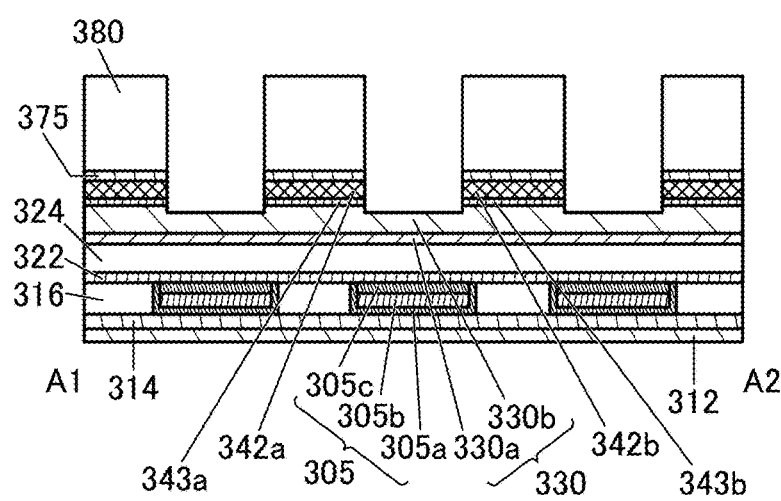
Figure 31D:
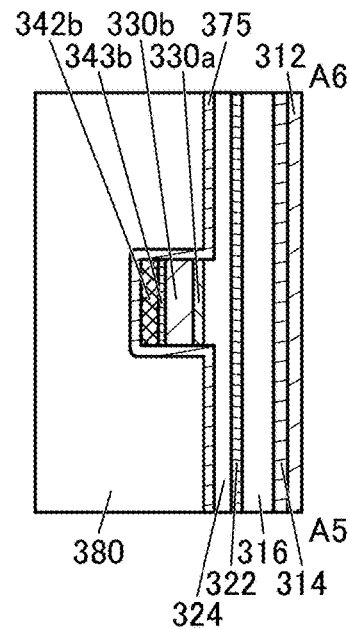

Structure examples of the memory device 100 will be described with reference to FIGS. 23A and 23B, FIGS. 24A and 24B, FIG. 25, and FIGS. 26A and 26B. FIG. 23A is a top view of the memory device 100. FIG. 23B is a cross-sectional view taken along dashed-dotted line A1-A2 in FIG. 23A. FIG. 24A is a cross-sectional view taken along dashed-dotted line B1-B2 in FIG. 23A. FIG. 24B is a cross-sectional view taken along dashed-dotted line C1-C2 in FIG. 23A. FIG. 25 is an enlarged view of the transistor 112[1] shown in FIG. 23B. FIG. 26A is a cross-sectional view taken along dashed-dotted line D1-D2 in FIG. 23A. FIG. 26B is a cross-sectional view taken along dashed-dotted line A1-A2 in FIG. 23A and shows a modification example of FIG. 23B.

FIG. 23B, FIG. 25, FIG. 26A, and FIG. 26B show the cross sections of transistors in the channel length direction. FIGS. 24A and 24B show the cross sections of the transistors in the channel width direction. Note that for simplification, some components are not illustrated in the top view in FIG. 23A.

The memory device 100 includes an insulator 312 over a substrate (not illustrated), an insulator 314 over the insulator 312, an insulator 316 over the insulator 314, and a conductor 305 (a conductor 305a, a conductor 305b, and a conductor 305c) arranged to be embedded in the insulator 316. The memory device 100 also includes an insulator 322 over the insulator 316 and the conductor 305, an insulator 324 over the insulator 322, an oxide 330a_1 over the insulator 324, and an oxide 330b_1 over the oxide 330a_1. Note that in this specification and the like, the oxide 330a_1 and the oxide 330b_1 are collectively referred to as an oxide 330_1 in some cases.

The memory device 100 includes an oxide 343a, an oxide 343b, and an insulator 350 over the oxide 330b_1, a conductor 342a over the oxide 343a, and a conductor 342b over the oxide 343b. In this specification and the like, the oxide 343a and the oxide 343b are collectively referred to as an oxide 343 in some cases. In addition, the conductor 342a and the conductor 342b are collectively referred to as a conductor 342 in some cases.

The memory device 100 includes a conductor 360 (a conductor 360a and a conductor 360b) that overlaps with part of the oxide 330b_1 with the insulator 350 therebetween, an insulator 375 covering the conductor 342, and an insulator 380 over the insulator 375. An opening that reaches the oxide 330b_1 is provided in the insulator 380 and the insulator 375. The insulator 350 and the conductor 360 are placed in the opening. The opening is provided between the conductor 342a and the oxide 343a, and the conductor 342b and the oxide 343b. Thus, the conductor 360 is provided between the conductor 342a and the oxide 343a, and the conductor 342b and the oxide 343b. Here, the insulator 350 is preferably provided in contact with a top surface of the oxide 330b_1 that overlaps with the opening, a side surface of the oxide 343, a side surface of the conductor 342, a side surface of the insulator 375, and a side surface of the insulator 380. The conductor 360 is preferably provided in contact with the insulator 350. As illustrated in FIG. 23B and FIG. 25, a top surface of the conductor 360, a top surface of the insulator 350, and a top surface of the insulator 380 are in contact with an insulator 335 described later.

The memory device 100 includes an oxide 330a_2 over the insulator 380 and an oxide 330b_2 over the oxide 330a_2. In this specification and the like, the oxide 330a_2 and the oxide 330b_2 are collectively referred to as an oxide 330_2 in some cases.

In order to avoid repeated description, when description common to the oxide 330_1 and the oxide 330_2 is made in this specification and the like, the oxide 330_1 and the oxide 330_2 are simply referred to as "oxide 330" in some cases. Similarly, when description common to the oxide 330a_1 and the oxide 330a_2 is made, the oxide 330a_1 and the oxide 330a_2 are simply referred to as "oxide 330a". Similarly, when description common to the oxide 330b_1 and the oxide 330b_2 is made, the oxide 330b_1 and the oxide 330b_2 are simply referred to as "oxide 330b".

The oxide 330 preferably includes the oxide 330a and the oxide 330b. The oxide 330a under the oxide 330b inhibits diffusion of impurities into the oxide 330b from the components formed below the oxide 330a.

The memory device 100 includes an oxide 345 and an insulator 351 over the oxide 330b_2, and a conductor 344 over the oxide 345. The memory device 100 also includes a conductor 361 (a conductor 361a and a conductor 361b) that overlaps with part of the oxide 330b_2 with the insulator 351 therebetween, the insulator 335 covering the conductor 344, and an insulator 384 over the insulator 335.

An opening that reaches the oxide 330b_2 is provided in the insulator 384, the insulator 335, the conductor 344, and the oxide 345. The insulator 351 and the conductor 361 are placed in the opening. Here, the insulator 351 is preferably provided in contact with a top surface of the oxide 330b_2 that overlaps with the opening, a side surface of the oxide 345, a side surface of the conductor 344, a side surface of the insulator 335, and a side surface of the insulator 384. The conductor 361 is preferably provided in contact with the insulator 351. As shown in FIG. 23B, a top surface of the conductor 361, a top surface of the insulator 351, and a top surface of the insulator 384 are in contact with an insulator 385 described later.

The memory device 100 includes an insulator 385 over the conductor 361, the insulator 351, and the insulator 384, and an insulator 378 over the insulator 385. In the memory device 100, the insulator 385, the insulator 384, the insulator 335, the insulator 380, the insulator 375, the conductor 342, the oxide 343, the oxide 330_1, the insulator 324, the insulator 322, the insulator 316, the insulator 314, and the like are partly removed at an end portion of the string or in an outside region of the string. In that region in FIG. 23B, part of the insulator 378 is in contact with part of the insulator 312.

The memory device 100 includes a conductor 338 and a conductor 339 over the insulator 378. The conductor 338 is electrically connected to one of a source electrode and a drain electrode of the transistor 131 through a contact plug 340 embedded in the insulator 378, the insulator 385, the insulator 384, the insulator 335, the insulator 380, and the insulator 375. An insulator 337 is provided on a side surface of the contact plug 340. The conductor 339 is electrically connected to one of a source electrode and a drain electrode of the transistor 111[1] through a contact plug 341 embedded in the insulator 378, the insulator 385, the insulator 384, and the insulator 335. The memory device 100 also includes an insulator 379 over the insulator 378, the conductor 338, and the conductor 339.

The oxide 330a and the oxide 330b function as semiconductor layers. This embodiment shows a structure in which the oxide 330a and the oxide 330b are stacked as the oxide 330, but the present invention is not limited thereto. For example, the oxide 330 may have a single-layer structure of the oxide 330b or a stacked-layer structure of three or more layers, or the oxide 330a and the oxide 330b may each have a stacked-layer structure. In the case where an oxide similar to the oxide 330a or 330b is stacked over the oxide 330b, the oxide may be provided along a bottom and a side surface of an opening as the insulator 350.

In this embodiment and the like, the conductor 338 functions as the wiring RBL and the conductor 339 functions as the wiring WBL. The conductor 360 functions as a gate electrode (also referred to as a "first gate" or a "first gate electrode") of the transistor 112, and the conductor 305 functions as a back gate electrode (also referred to as a "second gate" or a "second gate electrode") of the transistor 112. The conductor 361 functions as a gate electrode of the transistor 111.

The conductor 305 included in the transistor 112[1] functions as the wiring CL[1]. The conductor 361 included in the transistor 111[1] functions as the wiring WL[1].

Similarly, the conductor 305 included in the transistor 112[i] functions as the wiring CL[i]. The conductor 361 included in the transistor 111[i] functions as the wiring WL[i] (see FIG. 26A).

The insulator 350 and the insulator 351 function as a gate insulator (also referred to as a "first gate insulator"). The insulator 324 and the insulator 322 function as a back gate insulator (also referred to as a "second gate insulator"). The conductor 342 and the conductor 344 function as a source electrode or a drain electrode.

A region of the oxide 330_1 that overlaps with the conductor 360 at least partly functions as a channel formation region. Similarly, a region of the oxide 330_2 that overlaps with the conductor 361 at least partly functions as a channel formation region.

As illustrated in FIG. 25, the oxide 330_1 includes a region 333c functioning as a channel formation region of the transistor and a region 333sd functioning as a source or a drain region. At least part of the region 333c overlaps with the conductor 360. In other words, the region 333c is provided between the conductor 342a and the conductor 342b. The region 333sd overlaps with the conductor 342. Note that FIG. 25 is an enlarged view of the transistor 112, and the oxide 330_2 included in the transistor 111 is similar to the oxide 330_1.

The region 333c functioning as the channel formation region has a smaller amount of oxygen vacancies or a lower impurity concentration than the region 333sd, i.e., is a high-resistance region with a low carrier concentration. The region 333sd functioning as the source or the drain region has a large amount of oxygen vacancies or a high concentration of impurities such as hydrogen, nitrogen, and a metal element, i.e., is a low-resistance region with a high carrier concentration. That is, the region 333sd has a higher carrier concentration and a lower resistance than the region 333c.

The carrier concentration in the region 333c functioning as the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration in the region 333c functioning as the channel formation region is not particularly limited and can be, for example, $1\times10^{-9}$ cm$^{-3}$.

A region having a carrier concentration lower than or equal to that of the region 333sd and higher than or equal to that of the region 333c may be formed between the region 333c and the region 333sd. That is, the region functions as a junction region between the region 333c and the region 333sd. The hydrogen concentration in the junction region is sometimes lower than or equal to that in the region 333sd and higher than or equal to that in the region 333c. The amount of oxygen vacancies in the junction region is sometimes smaller than or equal to that in the region 333sd and larger than or equal to that in the region 333c.

In the oxide 330, the boundaries between the regions are difficult to clearly observe in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

The region 333c is formed in each of the transistors 112, and the conductor 342a and the region 333sd overlapping with the conductor 342a are shared by two adjacent transistors 112. For example, the conductor 342a functions as one of a source electrode and a drain electrode of the transistor 112[i] and also as the other of the source electrode and the drain electrode of the transistor 112[i−1]. For example, the conductor 342b functions as the other of the source electrode and the drain electrode of the transistor 112[i] and also as one of the source electrode and the drain electrode of the transistor 112[i+1].

The region 333sd overlapping with the conductor 342a functions as one of the source and the drain of the transistor 112[i] and also as the other of the source and the drain of the transistor 112[i+1]. The source and the drain of each transistor 112 are thus connected in series. Note that the source and the drain of each transistor 111 as well as each transistor 112 are connected in series.

When the source and the drain are shared by adjacent transistors, the area occupied by the memory device 100 can be reduced. Accordingly, the storage capacity per unit area can be increased.

A metal oxide functioning as a semiconductor (hereinafter, such a metal oxide is also referred to as an oxide semiconductor) is preferably used for the oxide 330 including the channel formation region. The metal oxide functioning as a semiconductor preferably has a band gap of 2 eV or more, preferably 2.5 eV or more. The use of such a metal oxide having a wide band gap can reduce the off-state current of the transistor.

A reduction in the off-state current of the transistor 111 can significantly reduce the leakage current between the wiring RBL and the wiring SL. This enables the power consumption of the memory device to be reduced considerably. In addition, a reduction in the off-state current of the transistor 112 allows data to be retained in the memory element 110 for an extremely long time.

For example, as the oxide 330_1 and the oxide 330_2, a metal oxide such as an In-M-Zn oxide containing indium, an element M, and zinc is used; the element M is one or more selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, cobalt, magnesium, and the like. For example, an In—Ga—Zn oxide may be used as the oxide 330, and an oxide obtained by adding tin to an In—Ga—Zn oxide (In—Ga—Zn—Sn oxide) may be used. Alternatively, an In—Ga oxide, an In—Zn oxide, or indium oxide may be used as the oxide 330_1 and the oxide 330_2.

The metal oxide can be deposited on a substrate by a sputtering method or the like. Hence, a memory cell array can be provided over a peripheral circuit such as a driver circuit formed on a silicon substrate. This reduces the area occupied by the peripheral circuit in one chip and increases the area occupied by the memory cell array, resulting in an increase in the storage capacity of a semiconductor device. Furthermore, when a plurality of metal oxide films are stacked, a stack of memory cell arrays can be obtained. As a result, the integration of cells is achieved without an increase in the area occupied by the memory cell array, that is, a 3D cell array can be configured. A high integration of memory cells is thus possible and a semiconductor device with large storage capacity can be provided.

Here, the atomic ratio of In to the element M in the metal oxide used as the oxide 330b is preferably greater than that in the metal oxide used as the oxide 330a.

When the oxide 330a is provided under the oxide 330b in the above manner, impurities and oxygen can be inhibited from diffusing into the oxide 330b from the components formed below the oxide 330a.

The density of defect states at the interface between the oxide 330a and the oxide 330b can be made low when the oxide 330a and the oxide 330b contain a common constituent element (element serving as a main component) besides oxygen; hence, the influence of interface scattering on carrier conduction can be small and a high on-state current can be obtained.

The oxide 330a and the oxide 330b preferably have crystallinity. In particular, for the oxide 330b_1 (oxide 330b_2), a c-axis-aligned crystalline oxide semiconductor (CAAC-OS) is preferably used.

The CAAC-OS is a metal oxide having a dense structure with high crystallinity and a small amount of impurities or defects (oxygen vacancies (Vo) or the like). In particular, after the formation of a metal oxide, heat treatment is performed at a temperature at which the metal oxide does not become a polycrystal (e.g., 400° C. to 600° C.), whereby a CAAC-OS having a dense structure with higher crystallinity can be obtained. As the density of the CAAC-OS is increased in such a manner, diffusion of impurities or oxygen in the CAAC-OS can be further reduced.

In the CAAC-OS, a reduction in electron mobility due to a grain boundary is less likely to occur because it is difficult to observe a clear grain boundary. Thus, a metal oxide including the CAAC-OS is physically stable. Accordingly, the metal oxide including the CAAC-OS is resistant to heat and has high reliability.

If impurities and oxygen vacancies exist in a channel formation region of an oxide semiconductor, a transistor including the oxide semiconductor might have variable electrical characteristics and poor reliability. In addition, hydrogen in the vicinity of the oxygen vacancies enters the oxygen vacancies to form a defect (hereinafter, also referred to as VoH), so that an electron serving as a carrier might be generated even when no voltage is applied to a gate electrode of the transistor. Therefore, when the channel formation region in the oxide semiconductor includes oxygen vacancies, the transistor tends to have normally-on characteristics (the channel is generated even when no voltage is applied to the gate electrode and current flows through the transistor). Thus, impurities, oxygen vacancies, and VoH are preferably reduced as much as possible in the channel formation region in the oxide semiconductor. In other words, when no voltage is applied to the gate electrode of the transistor, the channel formation region in the oxide semiconductor preferably has a reduced carrier concentration to be an i-type (intrinsic) or substantially i-type region.

In contrast, when an insulator containing oxygen that is released by heating (hereinafter, also referred to as excess oxygen) is provided in the vicinity of the oxide semiconductor and heat treatment is performed, oxygen can be supplied from the insulator to the oxide semiconductor so as to reduce oxygen vacancies and VoH. Note that too much oxygen supplied to the source region or the drain region might decrease the on-state current or the field-effect mobility of the transistor. Furthermore, a variation in the amount of oxygen supplied to the source region or the drain region on the substrate plane leads to variable characteristics of the semiconductor device including the transistor.

Hence, the region 333c functioning as the channel formation region in the oxide semiconductor is preferably an i-type or substantially i-type region with a low carrier concentration, whereas the region 333sd functioning as the source or the drain region is preferably an n-type region with a high carrier concentration. That is, it is preferable that in the oxide semiconductor, oxygen vacancies and VoH in the region 333c be reduced and supply of too much oxygen to the region 333sd be prevented.

For example, in the fabrication of the transistor 112, an opening is formed in part of the insulator 380 and the insulator 375 to expose part of the oxide 330b_1, and microwave treatment is performed in an oxygen-containing atmosphere, thereby reducing oxygen vacancies and VoH in the region 333c. Here, the microwave treatment refers to, for example, treatment using an apparatus including a power source that generates high-density plasma with the use of a microwave. Note that the microwave treatment may be performed after the insulator 350 is formed.

The microwave treatment in an oxygen-containing atmosphere converts oxygen gas into plasma using a microwave or a high-frequency wave such as RF and activates the oxygen plasma. At this time, the region 333c can be irradiated with the microwave or the high-frequency wave such as RF. The effect of the plasma, the microwave, and the like enables VoH in the region 333c to be cut off, hydrogen H to be removed from the region 333c, and oxygen vacancies Vo to be compensated with oxygen. That is, the reaction "VoH→H+Vo" occurs in the region 333c, so that the hydrogen concentration in the region 333c can be reduced. As a result, oxygen vacancies and VoH in the region 333c can be reduced to lower the carrier concentration.

In the microwave treatment in an oxygen-containing atmosphere, the effect of the microwave, the high-frequency wave such as RF, the oxygen plasma, and the like is blocked by the conductor 342a and the conductor 342b and does not reach the region 333sd. Furthermore, the effect of the oxygen plasma can be reduced by the insulator 375 and the insulator 380. Thus, the region 333sd does not undergo a reduction in VoH and not receive excessive oxygen in the microwave treatment, so that a decrease in the carrier concentration in the region 333sd can be prevented.

In the above manner, oxygen vacancies and VoH can be selectively removed from the region 333c in the oxide semiconductor, whereby the region 333c can be an i-type or substantially i-type region. Furthermore, supply of too much oxygen to the region 333sd functioning as the source or the drain region can be inhibited and the n-type region can be maintained. Accordingly, a variation in the electrical characteristics of the transistor 112 can be reduced to inhibit variations in the electrical characteristics of the transistor 112 on the substrate plane.

The microwave treatment can be performed when the transistor 111 as well as the transistor 112 is formed.

With the transistor 111 and the transistor 112 having the above structures, the semiconductor device with a small variation in transistor characteristics can be provided. In addition, a semiconductor device having favorable electrical characteristics can be provided. A highly reliable semiconductor device can also be provided.

In FIG. 23B and the like, a side surface of the opening in which the conductor 360 and the like are embedded, and/or a side surface of the opening in which the conductor 361 and the like are embedded, are substantially perpendicular to a surface on which the oxide 330b is formed; however, this embodiment is not limited thereto. For example, the opening may have a U-shape with a bottom having a gentle curve. For example, the side surface of the opening may be tilted with respect to the surface on which the oxide 330b is formed.

As illustrated in FIG. 24A, a curved surface may be provided between the side and top surfaces of the oxide 330b_1 in a cross-sectional view in the channel width direction of the transistor 112. In other words, the end portion of the side surface and the end portion of the top surface may be curved (rounded). Similarly, as illustrated in FIG. 24B, a curved surface may be provided between the side and top surfaces of the oxide 330b_2 in a cross-sectional view in the channel width direction of the transistor 111.

The radius of curvature of the curved surface is preferably greater than 0 nm and less than the thickness of the oxide 330b_1 (or the oxide 330b_2) in a region overlapping with the conductor 342 (or the conductor 344), or less than half of the length of a region of the top surface of the oxide 330b_1 (or the oxide 330b_2) that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 330b_1 (or the oxide 330b_2) with the insulator 350 (or the insulator 351) and the conductor 360 (or the conductor 361).

The oxide 330 preferably has a stacked-layer structure of oxide layers with different chemical compositions. Specifically, the atomic ratio of the element M to a metal element that is the main component in the metal oxide used as the oxide 330a is preferably higher than that in the metal oxide used as the oxide 330b. Moreover, the atomic ratio of the element M to In in the metal oxide used as the oxide 330a is preferably greater than that in the metal oxide used as the oxide 330b. Moreover, the atomic ratio of In to the element M in the metal oxide used as the oxide 330b is preferably greater than that in the metal oxide used as the oxide 330a.

The oxide 330b is preferably an oxide having crystallinity, such as a CAAC-OS. An oxide having crystallinity, such as a CAAC-OS, has a dense structure with small amounts of impurities and defects (e.g., oxygen vacancies) and high crystallinity. Accordingly, extraction of oxygen from the oxide 330b by the source electrode or the drain electrode can be suppressed. This inhibits extraction of oxygen from the oxide 330b even when heat treatment is performed; hence, the OS transistor is stable under high temperatures in the manufacturing process (i.e., thermal budget).

Here, the conduction band minimum is gradually varied at a junction portion of the oxide 330a and the oxide 330b. In other words, the conduction band minimum at the junction portion of the oxide 330a and the oxide 330b is continuously varied or continuously connected. To achieve this, the density of defect states in a mixed layer formed at the interface between the oxide 330a and the oxide 330b is decreased.

Specifically, when the oxide 330a and the oxide 330b contain the same element as a main component in addition to oxygen, a mixed layer with a low density of defect states can be formed. For example, in the case where the oxide 330b is an In-M-Zn oxide, an In-M-Zn oxide, a M-Zn oxide, an oxide of the element M, an In—Zn oxide, or indium oxide may be used as the oxide 330a.

For example, as the oxide 330a, a metal oxide having an atomic ratio of In:M:Zn=1:3:4 or in the vicinity thereof, or In:M:Zn=1:1:0.5 or in the vicinity thereof may be used. As the oxide 330b, a metal oxide having an atomic ratio of In:M:Zn=1:1:1 or in the vicinity thereof, or In:M:Zn=4:2:3 or in the vicinity thereof may be used. Note that the vicinity of the atomic ratio includes ±30% of an intended atomic ratio. Gallium is preferably used as the element M.

When the metal oxide is deposited by a sputtering method, the aforementioned atomic ratio is not limited to the atomic ratio of the deposited metal oxide and may be the atomic ratio of a sputtering target used for depositing the metal oxide.

The density of defect states at the interface between the oxide 330a and the oxide 330b can be made low when the oxide 330a and the oxide 330b have the aforementioned composition. Thus, the influence of interface scattering on carrier conduction can be small and the OS transistor can have a high field-effect mobility, a high on-state current, and high frequency characteristics. The use of such a transistor as the transistor 111 can increase the writing speed. The use of such a transistor as the transistor 112 can increase the reading speed.

At least one of the insulators 312, 314, 385, and 378 preferably functions as a barrier insulating film that inhibits diffusion of impurities such as water and hydrogen into the transistor 111, the transistor 112, and the like from the substrate side or from above the transistor 111. Therefore, at least one of the insulators 312, 314, 385, and 378 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom. Alternatively, it is preferable to use an insulating material having a function of inhibiting diffusion of oxygen (e.g., at least one of oxygen atoms, oxygen molecules, and the like), that is, an insulating material through which the above oxygen is less likely to pass. An insulating material having a function of inhibiting diffusion of impurities may be used for the insulator 375 and/or the insulator 335. An insulating material having a function of inhibiting diffusion of oxygen may be used for the insulator 375 and/or the insulator 335.

Note that in this specification, a barrier insulating film refers to an insulating film having a barrier property. In this specification, a barrier property means a function of inhibiting diffusion of a particular substance (or low permeability) or a function of capturing or fixing (also referred to as gettering) a particular substance.

Aluminum oxide, hafnium oxide, gallium oxide, indium gallium zinc oxide, silicon nitride, silicon nitride oxide, or the like can be used for the insulators 312, 314, 385, 378, 375, and 335. For example, silicon nitride, which has a high hydrogen barrier property, is preferably used for the insulators 312 and 378. For example, aluminum oxide, which has a function of capturing or fixing more hydrogen, is preferably used for the insulators 314, 375, 335, and 385. Accordingly, impurities such as water and hydrogen can be inhibited from diffusing to the transistor 111 side and the transistor 112 side from the substrate side through the insulators 312 and 314. Further, impurities such as water and hydrogen can be inhibited from diffusing to the transistor 111 side and the transistor 112 side from an interlayer insulating film and the like positioned outside the insulator 378. In addition, oxygen contained in the insulator 324 and the like can be inhibited from diffusing to the substrate side through the insulators 312 and 314. Further, oxygen contained in the insulators 380, 384, and the like can be inhibited from diffusing over the transistor 111 through the insulator 378 and the like. In this manner, the transistors 111, 112, and the like are preferably surrounded by the insulators 312, 314, 385, and 378 having a function of inhibiting diffusion of oxygen and impurities such as water and hydrogen.

The insulators 312, 314, 385, 378, 375, and 335 can be deposited by a sputtering method, for example. Since the sputtering method does not need to use hydrogen as a deposition gas, the hydrogen concentration in the insulators 312, 314, 385, 378, 375, and 335 can be reduced. Note that the deposition method is not limited to the sputtering method, and a chemical vapor deposition (CVD) method, a molecular beam epitaxy (MBE) method, a pulsed laser deposition (PLD) method, an atomic layer deposition (ALD) method, or the like can be used as appropriate.

The resistivity of the insulators 312 and 378 is preferably low in some cases. For example, the insulators 312 and 378 with a resistivity of approximately $1\times10^{13}$ Ωcm can sometimes relieve charge buildup of the conductor 305, the conductor 342, the conductor 360, the conductor 344, or the conductor 361 in the treatment using plasma or the like in the manufacturing process of a semiconductor device. The resistivity of the insulators 312 and 378 is preferably higher than or equal to $1\times10^{10}$ Ωcm and lower than or equal to $1\times10^{15}$ Ωcm.

The insulators 316, 380, and 384 preferably have a lower dielectric constant than the insulator 314. The use of a material having a low dielectric constant for the interlayer film can reduce the parasitic capacitance between wirings. For example, for the insulators 316, 380, and 384, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate. Silicon oxide, silicon oxynitride, and porous silicon oxide are particularly preferable because a region containing oxygen that is released by heating can be easily formed in these materials.

Note that in this specification, "oxynitride" in a material name means that the oxygen content is higher than the nitrogen content in the material, and "nitride oxide" in a material name means that the nitrogen content is higher than the oxygen content in the material.

The conductor 305 includes the conductor 305a, the conductor 305b, and the conductor 305c. The conductor 305a is provided in contact with a bottom surface and a side wall of an opening. The conductor 305b is provided so as to be embedded in a recessed portion formed in the conductor 305a. Here, the level of a top surface of the conductor 305b is lower than the levels of top surfaces of the conductor 305a and the insulator 316. The conductor 305c is provided in contact with the top surface of the conductor 305b and a side surface of the conductor 305a. Here, a top surface of the conductor 305c is substantially level with the top surfaces of the conductor 305a and the insulator 316. That is, the conductor 305b is surrounded by the conductor 305a and the conductor 305c.

The conductors 305a and 305c are preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, or $NO_2$), and a copper atom. Alternatively, the conductors 305a and 305c are preferably formed using a conductive material having a function of inhibiting diffusion of oxygen (e.g., at least one of oxygen atoms and oxygen molecules).

When the conductors 305a and 305c are formed using a conductive material having a function of inhibiting diffusion of hydrogen, impurities such as hydrogen contained in the conductor 305b can be prevented from diffusing into the oxide 330 through the insulator 324 and the like. When the conductors 305a and 305c are formed using a conductive material having a function of inhibiting diffusion of oxygen, the conductivity of the conductor 305b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 305a may be a single layer or a stacked layer of the above conductive materials. For example, titanium nitride may be used for the conductor 305a.

Furthermore, the conductor 305b is preferably formed using a conductive material containing tungsten, copper, or aluminum as its main component. For example, tungsten may be used for the conductor 305b.

The conductor 305 functions as a back gate electrode in some cases. In that case, by changing a potential applied to the conductor 305 independently of a potential applied to the conductor 360, the threshold voltage (Vth) of the transistor 112 can be controlled. When a negative potential is applied to the conductor 305, Vth of the transistor 112 can be increased and the off-state current can be reduced. Thus, a drain current when a potential applied to the conductor 360 is 0 V can be smaller in the case where a negative potential is applied to the conductor 305 than in the case where the negative potential is not applied to the conductor 305.

The electric resistivity of the conductor 305 is designed in consideration of the potential applied to the conductor 305, and the thickness of the conductor 305 is determined in accordance with the electric resistivity. The thickness of the insulator 316 is substantially equal to that of the conductor 305. The conductor 305 and the insulator 316 are preferably as thin as possible in the allowable range of the design of the conductor 305. The insulator 316 with a reduced thickness contains a smaller absolute amount of impurity such as hydrogen, inhibiting the diffusion of the impurity into the oxide 330.

The conductor 305 is provided so as to overlap with a region of the oxide 330_1 that does not overlap with the conductor 342a and the conductor 342b. The conductor 305 is preferably provided larger than the region. In other words, the conductor 305 is preferably provided overlapping with and larger than the region 333c described later. In particular, as illustrated in FIG. 24A, the conductor 305 preferably extends beyond an end portion of the oxide 330_1 that intersects with the channel width direction. That is, the conductor 305 and the conductor 360 preferably overlap with each other with the insulator positioned therebetween, in a region beyond the side surface of the oxide 330_1 in the channel width direction. With this structure, the channel formation region in the oxide 330_1 can be electrically surrounded by electric fields of the conductor 360 functioning as the gate electrode (also referred to as the "first gate electrode") and electric fields of the conductor 305 functioning as the back gate electrode (also referred to as the "second gate electrode"). In this specification, a transistor structure in which the channel formation region is electrically surrounded by the electric fields of the first gate electrode and the second gate electrode is referred to as a surrounded channel (S-channel) structure.

In this specification and the like, the S-channel structure refers to a transistor structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

As illustrated in FIG. 24A, the conductor 305 is extended in the channel width direction to have a function of a wiring. However, without limitation to this structure, a conductor functioning as a wiring may be provided under the conductor 305.

Although the conductor 305a, the conductor 305b, and the conductor 305c are stacked in the transistor 112, the present invention is not limited to this structure. For example, the conductor 305 may have a single-layer structure, a two-layer structure, or a stacked-layer structure of four or more layers.

The insulator 322 preferably has a function of inhibiting diffusion of hydrogen (e.g., at least one of hydrogen atoms, hydrogen molecules, and the like). The insulator 322 also preferably has a function of inhibiting diffusion of oxygen (e.g., at least one of oxygen atoms and oxygen molecules). For example, the insulator 322 preferably has a function of inhibiting diffusion of much hydrogen and/or oxygen compared to the insulator 324.

As the insulator 322, an insulator containing an oxide of aluminum and/or hafnium, which is an insulating material, is preferably used. As the insulator, aluminum oxide, hafnium oxide, an oxide containing aluminum and hafnium (hafnium aluminate), or the like is preferably used. The insulator 322 formed of such a material functions as a layer that inhibits release of oxygen from the oxide 330 to the substrate side and diffusion of impurities such as hydrogen from the periphery of the transistor 112 into the oxide 330. Thus, providing the insulator 322 can inhibit diffusion of impurities such as hydrogen into the transistor 112 and inhibit generation of oxygen vacancies in the oxide 330. Moreover, the conductor 305 can be prevented from reacting with oxygen in the insulator 324 or the oxide 330.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. The insulator 322 may have a stacked-layer structure including silicon oxide, silicon oxynitride, or silicon nitride over any of these insulators.

The insulator 322 may have a single-layer structure or a stacked-layer structure using an insulator containing a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST). As miniaturization and high integration of transistors progress, a problem such as leakage current may arise because of a thinner gate insulator. When a high-k material is used for an insulator functioning as the gate insulator, a gate potential at the time when the transistor operates can be reduced while the physical thickness of the gate insulator is maintained.

The insulator 324 in contact with the oxide 330_1 preferably contains excess oxygen (releases oxygen by heating). For example, silicon oxide or silicon oxynitride can be used as appropriate for the insulator 324. When such an insulator containing oxygen is provided in contact with the oxide 330_1, oxygen vacancies in the oxide 330_1 can be reduced, leading to an improvement in the reliability of the transistor.

Specifically, an oxide material that releases part of oxygen by heating, namely, an insulator material including an excess oxygen region, is preferably used for the insulator 324. An oxide film that releases oxygen by heating is an oxide film in which the amount of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 400° C.

In a manufacturing process of the transistor, the heat treatment is preferably performed with the surface of the oxide 330 exposed. For example, the heat treatment is performed at a temperature higher than or equal to 100° C. and lower than or equal to 600° C., preferably higher than or equal to 350° C. and lower than or equal to 550° C. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 330 to reduce oxygen vacancies (Vo). The heat treatment may be performed under a reduced pressure. Alternatively, the heat treatment may be performed in such a manner that heat treatment is performed in a nitrogen gas atmosphere or an inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas atmosphere or an inert gas atmosphere.

Note that the oxygen adding treatment performed on the oxide 330 can promote a reaction in which oxygen vacancies in the oxide 330 are filled with supplied oxygen, i.e., a reaction of Vo+O→null. Furthermore, hydrogen remaining in the oxide 330 reacts with supplied oxygen, so that the hydrogen can be removed as $H_2O$ (dehydrogenation). This can inhibit recombination of hydrogen remaining in the oxide 330 with oxygen vacancies and formation of VoH.

Note that the insulators 322 and 324 may each have a stacked-layer structure of two or more layers. In that case, the stacked layers are not necessarily formed of the same material and may be formed of different materials. The insulator 324 may be formed into an island shape overlapping with the oxide 330a. In that case, the insulator 375 is in contact with a side surface of the insulator 324 and a top surface of the insulator 322.

The oxide 343 is provided over the oxide 330b_1. Note that the oxide 343 is preferably provided to overlap with the conductor 342 and may be linearly arranged on the oxide 330_1. Similarly, the oxide 345 is provided over the oxide 330b_2. Note that the oxide 345 is preferably provided to overlap with the conductor 344 and may be linearly arranged on the oxide 330_2.

The oxide 343 and the oxide 345 preferably have a function of inhibiting oxygen transmission. The oxide 343, which has a function of inhibiting oxygen transmission, is preferably provided between the conductor 342 and the oxide 330b_1, in which case the electrical resistance between the conductor 342 and the oxide 330b_1 can be reduced. Similarly, the oxide 345, which has a function of inhibiting oxygen transmission, is preferably provided between the conductor 344 and the oxide 330b_2, in which case the electrical resistance between the conductor 344 and the oxide 330b_2 can be reduced.

Such a structure improves the electrical characteristics and reliability of the transistor 111 and the transistor 112. In the case where the electrical resistance between the conductor 342 and the oxide 330b_1 can be sufficiently reduced, the oxide 343 is not necessarily provided. In the case where the electrical resistance between the conductor 344 and the oxide 330b_2 can be sufficiently reduced, the oxide 345 is not necessarily provided.

A metal oxide containing the element M may be used as the oxides 343 and 345. In particular, aluminum, gallium, yttrium, or tin is preferably used as the element M. The concentration of the element M in the oxides 343 and 345 is preferably higher than that in the oxide 330b. Alternatively, gallium oxide may be used as the oxides 343 and 345. A metal oxide such as an In-M-Zn oxide may be used as the oxides 343 and 345. Specifically, the atomic ratio of the element M to In in the metal oxide used as the oxides 343 and 345 is preferably higher than that in the metal oxide used as the oxide 330b. The thickness of each of the oxides 343 and 345 preferably ranges from 0.5 nm to 5 nm, further preferably from 1 nm to 3 nm, and still further preferably from 1 nm to 2 nm. The oxides 343 and 345 preferably have crystallinity. The oxides 343 and 345 with crystallinity efficiently inhibits release of oxygen from the oxide 330. When the oxides 343 and 345 have a hexagonal crystal structure, for example, release of oxygen from the oxide 330 can sometimes be inhibited.

For the conductors 342 and 344, for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, oxide containing strontium and ruthenium, or an oxide containing lanthanum and nickel may be used. These materials are preferable because they are a conductive material that is not easily oxidized or a material that maintains the conductivity even when absorbing oxygen.

Note that hydrogen contained in the oxide 330b or the like diffuses into the conductor 342 or 344 in some cases. In particular, when a nitride containing tantalum is used for the conductors 342 and 344, hydrogen contained in the oxide 330b or the like is likely to diffuse into the conductor 342 or 344, and the diffused hydrogen is bonded to nitrogen contained in the conductor 342 or 344 in some cases. That is, hydrogen contained in the oxide 330b or the like is sometimes absorbed by the conductor 342 or 344 in some cases.

No curved surface is preferably formed between the side surface and the top surface of the conductor 342 and between the side surface and the top surface of the conductor 344. Without the curved surface, the conductor 344 can have a large cross-sectional area in the channel width direction as illustrated in FIG. 24A. Accordingly, the resistance of the conductor 344 can be decreased, which increases the on-state current of the transistor 111. Similarly, the cross-sectional area of the conductor 342 in the channel width direction can be increased as illustrated in FIG. 24B, resulting in a decrease in the resistance of the conductor 342 and an increase in the on-state current of the transistor 112.

The insulator 375 is provided to cover the insulator 324, the oxide 330_1, the oxide 343, and the conductor 342, and an opening is formed in a region where the insulator 350, the conductor 360, and the like are provided. The insulator 375 is preferably provided in contact with the top surface of the insulator 324, the side surface of the oxide 330_1, the side surface of the oxide 343, the side surface of the conductor 342, and the top surface of the conductor 342 (see FIG. 24B). The insulator 375 preferably functions as a barrier insulating film for inhibiting transmission of oxygen. The insulator 375 also preferably functions as a barrier insulating film for inhibiting diffusion of impurities such as water and hydrogen into the oxide 330_1 or the insulator 324 from the above. In addition, the insulator 375 preferably has a function of capturing impurities such as hydrogen.

The insulator 335 is provided to cover the insulator 380, the oxide 330_2, the oxide 345, and the conductor 344, and an opening is formed in a region where the insulator 351, the conductor 361, and the like are provided. The insulator 335 is preferably provided in contact with the top surface of the insulator 380, the side surface of the oxide 330_2, the side surface of the oxide 345, the side surface of the conductor 344, and the top surface of the conductor 344 (see FIG. 24A). The insulator 335 preferably functions as a barrier insulating film for inhibiting transmission of oxygen. The insulator 335 also preferably functions as a barrier insulating film for inhibiting diffusion of impurities such as water and hydrogen into the oxide 330_2 or the insulator 380 from the above. In addition, the insulator 335 preferably has a function of capturing impurities such as hydrogen.

The insulators 375 and 335 may be formed using an insulator such as aluminum oxide or silicon nitride.

When the above insulators 375 and 335 are provided, the conductors 342 and 344 can be surrounded by the insulators having a barrier property against oxygen. That is, oxygen contained in the insulator 380 can be prevented from diffusing into the conductors 342 and 344. As a result, the conductor 342 can be inhibited from being directly oxidized by oxygen or the like contained in the insulator 380, so that an increase in resistivity and a reduction in field-effect mobility and on-state current can be inhibited. It is also possible to inhibit the conductor 344 from being directly oxidized by oxygen or the like contained in the insulator 384, so that an increase in resistivity and a reduction in field-effect mobility and on-state current can be inhibited. Thus, the field-effect mobility and on-state current of the transistor 111 can be increased to increase the writing speed of the memory device 100. In addition, the field-effect mobility and on-state current of the transistor 112 can be increased to increase the reading speed of the memory device 100.

The insulator 375, which has a function of capturing impurities such as hydrogen, is provided in contact with the insulator 380 in a region interposed between the insulator 312 and the insulator 378, whereby impurities such as hydrogen contained in the insulator 380 and the like can be captured and the amount of hydrogen in the region can be kept constant. Furthermore, the insulator 335 having a function of capturing impurities such as hydrogen is provided in contact with the insulator 384, whereby impurities such as hydrogen contained in the insulator 384 and the like can be captured and the amount of hydrogen in the region can be kept constant. In that case, aluminum oxide or the like is preferably used for the insulator 375 and the insulator 335.

The insulators 350 and 351 functioning as gate insulators are preferably placed on and in contact with the oxide 330b. The insulators 350 and 351 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. Silicon oxide and silicon oxynitride, which have thermal stability, are particularly preferable.

As in the insulator 324, the concentration of impurities such as water and hydrogen in the insulators 350 and 351 is preferably lowered. The thickness of each of the insulators 350 and 351 is preferably greater than or equal to 1 nm and less than or equal to 20 nm.

A metal oxide may be provided between the insulator 350 and the conductor 360. The metal oxide preferably inhibits oxygen diffusion from the insulator 350 into the conductor 360. When the metal oxide that inhibits oxygen diffusion is provided, diffusion of oxygen from the insulator 350 into the conductor 360 can be inhibited, that is, a reduction in the amount of oxygen supplied to the oxide 330 can be inhibited. Moreover, oxidation of the conductor 360 due to oxygen in the insulator 350 can be inhibited. Similarly, a metal oxide may be provided between the insulator 351 and the conductor 361. For example, hafnium oxide can be used as the metal oxide.

Note that the metal oxide may function as part of the first gate electrode. For example, a metal oxide that can be used as the oxide 330 can be used as the metal oxide. In that case, when the conductor 360a and/or the conductor 361a is formed by a sputtering method, the metal oxide can have a reduced electrical resistance and become a conductor. Such a conductor can be referred to as an oxide conductor (OC) electrode.

With the metal oxide, the on-state current of the transistor 112 can be increased without a reduction in the influence of the electric field applied from the conductor 360. Since the distance between the conductor 360 and the oxide 330 is kept by the physical thicknesses of the insulator 350 and the metal oxide, leakage current between the conductor 360 and the oxide 330 can be reduced. Moreover, with the stacked-layer structure of the insulator 350 and the metal oxide, the physical distance between the conductor 360 and the oxide 330 and the intensity of electric fields applied from the conductor 360 to the oxide 330 can be easily adjusted as appropriate. The same applies to the insulator 351 and the conductor 361.

The conductor 360 preferably includes the conductor 360a and the conductor 360b over the conductor 360a. The conductor 361 preferably includes the conductor 361a and the conductor 361b over the conductor 361a. For example, the conductor 360a is preferably positioned so as to overlap with the bottom and side surfaces of the conductor 360b. The conductor 361a is preferably positioned so as to overlap with the bottom and side surfaces of the conductor 361b.

In this embodiment and the like, the conductor 360 has a two-layer structure of the conductor 360a and the conductor 360b and the conductor 361 has a two-layer structure of the conductor 361a and the conductor 361b; however, the conductor 360 and the conductor 361 may each have a single-layer structure or a stacked-layer structure of three or more layers.

The conductors 360a and 361a are preferably formed using a conductive material having a function of inhibiting diffusion of impurities such as a hydrogen atom, a hydrogen molecule, a water molecule, a nitrogen atom, a nitrogen molecule, a nitrogen oxide molecule, and a copper atom. Alternatively, the conductors 360a and 361a are preferably formed using a conductive material having a function of inhibiting diffusion of oxygen (e.g., at least one of oxygen atoms and oxygen molecules).

When the conductor 360a has a function of inhibiting diffusion of oxygen, the conductivity of the conductor 360b can be prevented from being lowered because of oxidization of the conductor 360b due to oxygen in the insulator 350. When the conductor 361a has a function of inhibiting diffusion of oxygen, the conductivity of the conductor 361b can be prevented from being lowered because of oxidization of the conductor 361b due to oxygen in the insulator 351. As the conductive material having a function of inhibiting diffusion of oxygen, for example, titanium, titanium nitride, tantalum, tantalum nitride, ruthenium, or ruthenium oxide is preferably used.

The conductors 360 and 361 also function as a wiring and thus are preferably a conductor having high conductivity. For example, a conductive material containing tungsten, copper, or aluminum as its main component can be used for the conductors 360b and 361b. The conductors 360b and 361b may each have a stacked-layer structure, for example, a stacked-layer structure of titanium or titanium nitride and the above conductive material.

In the transistor 112, the conductor 360 is formed in a self-aligned manner so as to fill an opening formed in the insulator 380 and the like. In the transistor 111, the conductor 361 is formed in a self-aligned manner so as to fill an opening formed in the insulator 384 and the like. In this manner, the conductor 360 can be arranged in a region between the conductor 342a and the conductor 342b without alignment. The same applies to the conductor 361.

As illustrated in FIG. 24A, in the channel width direction of the transistor 112, the bottom surface of the conductor 360 in a region where the conductor 360 and the oxide 330b do not overlap with each other is preferably lower in level than the bottom surface of the oxide 330b. When the conductor 360 functioning as the gate electrode covers the side and top surfaces of the channel formation region in the oxide 330b_1 with the insulator 350 and the like therebetween, the electric field of the conductor 360 is likely to affect the entire channel formation region in the oxide 330b_1. Hence, the transistor 112 can have a higher on-state current and higher frequency characteristics. In a region where the oxide 330_1 and the conductor 360 do not overlap with each other, the difference between the height from the bottom surface of the insulator 322 to the bottom surface of the conductor 360 and the height from the bottom surface of the insulator 322 to the bottom surface of the oxide 330b_1 is greater than or equal to 0 nm and less than or equal to 100 nm, preferably greater than or equal to 3 nm and less than or equal to 50 nm, and further preferably greater than or equal to 5 nm and less than or equal to 20 nm.

The insulator 380 is provided over the insulator 375, and an opening is formed in a region where the insulator 350 and the conductor 360 are provided. The insulator 384 is provided over the insulator 335, and an opening is formed in a region where the insulator 351 and the conductor 361 are provided. The top surfaces of the insulators 380 and 384 may be planarized.

Like the insulator 324, the insulators 380 and 384 preferably include an excess-oxygen region or excess oxygen. The concentration of impurities such as water and hydrogen in the insulators 380 and 384 is preferably reduced. For example, an oxide containing silicon such as silicon oxide or silicon oxynitride can be used for the insulators 380 and 384, as appropriate. When such an insulator containing excess oxygen is provided in the vicinity of the oxide 330, oxygen vacancies in the oxide 330 can be reduced, leading to an improvement in the reliability of the transistor.

The insulator 385 is provided in contact with the top surfaces of the conductor 361, the insulator 351, and the insulator 384. The insulator 385 preferably functions as a barrier insulating film that inhibits impurities such as water and hydrogen from diffusing into the insulator 384 from the above and also has a function of capturing impurities such as hydrogen. The insulator 385 also preferably functions as a barrier insulating film for inhibiting transmission of oxygen. As the insulator 385, for example, an insulator such as aluminum oxide can be used. The insulator 385, which has a function of capturing impurities such as hydrogen, is provided in contact with the insulator 384 in a region interposed between the insulator 312 and the insulator 378, whereby impurities such as hydrogen contained in the insulator 384 and the like can be captured and the amount of hydrogen in the region can be kept constant.

The insulator 378 functions as a barrier insulating film that inhibits impurities such as water and hydrogen from diffusing into the insulator 384 from the above. The insulator 378 is provided over the insulator 384. The insulator 378 is preferably formed using a nitride containing silicon such as silicon nitride or silicon nitride oxide. For example, silicon nitride deposited by a sputtering method may be used for the insulator 378. When the insulator 378 is formed by a sputtering method, a high-density silicon nitride film where a void is unlikely to be formed can be obtained. To obtain the insulator 378, silicon nitride deposited by a CVD method may be stacked over silicon nitride deposited by a sputtering method.

The transistor 131 and the transistor 132 can have a structure similar to that of the transistor 111 or the transistor 112. For example, in the case where the transistor 131 has a back gate, the transistor 131 may be provided with the conductor 305 (see FIG. 26B).

[Materials for Semiconductor Device]

Materials that can be used for the memory device 100 are described below.

[Substrate]

As a substrate where the memory device 100 is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon or germanium and a compound semiconductor substrate of silicon carbide, silicon germanium, gallium arsenide, indium phosphide, zinc oxide, or gallium oxide. Other examples include a semiconductor substrate in which an insulator region is provided in the above semiconductor substrate, e.g., a silicon on insulator (SOI) substrate. Examples of the conductor substrate include a graphite substrate, a metal substrate, an alloy substrate, and a conductive resin substrate. A substrate containing a nitride of a metal, a substrate including an oxide of a metal, or the like can also be used. An insulator substrate provided with a conductor or a semiconductor, a semiconductor substrate provided with a conductor or an insulator, a conductor substrate provided with a semiconductor or an insulator, or the like may be used. Alternatively, any of these substrates provided with an element may be used. Examples of the element provided over the substrate include a capacitor, a resistor, a switching element, a light-emitting element, and a memory element.

[Insulator]

Examples of an insulator include an insulating oxide, an insulating nitride, an insulating oxynitride, an insulating nitride oxide, an insulating metal oxide, an insulating metal oxynitride, and an insulating metal nitride oxide.

With miniaturization and high integration of a transistor, for example, a problem such as generation of leakage current may arise because of a thin gate insulator. When a high-k material is used for an insulator functioning as a gate insulator, the driving voltage of the transistor can be reduced while the physical thickness of the gate insulator is kept. By contrast, when a material having a low dielectric constant is used for an insulator functioning as an interlayer film, the parasitic capacitance between wirings can be reduced. Accordingly, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

A transistor including a metal oxide can have stable electrical characteristics when surrounded by an insulator having a function of inhibiting transmission of oxygen and impurities such as hydrogen. The insulator having a function of inhibiting transmission of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, silicon nitride oxide, or silicon nitride can be used.

The insulator functioning as a gate insulator preferably includes a region containing oxygen that is released by heating. For example, when silicon oxide or silicon oxynitride that includes a region containing oxygen released by heating is in contact with the oxide 330, oxygen vacancies in the oxide 330 can be compensated for.

[Conductor]

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, or an oxide containing lanthanum and nickel is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electric conductivity typified by polycrystalline silicon containing an impurity element such as phosphorus, or silicide such as nickel silicide may be used.

Conductive layers formed using any of the above materials may be stacked. For example, a stacked-layer structure combining a material containing any of the above metal elements and a conductive material containing oxygen may be used. Alternatively, a stacked-layer structure combining a material containing any of the above metal elements and a conductive material containing nitrogen may be used. Further alternatively, a stacked-layer structure combining a material containing any of the above metal elements, a conductive material containing oxygen, and a conductive material containing nitrogen may be used.

When an oxide is used for the channel formation region of the transistor, the conductor functioning as the gate electrode preferably has a stacked-layer structure combining a material containing any of the above metal elements and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide in which the channel is formed. A conductive material containing any of the above metal elements and nitrogen may also be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide in which the channel is formed can be captured in some cases. Alternatively, hydrogen entering from a surrounding insulator or the like can be captured in some cases.

[Metal Oxide]

As the oxide 330, a metal oxide functioning as a semiconductor (oxide semiconductor) is preferably used. A metal oxide that can be used as the oxide 330 of the present invention is described below.

The metal oxide preferably contains at least indium or zinc. In particular, indium and zinc are preferably contained. In addition, one or more selected from the materials described above as the element M may be contained. Here, the case where the metal oxide is an In-M-Zn oxide, which contains indium, the aforementioned element M, and zinc is considered.

Note that in this specification and the like, a metal oxide containing nitrogen is also referred to as a metal oxide in some cases. A metal oxide containing nitrogen may be referred to as a metal oxynitride.

[Classification of Crystal Structure]

First, the classification of crystal structures of an oxide semiconductor will be described with reference to FIG. 27A. FIG. 27A shows the classification of crystal structures of an oxide semiconductor, typically IGZO (a metal oxide containing In, Ga, and Zn).

As shown in FIG. 27A, an oxide semiconductor is roughly classified into "Amorphous", "Crystalline", and "Crystal". The term "Amorphous" includes a completely amorphous structure. The term "Crystalline" includes c-axis-aligned crystalline (CAAC), nanocrystalline (nc), and cloud-aligned composite (CAC) structures. Note that the term "Crystalline" excludes single crystal, poly crystal, and completely amorphous structures. The term "Crystal" includes single crystal and poly crystal structures.

Note that the structures in the thick frame in FIG. 27A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 27B shows an XRD spectrum, which is obtained by grazing-incidence XRD (GIXD) measurement, of a CAAC-IGZO film classified into "Crystalline". Note that a GIXD method is also called a thin film method or a Seemann-Bohlin method. The XRD spectrum that is shown in FIG. 27B and obtained by GIXD measurement is hereinafter simply referred to as an XRD spectrum. The CAAC-IGZO film in FIG. 27B has an atomic ratio of In:Ga:Zn=4:2:3 or a neighborhood thereof. The CAAC-IGZO film in FIG. 27B has a thickness of 500 nm.

As shown in FIG. 27B, a clear peak indicating crystallinity is observed in the XRD spectrum of the CAAC-IGZO film. Specifically, a peak indicating c-axis alignment is observed at around $2\theta=31°$ in the XRD spectrum of the CAAC-IGZO film. As shown in FIG. 27B, the peak at around $2\theta=31°$ is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 27C shows a diffraction pattern of the CAAC-IGZO film. FIG. 27C shows a diffraction pattern obtained by the NBED method in which an electron beam is incident in the direction parallel to the substrate. The CAAC-IGZO film in FIG. 27C has an atomic ratio of In:Ga:Zn=4:2:3 or a neighborhood thereof. In the nanobeam electron diffraction method, electron diffraction is performed with a probe diameter of 1 nm.

As shown in FIG. 27C, a plurality of spots indicating c-axis alignment are observed in the diffraction pattern of the CAAC-IGZO film.

[Structure of Oxide Semiconductor]

Oxide semiconductors might be classified in a manner different from the one in FIG. 27A when classified in terms of the crystal structure. For example, oxide semiconductors are classified into a single crystal oxide semiconductor and a non-single-crystal oxide semiconductor. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS will be described in detail.

[CAAC-OS]

The CAAC-OS is an oxide semiconductor including a plurality of crystal regions whose c-axes are aligned in a particular direction. Note that the particular direction is the thickness direction of a CAAC-OS film, the normal direction of the surface where the CAAC-OS film is formed, or the normal direction of the surface of the CAAC-OS film. The crystal region has a periodic atomic arrangement. When an atomic arrangement is regarded as a lattice arrangement, the crystal region refers to a region with a regular lattice arrangement. Moreover, in some cases, the CAAC-OS includes a region where a plurality of crystal regions are connected to each other in the a-b plane direction, and this region has distortion. Note that distortion refers to a portion where the direction of a lattice arrangement changes between a region with a regular lattice arrangement and another region with a regular lattice arrangement in the region where the plurality of crystal regions are connected to each other. That is, the CAAC-OS is an oxide semiconductor that has c-axis alignment and does not have clear alignment in the a-b plane direction.

Note that the plurality of crystal regions are each formed of one or more minute crystals (crystals each of which has a maximum diameter of less than 10 nm). The maximum diameter of a crystal region formed of one minute crystal is less than 10 nm. The size of a crystal region formed of a plurality of minute crystals may be approximately several tens of nanometers.

In an In-M-Zn oxide (an element M is one or more elements selected from aluminum, gallium, yttrium, tin, titanium, and the like), the CAAC-OS tends to have a layered crystal structure (also referred to as a layered structure) in which a layer containing indium (In) and oxygen (hereinafter, referred to as an In layer) and a layer containing the element M, zinc (Zn), and oxygen (hereinafter, referred to as an (M,Zn) layer) are stacked. Indium and the element M can be replaced with each other. Thus, the (M,Zn) layer contains indium in some cases. The In layer contains the element M in some cases, and contains Zn in other cases. The layered structure is observed as a lattice image in a high-resolution TEM image, for example.

For example, when the CAAC-OS film is subjected to structural analysis by out-of-plane XRD measurement with an XRD apparatus using $\theta/2\theta$ scanning, a peak indicating c-axis alignment is observed at or around $2\theta=31°$. Note that the position of the peak indicating c-axis alignment (the value of $2\theta$) sometimes changes with the kind, composition, and the like of a metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which a clear grain boundary is not observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor which has high crystallinity and in which a clear grain boundary is not observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Thus, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Thus, the orientation in the whole film is not observed. Accordingly, in some cases, the nc-OS cannot be distinguished from ana-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not observed. Furthermore, a halo pattern is shown in a selected-area electron diffraction pattern of the nc-OS film obtained by using an electron beam having a probe diameter larger than the diameter of a nanocrystal (e.g., larger than or equal to 50 nm). Meanwhile, in some cases, a plurality of spots in a ring-like region with a direct spot as the center are observed in an electron diffraction pattern (also referred to as nanobeam electron diffraction pattern) of the nc-OS film, which is obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 3 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

In addition, the CAC-OS has a composition in which materials are separated into a first region and a second region to form a mosaic pattern, and the first region is distributed in the film. This composition is hereinafter also referred to as a cloud-like composition. That is, the CAC-OS is a composite metal oxide having a composition in which the first region and the second region are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region in the CAC-OS in the In—Ga—Zn oxide has [Ga] higher than that in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

[Transistor Including Oxide Semiconductor]

Next, a transistor including the above oxide semiconductor is described.

When the oxide semiconductor is used for a transistor, the transistor can have high field-effect mobility. In addition, the transistor can have high reliability.

An oxide semiconductor with a low carrier concentration is preferably used for a channel formation region of the transistor. For example, the carrier concentration of the oxide semiconductor in the channel formation region is preferably lower than or equal to $1 \times 10^{18}$ cm$^{-3}$, further preferably lower than to $1 \times 10^{17}$ cm$^{-3}$, still further preferably lower than $1 \times 10^{16}$ cm$^{-3}$, yet further preferably lower than $1 \times 10^{13}$ cm$^{-3}$, and yet still further preferably lower than $1 \times 10^{12}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. Thus, a transistor whose channel formation region is formed in an oxide semiconductor having a high density of trap states has unstable electrical characteristics in some cases.

Thus, a reduction in the concentration of impurities in the oxide semiconductor is effective in stabilizing electrical characteristics of the transistor. In order to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

[Impurity]

The influence of impurities in the oxide semiconductor is described here.

When silicon or carbon, which is a Group 14 element, is contained in an oxide semiconductor, defect states are formed in the oxide semiconductor. Thus, the concentration of silicon or carbon in the channel formation region of the oxide semiconductor and in the vicinity of an interface with the channel formation region of the oxide semiconductor (measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated, in some cases. Accordingly, a transistor including an oxide semiconductor that contains alkali metal or alkaline earth metal tends to have normally-on characteristics. Thus, the concentration of alkali metal or alkaline earth metal in the channel formation region of the oxide semiconductor measured by SIMS is set lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. Thus, a transistor including an oxide semiconductor that contains nitrogen as the semiconductor tends to have normally-on characteristics. When nitrogen is contained in the oxide semiconductor, trap states are sometimes formed in the oxide semiconductor. This might result in unstable electrical characteristics of the transistor. Thus, the concentration of nitrogen in the channel formation region of the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom generates an electron serving as a carrier. Thus, a transistor including an oxide semiconductor that contains hydrogen tends to have normally-on characteristics. Accordingly, hydrogen in the oxide semiconductor is preferably reduced as much as possible. Specifically, the hydrogen concentration in the channel formation region of the oxide semiconductor measured by SIMS is lower than $1\times10^{20}$ atoms/cm$^3$, preferably lower than $5\times10^{19}$ atoms/cm$^3$, further preferably lower than $1\times10^{19}$ atoms/cm$^3$, still further preferably lower than $5\times10^{18}$ atoms/cm$^3$, and yet further preferably lower than $1\times10^{18}$ atoms/cm$^3$.

When an oxide semiconductor with sufficiently reduced impurity concentration is used for a channel formation region in a transistor, the transistor can have stable electrical characteristics.

[Other Semiconductor Materials]

The semiconductor materials that can be used for the oxide 330 are not limited to the above metal oxides. A semiconductor material which has a band gap (a semiconductor material that is not a zero-gap semiconductor) can be used for the oxide 330. For example, a single element semiconductor such as silicon, a compound semiconductor such as gallium arsenide, or a layered material (also referred to as an atomic layered material or a two-dimensional material) is preferably used as a semiconductor material. In particular, a layered material functioning as a semiconductor is preferably used as the semiconductor material.

In this specification and the like, the layered material is a group of materials having a layered crystal structure. In the layered crystal structure, layers formed by covalent bonding or ionic bonding are stacked with a bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which contains oxygen, sulfur, selenium, tellurium, polonium, and livermorium. Examples of chalcogenide include transition metal chalcogenide and chalcogenide of Group 13 elements.

As the oxide 330, a transition metal chalcogenide functioning as a semiconductor is preferably used, for example. Specific examples of the transition metal chalcogenide which can be used for the oxide 330 include molybdenum sulfide (typically MoS$_2$), molybdenum selenide (typically MoSe$_2$), molybdenum telluride (typically MoTe$_2$), tungsten sulfide (WS$_2$), tungsten selenide (typically WSe$_2$), tungsten telluride (typically WTe$_2$), hafnium sulfide (HfS$_2$), hafnium selenide (HfSe$_2$), zirconium sulfide (ZrS$_2$), and zirconium selenide (ZrSe$_2$).

<Manufacturing Method of Memory Device 100>

As an example of the manufacturing method of the memory device 100, a manufacturing method of the transistor 112 will be described with reference to FIG. 28A to FIG. 34A, FIG. 28B to FIG. 34B, FIG. 28C to FIG. 34C, and FIG. 28D to FIG. 34D.

FIG. 28A to FIG. 34A are top views. FIG. 28B to FIG. 34B are cross-sectional views taken along dashed-dotted lines A1-A2 in FIG. 28A to FIG. 34A, respectively, and show cross-sectional views of the transistor 112 in the channel length direction. FIG. 28C to FIG. 34C are cross-sectional views taken along dashed-dotted lines A3-A4 in FIG. 28A to FIG. 34A, respectively, and show cross-sectional views of the transistor 112 in the channel width direction. FIG. 28D to FIG. 34D are cross-sectional views taken along dashed-dotted lines A5-A6 in FIG. 28A to FIG. 34A, respectively. Note that for simplification of the drawings, some components are not illustrated in the top views in FIG. 28A to FIG. 34A.

In the following steps, an insulating material for forming an insulator, a conductive material for forming a conductor, and a semiconductor material for forming a semiconductor can be deposited by a sputtering method, a CVD method, an MBE method, a PLD method, an ALD method, or the like.

Examples of the sputtering method include an RF sputtering method in which a high-frequency power source is used for a sputtering power supply, a DC sputtering method in which a DC power source is used, and a pulsed DC sputtering method in which a voltage is applied while being changed in a pulsed manner. The RF sputtering method is mainly used in the case where an insulating film is formed, and the DC sputtering method is mainly used in the case where a metal conductive film is formed. The pulsed DC sputtering method is mainly used in the case where a compound such as an oxide, a nitride, or a carbide is deposited by a reactive sputtering method.

Note that CVD methods can be classified into a plasma enhanced CVD (PECVD) method using plasma, a thermal CVD (TCVD) method using heat, a photo CVD method using light, and the like. Moreover, CVD methods can be classified into a metal CVD (MCVD) method and a metal organic CVD (MOCVD) method according to a source gas.

The PECVD method enables a high-quality film to be obtained at a relatively low temperature. The thermal CVD method does not use plasma and thus causes no plasma damage to an object. For example, a wiring, an electrode, an element (e.g., a transistor or a capacitor), or the like included in a semiconductor device might be charged up by receiving charge from plasma. In that case, accumulated charge might break the wiring, electrode, element, or the like included in the semiconductor device. By contrast, when the thermal CVD method not using plasma is employed, such plasma damage is not caused and the yield of the semiconductor device can be increased. Furthermore, a film with few defects can be obtained by the thermal CVD method because plasma damage during film formation is not caused.

As the ALD method, a thermal ALD method, in which a precursor and a reactant react with each other only by a thermal energy, a plasma-enhanced ALD (PEALD) method, in which a reactant excited by plasma is used, and the like can be used.

In the ALD method, one atomic layer can be deposited at a time by using self-controllability of atoms. Hence, the ALD method has various advantages such as deposition of an extremely thin film, deposition on a component with a high aspect ratio, deposition of a film with a small number of defects such as pinholes, deposition with excellent coverage, and low-temperature deposition. In the PEALD method, the use of plasma is sometimes preferable because deposition at a lower temperature is possible. Note that a precursor used in the ALD method sometimes contains impurities such as carbon. Thus, a film formed by the ALD method may contain impurities such as carbon in a larger amount than a film formed by another deposition method. Note that impurities can be quantified by X-ray photoelectron spectroscopy (XPS).

Unlike in the film formation method in which particles ejected from a target or the like are deposited, a film is formed by reaction at a surface of an object in the CVD method and the ALD method. Thus, the CVD method and the ALD method can provide good step coverage, almost regardless of the shape of an object. In particular, the ALD method enables excellent step coverage and excellent thickness uniformity and can be suitably used to cover a surface of an opening portion with a high aspect ratio, for example. Note that the ALD method has a relatively low deposition rate; hence, in some cases, the ALD method is preferably combined with another film formation method with a high deposition rate, such as the CVD method.

The composition of a film obtained by the CVD method and the ALD method can be controlled with the flow rate ratio of source gases. For example, in the CVD method and the ALD method, a film with a certain composition can be formed by adjusting the flow rate ratio of the source gases. Moreover, in the CVD method and the ALD method, by changing the flow rate ratio of the source gases during the film formation, a film whose composition continuously changes can be formed. In the case where a film is formed while the flow rate ratio of the source gases is changed, as compared to the case where a film is formed using a plurality of deposition chambers, the time taken for the deposition can be shortened because the time taken for transfer and pressure adjustment is omitted. Consequently, semiconductor devices can be manufactured with high productivity in some cases.

First, a substrate (not illustrated) is prepared, and the insulator 312 is formed over the substrate (see FIGS. 28A to 28D). The insulator 312 is preferably formed by a sputtering method. Since hydrogen is not used as a deposition gas in the sputtering method, the concentration of hydrogen in the insulator 312 can be reduced. Note that the insulator 312 can be formed by a CVD method, an MBE method, a PLD method, an ALD method, or the like as well as the sputtering method.

In this embodiment, as the insulator 312, silicon nitride is deposited by a pulsed DC sputtering method using a silicon target in an atmosphere containing a nitrogen gas. The use of the pulsed DC sputtering can inhibit generation of particles due to arcing on the target surface, achieving more uniform film thickness. In addition, by using the pulsed voltage, rising and falling in discharge can be made steep as compared with the case where a high-frequency voltage is used. As a result, power can be supplied to an electrode more efficiently to improve the sputtering rate and film quality.

The use of an insulator through which impurities such as water and hydrogen are less likely to pass, such as silicon nitride, can inhibit diffusion of impurities such as water and hydrogen contained in a layer under the insulator 312. Even when a metal that is easily diffused, such as copper, is used for a conductor (not illustrated) under the insulator 312, the metal can be inhibited from diffusing into a layer over the insulator 312 through the insulator 312 when an insulator through which copper is less likely to pass, such as silicon nitride, is used as the insulator 312.

Next, the insulator 314 is formed over the insulator 312. The insulator 314 is preferably formed by a sputtering method. Since hydrogen is not used as a deposition gas in the sputtering method, the concentration of hydrogen in the insulator 314 can be reduced. Note that the insulator 314 can be formed by a CVD method, an MBE method, a PLD method, an ALD method, or the like as well as the sputtering method.

In this embodiment, as the insulator 314, aluminum oxide is deposited by a pulsed DC sputtering method using an aluminum target in an atmosphere containing an oxygen gas. The use of the pulsed DC sputtering can achieve more uniform film thickness and improve the sputtering rate and film quality.

The use of aluminum oxide, which has a high capability of capturing and fixing hydrogen, as the insulator 314 allows capturing or fixing hydrogen contained in the insulator 316 and the like formed over the insulator 314 and prevents diffusion of hydrogen into the oxide 330.

Next, the insulator 316 is formed over the insulator 314. The insulator 316 is preferably formed by a sputtering method. Since hydrogen is not used as a deposition gas in the sputtering method, the concentration of hydrogen in the insulator 316 can be reduced. Note that the insulator 316 can be formed by a CVD method, an MBE method, a PLD method, an ALD method, or the like as well as the sputtering method.

In this embodiment, as the insulator 316, silicon oxide is deposited by a pulsed DC sputtering method using a silicon target in an atmosphere containing an oxygen gas. The use of the pulsed DC sputtering can achieve more uniform film thickness and improve the sputtering rate and film quality.

The insulators 312, 314, and 316 are preferably formed successively without exposure to the air. For example, a multi-chamber film formation apparatus is used. As a result, the amount of hydrogen in the formed insulators 312, 314, and 316 can be reduced, and furthermore, entry of hydrogen in the films during each film formation step can be inhibited.

Next, an opening that reaches the insulator 314 is formed in the insulator 316 so as to extend in the A3-A4 direction. The opening may be provided as appropriate in accordance with the arrangement of the transistor 112. Note that examples of the opening include a groove and a slit. A region where the opening is formed may be referred to as an opening portion. Wet etching can be used for the formation of the opening; however, dry etching is preferable for microfabrication. The insulator 314 is preferably an insulator that functions as an etching stopper film used in forming the groove by etching the insulator 316. For example, in the case where silicon oxide or silicon oxynitride is used as the insulator 316 in which the groove is to be formed, silicon nitride, aluminum oxide, or hafnium oxide is preferably used as the insulator 314.

As a dry etching apparatus, a capacitively coupled plasma (CCP) etching apparatus including parallel plate electrodes can be used. The capacitively coupled plasma etching apparatus including parallel plate electrodes may have a structure in which a high-frequency voltage is applied to one of the parallel plate electrodes. Alternatively, different high-frequency voltages may be applied to one of the parallel plate electrodes. Further alternatively, high-frequency voltages with the same frequency may be applied to the parallel plate electrodes. Still further alternatively, high-frequency voltages with different frequencies may be applied to the parallel plate electrodes. A dry etching apparatus including a high-density plasma source can be used. As the dry etching apparatus including a high-density plasma source, an inductively coupled plasma (ICP) etching apparatus can be used, for example.

After the formation of the opening, a conductive film to be the conductor 305a is formed. The conductive film to be the conductor 305a desirably contains a conductor that has a function of inhibiting transmission of oxygen. For example, tantalum nitride, tungsten nitride, or titanium nitride can be used. Alternatively, a stacked-layer film of the conductor that has a function of inhibiting transmission of oxygen and tantalum, tungsten, titanium, molybdenum, aluminum, copper, or a molybdenum-tungsten alloy can be used. The conductive film to be the conductor 305a can be formed by a sputtering method, a CVD method, an MBE method, a PLD method, an ALD method, or the like.

In this embodiment, titanium nitride is deposited as the conductive film to be the conductor 305a. When such a metal nitride is used for the layer under the conductor 305b described later, oxidation of the conductor 305b by the insulator 316 or the like can be inhibited. Furthermore, even when a metal that is easily diffused, such as copper, is used as the conductor 305b, the metal can be prevented from diffusing from the conductor 305a.

Next, a conductive film to be the conductor 305b is formed. The conductive film to be the conductor 305b can be formed using tantalum, tungsten, titanium, molybdenum, aluminum, copper, a molybdenum-tungsten alloy, or the like. The conductive film can be formed by a plating method, a sputtering method, a CVD method, an MBE method, a PLD method, an ALD method, or the like. In this embodiment, tungsten is deposited as the conductive film to be the conductor 305b.

Next, the conductive film to be the conductor 305a and the conductive film to be the conductor 305b are partly removed by CMP treatment to expose the insulator 316. As a result, the conductors 305a and 305b remain only in the opening. Note that the insulator 316 is partly removed by the CMP treatment in some cases.

Then, an upper portion of the conductor 305b is removed by etching. This makes the level of the top surface of the conductor 305b lower than the levels of the top surfaces of the conductor 305a and the insulator 316. Dry etching or wet etching can be used for the etching of the conductor 305b; however, dry etching is preferable for microfabrication.

Then, a conductive film to be the conductor 305c is formed over the insulator 316, the conductor 305a, and the conductor 305b. The conductive film to be the conductor 305c desirably contains a conductor that has a function of inhibiting transmission of oxygen like the conductive film to be the conductor 305a.

In this embodiment, titanium nitride is deposited as the conductive film to be the conductor 305c. When such a metal nitride is used for the layer over the conductor 305b, oxidation of the conductor 305b by the insulator 322 or the like can be inhibited. Furthermore, even when a metal that is easily diffused, such as copper, is used as the conductor 305b, the metal can be prevented from diffusing from the conductor 305c.

Next, the conductive film to be the conductor 305c is partly removed by CMP treatment to expose the insulator 316. As a result, the conductors 305a, 305b, and 305c remain only in the opening, and the conductor 305 with a flat top surface can be formed. Furthermore, the conductor 305b is surrounded by the conductor 305a and the conductor 305c. Thus, impurities such as hydrogen can be prevented from diffusing from the conductor 305b to the outside of the conductors 305a and 305c, and the conductor 305b can be prevented from being oxidized by entry oxygen from the outside of the conductors 305a and 305c. Note that the insulator 316 is partly removed by the CMP treatment in some cases.

Then, the insulator 322 is formed over the insulator 316 and the conductor 305. As the insulator 322, an insulator containing an oxide of one or both of aluminum and hafnium is preferably used. As the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 322 has a barrier property against hydrogen and water, diffusion of hydrogen and water contained in a structure body provided around the transistor 112 into the transistor 112 through the insulator 322 is inhibited, and generation of oxygen vacancies in the oxide 330 can be reduced.

The insulator 322 can be formed by a sputtering method, a CVD method, an MBE method, a PLD method, an ALD method, or the like. In this embodiment, hafnium oxide is deposited as the insulator 322 by a sputtering method. Since hydrogen is not used as a deposition gas in the sputtering method, the concentration of hydrogen in the insulator 322 can be reduced.

Subsequently, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in an atmosphere of a nitrogen gas or an inert gas, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under a reduced pressure. Alternatively, the heat treatment may be performed in such a manner that heat treatment is performed in an atmosphere of a nitrogen gas or an inert gas, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, and further preferably 0.05 ppb or less. The heat treatment using a highly purified gas can prevent the entry of moisture or the like into the insulator 322 and the like as much as possible.

In this embodiment, as the heat treatment, after the formation of the insulator 322, heat treatment at 400° C. for one hour is performed with a flow rate ratio of a nitrogen gas and an oxygen gas of 4 slm:1 slm. By the heat treatment, impurities such as water and hydrogen included in the insulator 322 can be removed, for example. In the case where an oxide containing hafnium is used as the insulator 322, the heat treatment can improve the crystallinity of the insulator 322. The heat treatment can also be performed after the formation of the insulator 324, or the like.

Then, the insulator 324 is formed over the insulator 322. The insulator 324 can be formed by a sputtering method, a CVD method, an MBE method, a PLD method, an ALD method, or the like. In this embodiment, silicon oxide is deposited as the insulator 324 by a sputtering method. Since hydrogen is not used as a deposition gas in the sputtering method, the concentration of hydrogen in the insulator 324 can be reduced. The hydrogen concentration in the insulator 324 is preferably reduced because the insulator 324 is in contact with the oxide 330a in a later step.

Here, in order to form an excess-oxygen region in the insulator 324, plasma treatment using oxygen may be performed under a reduced pressure. The plasma treatment using oxygen is preferably performed with an apparatus including a power source for generating high-density plasma using microwaves, for example. Alternatively, the apparatus may include a power source for applying a radio frequency (RF) to the substrate side. The use of high-density plasma enables high-density oxygen radicals to be generated, and application of the RF to the substrate side allows oxygen radicals generated by the high-density plasma to be efficiently introduced into the insulator 324. Alternatively, after plasma treatment using an inert gas with the apparatus, plasma treatment using oxygen may be performed in order to compensate for released oxygen. Note that impurities such as water and hydrogen contained in the insulator 324 can be removed by selecting the conditions of the plasma treatment appropriately. In that case, the heat treatment is not necessarily performed.

Here, aluminum oxide may be deposited over the insulator 324 by a sputtering method, for example, and then removed by CMP treatment until the insulator 324 is exposed. The CMP treatment can planarize and smooth the surface of the insulator 324. When the CMP treatment is performed while the aluminum oxide is placed over the insulator 324, it is easy to detect the endpoint of the CMP treatment. Since the insulator 324 might be partly polished by the CMP treatment to have a reduced thickness, the thickness of the insulator 324 is preferably adjusted at the time of the formation. Planarizing and smoothing the surface of the insulator 324 can sometimes prevent deterioration of the coverage with an oxide deposited later and a decrease in yield of the semiconductor device. Moreover, it is preferable to deposit aluminum oxide over the insulator 324 by a sputtering method, in which case oxygen can be added to the insulator 324.

Next, an oxide film 330A and an oxide film 330B are formed in this order over the insulator 324. Note that the oxide films 330A and 330B are preferably successively formed without exposure to the air. When the oxide films 330A and 330B are formed without exposure to the air, impurities or moisture from the air can be prevented from being attached to the oxide films 330A and 330B, so that the interface between the oxide films 330A and 330B and the vicinity of the interface can be kept clean.

The oxide films 330A and 330B can be formed by a sputtering method, a CVD method, an MBE method, a PLD method, an ALD method, or the like.

When the oxide films 330A and 330B are formed by a sputtering method, for example, oxygen or a mixed gas of oxygen and a rare gas is used as a sputtering gas. An increase in the proportion of oxygen in the sputtering gas can increase the amount of excess oxygen contained in the oxide film to be formed. Moreover, when the oxide films are formed by a sputtering method, a target of the In-M-Zn oxide can be used, for example.

In particular, in the formation of the oxide film 330A, part of oxygen contained in the sputtering gas is supplied to the insulator 324 in some cases. Therefore, the proportion of oxygen in the sputtering gas is preferably 70% or higher, further preferably 80% or higher, and still further preferably 100%.

When the oxide film 330B is formed by a sputtering method and the proportion of oxygen in the sputtering gas is higher than 30% and lower than or equal to 100%, preferably higher than or equal to 70% and lower than or equal to 100%, an oxygen-excess oxide semiconductor is formed. A transistor including an oxygen-excess oxide semiconductor in a channel formation region can have relatively high reliability. However, one embodiment of the present invention is not limited thereto. When the oxide film 330B is formed by a sputtering method and the proportion of oxygen in the sputtering gas is higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor in a channel formation region can have relatively high field-effect mobility. In addition, when the oxide film is formed while the substrate is being heated, the crystallinity of the oxide film can be improved.

In this embodiment, the oxide film 330A is formed by a sputtering method using an oxide target with an atomic ratio of In:Ga:Zn=1:3:4. The oxide film 330B is formed by a sputtering method using an oxide target with an atomic ratio of In:Ga:Zn=4:2:4.1. Note that each of the oxide films is preferably formed by appropriate selection of deposition conditions and the atomic ratio to have characteristics required for the oxides 330a and 330b obtained by processing in a later step.

Then, an oxide film 343A is formed over the oxide film 330B. The oxide film 343A can be formed by a sputtering method, a CVD method, an MBE method, a PLD method, an ALD method, or the like. The atomic ratio of Ga to In in the oxide film 343A is preferably greater than that in the oxide film 330B. In this embodiment, the oxide film 343A is formed by a sputtering method using an oxide target with an atomic ratio of In:Ga:Zn=1:3:4.

The insulators 322 and 324, and the oxide films 330A, 330B, and 343A are preferably formed by a sputtering method without exposure to the air. For example, a multi-chamber film formation apparatus is used. As a result, the amount of hydrogen in the insulators 322 and 324, and the oxide films 330A, 330B, and 343A can be reduced, and furthermore, entry of hydrogen in the films during each film formation step can be inhibited.

Next, heat treatment is preferably performed. The heat treatment is performed at a temperature higher than or equal to 250° C. and lower than or equal to 650° C., preferably higher than or equal to 400° C. and lower than or equal to 600° C. so that the oxide films 330A, 330B, and 343A do not become polycrystals. The heat treatment is performed in an atmosphere of a nitrogen gas or an inert gas, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under a reduced pressure. Alternatively, the heat treatment may be performed in such a manner that heat treatment is performed in an atmosphere of a nitrogen gas or an inert gas, and then another heat treatment is performed in an atmosphere containing an oxidizing gas at 10 ppm or more, 1% or more, or 10% or more in order to compensate for released oxygen.

The gas used in the above heat treatment is preferably highly purified. For example, the amount of moisture contained in the gas used in the above heat treatment is 1 ppb or less, preferably 0.1 ppb or less, and further preferably 0.05 ppb or less. The heat treatment using a highly purified gas can prevent the entry of moisture or the like into the oxide films 330A, 330B, 343A, and the like as much as possible.

In this embodiment, as the heat treatment, heat treatment is performed at 550° C. for one hour in a nitrogen atmosphere, and another heat treatment is successively performed at 550° C. for one hour in an oxygen atmosphere. By the heat treatment, impurities such as water and hydrogen included in the oxide films 330A, 330B, and 343A can be removed, for example. Furthermore, the heat treatment improves the crystallinity of the oxide film 330B, thereby offering a dense structure with higher density. Thus, diffusion of oxygen or impurities in the oxide film 330B can be reduced.

Then, a conductive film 342A is formed over the oxide film 343A. The conductive film 342A can be formed by a sputtering method, a CVD method, an MBE method, a PLD method, an ALD method, or the like. For example, tantalum nitride may be deposited as the conductive film 342A by a sputtering method. Note that heat treatment may be performed before the formation of the conductive film 342A. The heat treatment may be performed under a reduced pressure, and the conductive film 342A may be successively formed without exposure to the air. By such treatment, moisture and hydrogen adsorbed on the surface of the oxide film 343A and the like can be removed, and the moisture concentration and the hydrogen concentration in the oxide films 330A, 330B, and 343A can be reduced. The temperature of the heat treatment is preferably higher than or equal to 100° C. and lower than or equal to 400° C. In this embodiment, the temperature of the heat treatment is 200° C.

Next, the oxide films 330A, 330B, and 343A, and the conductive film 342A are processed by, for example, a lithography method into an island shape extending in the A1-A2 direction, so that the oxide 330a, the oxide 330b, an oxide layer 343B, and a conductive layer 342B are formed (see FIGS. 29A to 29D). The oxide 330a, the oxide 330b, the oxide layer 343B, and the conductive layer 342B may be formed as appropriate in accordance with the arrangement of the transistor 112. The processing can be performed by a dry etching method or a wet etching method. A dry etching method is suitable for microfabrication. Alternatively, the oxide films 330A, 330B, and 343A, and the conductive film 342A may be processed under different conditions. Note that in this step, the thickness of the insulator 324 in a region not overlapping with the oxide 330a is reduced in some cases. Also in this step, the insulator 324 may be processed into an island shape so as to overlap with the oxide 330a.

In the lithography method, first, a resist is exposed to light through a mask. Next, a region exposed to light is removed or left using a developing solution, so that a resist mask is formed. Then, etching is conducted with the resist mask, whereby a conductor, a semiconductor, an insulator, or the like can be processed into a desired shape. The resist mask is formed, for example, by exposing the resist to KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that in the case of using an electron beam or an ion beam, a mask is not necessary because a desired region of the resist can be selectively irradiated with a beam. To remove the resist mask, dry etching treatment such as ashing or wet etching treatment can be used. Alternatively, wet etching treatment can be performed after dry etching treatment, or dry etching treatment can be performed after wet etching treatment.

A hard mask formed of an insulator or a conductor may be used under the resist mask. In the case of using a hard mask, a hard mask with a desired shape can be formed in the following manner: an insulating film or a conductive film that is the material for the hard mask is formed over the conductive film 342A, a resist mask is formed thereover, and then the hard mask material is etched. The etching of the conductive film 342A and the like may be performed after or without removal of the resist mask. In the latter case, the resist mask sometimes disappears during the etching. The hard mask may be removed by etching after the etching of the conductive film 342A and the like. The hard mask does not need to be removed when the hard mask material does not affect the following process or can be utilized in the following process. For example, in the case where the hard mask is formed using the insulating film, the hard mask may remain to be used as a barrier insulating film.

The oxide 330a, the oxide 330b, the oxide layer 343B, and the conductive layer 342B are formed to overlap with the conductor 305 at least partly. It is preferred that the side surfaces of the oxide 330a, the oxide 330b, the oxide layer 343B, and the conductive layer 342B be substantially perpendicular to the top surface of the insulator 322, in which case a plurality of transistors 112 can be provided in a smaller area and at a higher density. The angle formed between the side surfaces of the oxide 330a, the oxide 330b, the oxide layer 343B, and the conductive layer 342B and the top surface of the insulator 322 may be an acute angle. In that case, the angle formed between the side surfaces of the oxide 330a, the oxide 330b, the oxide layer 343B, and the conductive layer 342B and the top surface of the insulator 322 is preferably larger than or equal to 60° and smaller than 70°. With such a shape, the coverage with the insulator 375 and the like can be improved in a later step, so that defects such as a void can be reduced.

A by-product generated in the above etching step is sometimes formed in a layered manner on the side surfaces of the oxide 330a, the oxide 330b, the oxide layer 343B, and the conductive layer 342B. In that case, the layered by-product remains between the insulator 375 formed later and the oxide 330a, the oxide 330b, the oxide layer 343B, and the conductive layer 342B. A layered by-product also remains on the insulator 324 in some cases. When the insulator 375 is deposited with the layered by-product remaining on the insulator 324, the layered by-product hinders the addition of oxygen to the insulator 324. Hence, the layered by-product formed in contact with the top surface of the insulator 324 is preferably removed.

Then, the insulator 375 is formed over the insulator 324, the oxide 330a, the oxide 330b, the oxide layer 343B, and the conductive layer 342B (see FIGS. 30A to 30D). The insulator 375 can be formed by a sputtering method, a CVD method, an MBE method, a PLD method, an ALD method, or the like. The insulator 375 is preferably formed using an insulating film having a function of inhibiting transmission of oxygen. For example, aluminum oxide is deposited as the insulator 375 by a sputtering method. When the insulator 375 is formed by a sputtering method, oxygen can be added to the insulator 324.

Then, an insulating film to be the insulator 380 is deposited over the insulator 375. The insulating film can be formed by a sputtering method, a CVD method, an MBE method, a PLD method, an ALD method, or the like. For example, a silicon oxide film may be deposited as the insulating film by a sputtering method. When the insulating film to be the insulator 380 is formed by a sputtering method in an oxygen-containing atmosphere, the insulator 380 containing excess oxygen can be formed. Since hydrogen is not used as a deposition gas in the sputtering method, the concentration of hydrogen in the insulator 380 can be reduced. Note that heat treatment may be performed before the formation of the insulating film. The heat treatment may be performed under a reduced pressure, and the insulating film may be successively formed without exposure to the air. By such treatment, moisture and hydrogen adsorbed on the surface of the insulator 375 and the like can be removed, and the moisture concentration and the hydrogen concentration in the oxide 330a, the oxide 330b, the oxide layer 343B, and the insulator 324 can be reduced. The heat treatment can be performed under the above-described heat treatment conditions.

Next, the insulating film to be the insulator 380 is subjected to CMP treatment, so that the insulator 380 having a flat top surface is formed. Note that silicon nitride may be deposited over the insulator 380 by a sputtering method, for example, and then subjected to CMP treatment until the insulator 380 is exposed.

Next, the insulator 380, the insulator 375, the conductive layer 342B, the oxide layer 343B, the oxide 330a, the oxide 330b, and the insulator 324 are partly processed to form an opening reaching the oxide 330b (see FIGS. 31A to 31D). The opening is preferably formed to overlap with the conductor 305. The conductor 342a, the conductor 342b, the oxide 343a, and the oxide 343b are formed by the formation of the opening. In other words, a plurality of conductors 342 and a plurality of oxides 343 are divided by the opening and arranged linearly. Here, the top surface of the oxide 330b is exposed in the opening.

An upper portion of the oxide 330b is removed when the opening is formed. Removal of part of the oxide 330b makes a groove in the oxide 330b. The groove may be formed in the same step as the formation of the opening or in a step different from the formation of the opening in accordance with the depth of the groove.

The insulator 380, the insulator 375, the conductive layer 342B, the oxide layer 343B, and the oxide 330b can be partly processed by a dry etching method or a wet etching method. A dry etching method is suitable for microfabrication. The processing may be performed under different conditions. For example, part of the insulator 380 may be processed by a dry etching method, part of the insulator 375 may be processed by a wet etching method, and part of the oxide layer 343B, part of the conductive layer 342B, and part of the oxide 330b may be processed by a dry etching method. Processing of parts of the oxide layer 343B and the conductive layer 342B and processing of part of the oxide 330b may be performed under different conditions.

Here, it is preferable to remove impurities that are attached onto the surfaces of the oxide 330a, the oxide 330b, and the like or diffused into the oxide 330a, the oxide 330b, and the like. It is also preferable to remove a damaged region that is formed on the surface of the oxide 330b by the above dry etching. The impurities result from components contained in the insulator 380, the insulator 375, and the conductive layer 342B; components contained in a member of an apparatus used to form the opening; and components contained in a gas or a liquid used for etching, for example. Examples of the impurities include aluminum, silicon, tantalum, fluorine, and chlorine.

In particular, impurities such as aluminum and silicon hinder the oxide 330b from becoming a CAAC-OS. It is thus preferable to reduce or eliminate impurity elements such as aluminum and silicon, which hinder the oxide from becoming a CAAC-OS. For example, the concentration of aluminum atoms in the oxide 330b and in the vicinity thereof is lower than or equal to 5.0 at. %, preferably lower than or equal to 2.0 at. %, further preferably lower than or equal to 1.5 at. %, still further preferably lower than or equal to 1.0 at. %, and yet further preferably lower than 0.3 at. %.

Note that in a metal oxide, a region that is hindered from becoming a CAAC-OS by impurities such as aluminum and silicon and becomes an amorphous-like oxide semiconductor (a-like OS) is referred to as a non-CAAC region in some cases. In the non-CAAC region, the density of the crystal structure is reduced to increase VoH; thus, the transistor is likely to be normally on. Hence, the non-CAAC region in the oxide 330b is preferably reduced or removed.

In contrast, the oxide 330b preferably has a layered CAAC structure. In particular, the CAAC structure preferably reaches a lower edge of a drain in the oxide 330b. In the transistor 112, the conductor 342a or the conductor 342b, and the vicinity thereof function as the drain. That is, the oxide 330b in the vicinity of the lower edge of the conductor 342a (the conductor 342b) preferably has the CAAC structure. In this manner, the damaged region is removed and the CAAC structure is formed in the oxide 330b also in the edge portion of the drain, which significantly affects the drain withstand voltage, so that variations in the electrical characteristics of the transistor 112 can be further inhibited and the reliability of the transistor 112 can be improved.

Cleaning treatment is performed to remove the impurities and the like. As the cleaning, any of wet cleaning using a cleaning solution or the like, plasma treatment using plasma, cleaning by heat treatment, and the like can be performed by itself or in appropriate combination. The cleaning treatment sometimes makes the groove deeper.

The wet cleaning may be performed using an aqueous solution in which ammonia water, oxalic acid, phosphoric acid, hydrofluoric acid, or the like is diluted with carbonated water or pure water; pure water; or carbonated water, for example. Alternatively, ultrasonic cleaning using such an aqueous solution, pure water, or carbonated water may be performed. Further alternatively, such cleaning methods may be performed in combination as appropriate.

Note that in this specification and the like, in some cases, an aqueous solution in which commercial hydrofluoric acid is diluted with pure water is referred to as diluted hydrofluoric acid, and an aqueous solution in which commercial ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water may be higher than or equal to 0.01% and lower than or equal to 5%, preferably higher than or equal to 0.1% and lower than or equal to 0.5%. The concentration of hydrogen fluoride in the diluted hydrofluoric acid may be higher than or equal to 0.01 ppm and lower than or equal to 100 ppm, preferably higher than or equal to 0.1 ppm and lower than or equal to 10 ppm.

A frequency greater than or equal to 200 kHz, preferably greater than or equal to 900 kHz is preferably used for the ultrasonic cleaning. Damage to the oxide $330b$ and the like can be reduced with this frequency.

The cleaning treatment may be performed plural times, and the cleaning solution may be changed in every cleaning treatment. For example, the first cleaning treatment may use diluted hydrofluoric acid or diluted ammonia water and the second cleaning treatment may use pure water or carbonated water.

As the cleaning treatment in this embodiment, wet cleaning using diluted hydrofluoric acid is performed and then, wet cleaning using pure water or carbonated water is performed. The cleaning treatment allows removing impurities that are attached onto the surfaces of the oxide $330a$, the oxide $330b$, and the like or diffused into the oxide $330a$, the oxide $330b$, and the like. Furthermore, the crystallinity of the oxide $330b$ can be improved.

By the processing such as dry etching or the cleaning treatment, the thickness of the insulator 324 in a region that overlaps with the opening and does not overlap with the oxide $330b$ might become smaller than that in a region that overlaps with the oxide $330b$.

After the etching or the cleaning, heat treatment may be performed. The heat treatment may be performed at a temperature higher than or equal to 100° C. and lower than or equal to 450° C., preferably higher than or equal to 350° C. and lower than or equal to 400° C. The heat treatment is performed in an atmosphere of a nitrogen gas or an inert gas, or an atmosphere containing an oxidizing gas at 10 ppm or more, 1% or more, or 10% or more. For example, the heat treatment is preferably performed in an oxygen atmosphere. Accordingly, oxygen can be supplied to the oxides $330a$ and $330b$ to reduce oxygen vacancies Vo. In addition, the crystallinity of the oxide $330b$ can be improved by the heat treatment. The heat treatment may be performed under a reduced pressure. Alternatively, the heat treatment may be performed in such a manner that heat treatment is performed in an oxygen atmosphere, and then another heat treatment is successively performed in a nitrogen atmosphere without exposure to the air.

Next, an insulating film 350A is formed (see FIGS. 32A to 32D). Heat treatment may be performed before the insulating film 350A is formed; it is preferable that the heat treatment be performed under a reduced pressure and the insulating film 350A be successively formed without exposure to the air. The heat treatment is preferably performed in an oxygen-containing atmosphere. The treatment allows removing moisture and hydrogen adsorbed on the surface of the oxide $330b$, and reducing the concentration of moisture and hydrogen in the oxides $330a$ and $330b$. The heat treatment is preferably performed at a temperature higher than or equal to 100° C. and lower than or equal to 400° C.

The insulating film 350A can be formed by a sputtering method, a CVD method, an MBE method, a PLD method, an ALD method, or the like. The insulating film 350A is preferably formed by a deposition method using a gas in which the number of hydrogen atoms is reduced or hydrogen atoms are removed. This reduces the hydrogen concentration in the insulating film 350A. The hydrogen concentration in the insulating film 350A is preferably reduced because the insulating film 350A becomes the insulator 350 in contact with the oxide $330b$ in a later step.

The insulating film 350A is preferably formed by an ALD method. The thickness of the insulator 350, which functions as a gate insulating film of the downsized transistor 112, need to be extremely thin (e.g., approximately 5 nm to 30 nm) and have a small variation. In the ALD method, a precursor and a reactant (oxidizer) are alternately introduced and the film thickness can be adjusted by the number of repetition times of the sequence of the gas introduction; thus, accurate control of the film thickness is possible. This achieves the accuracy of the gate insulating film required by the downsized transistor 112. Furthermore, the insulating film 350A needs to be formed on the bottom and side surfaces of the opening formed in the insulator 380 and the like so as to have favorable coverage. One atomic layer can be deposited at a time on the bottom and side surfaces of the opening, whereby the insulating film 350A can be formed in the opening with good coverage.

For example, in the case where the insulating film 350A is formed by a PECVD method, a deposition gas containing hydrogen is decomposed in plasma to generate a large amount of hydrogen radicals. Oxygen in the oxide $330b$ is extracted by the reduction reaction of hydrogen radicals to form VoH, so that the hydrogen concentration in the oxide $330b$ increases. In contrast, when the insulating film 350A is formed by an ALD method, the generation of hydrogen radicals can be inhibited even at the introduction of a precursor and the introduction of a reactant. Thus, the use of the ALD method for forming the insulating film 350A prevents an increase in the hydrogen concentration in the oxide $330b$. As the insulating film 350A, for example, a silicon oxide film may be formed by the ALD method.

Next, microwave treatment is performed in an oxygen-containing atmosphere. Here, wave dotted arrows shown in FIGS. 32B to 32D indicate a microwave, a high-frequency wave such as RF, an oxygen plasma, an oxygen radical, and the like. The microwave treatment is preferably performed with a microwave treatment apparatus including a power source for generating high-density plasma using microwaves, for example. The microwave treatment apparatus may be provided with a power source to apply RF on the substrate side. High-density oxygen radicals can be generated with high-density plasma. Furthermore, application of RF to the substrate side allows oxygen ions generated by the high-density plasma to permeate the oxide $330b$ efficiently. The microwave treatment is preferably performed under a reduced pressure, and the pressure is set to be higher than or equal to 60 Pa, preferably higher than or equal to 133 Pa, further preferably higher than or equal to 200 Pa, and still further preferably higher than or equal to 400 Pa. The treatment is performed with an oxygen flow rate ($O_2/O_2+Ar$) of 50% or less, preferably 10% or more and 30% or less. The treatment temperature may be lower than or equal to 750° C., preferably lower than or equal to 500° C., e.g., approximately 400° C. The microwave treatment can be followed successively by heat treatment without exposure to the air.

The microwave treatment in an oxygen-containing atmosphere converts oxygen gas into plasma using a microwave or a high-frequency wave such as RF, and applies the oxygen plasma to a region of the oxide 330b that is between the conductor 342a and the conductor 342b. At this time, the region 333c can be irradiated with the microwave or the high-frequency wave such as RF. In other words, the microwave, the high-frequency wave such as RF, the oxygen plasma, and the like can be applied to the region 333c shown in FIG. 25. The effect of the plasma, the microwave, and the like enables VoH in the region 333c to be cut off, and hydrogen H to be removed from the region 333c. That is, the reaction "VoH→H+Vo" occurs in the region 333c, so that the hydrogen concentration in the region 333c can be reduced. As a result, oxygen vacancies and VoH in the region 333c can be reduced to lower the carrier concentration. In addition, oxygen radicals generated by the oxygen plasma or oxygen contained in the insulator 350 can be supplied to oxygen vacancies formed in the region 333c, thereby further reducing oxygen vacancies and lowering the carrier concentration in the region 333c.

Figure 32A:
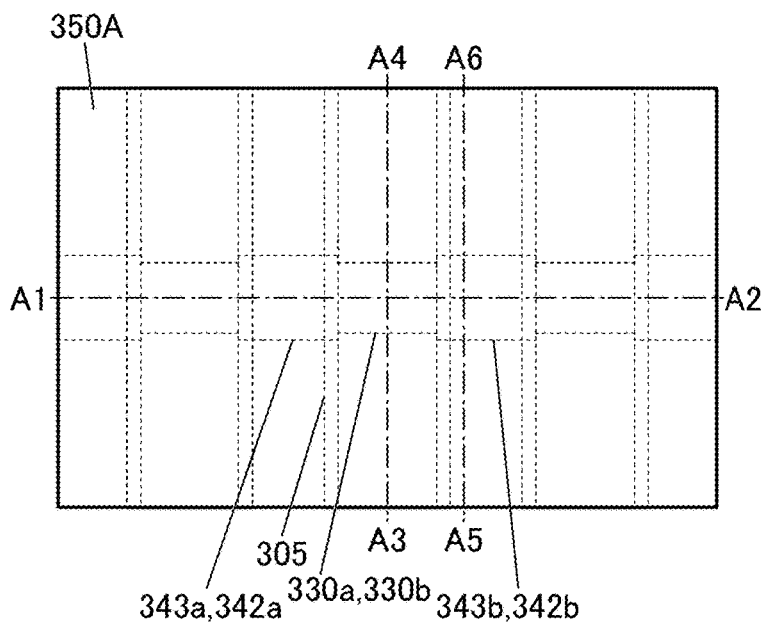
FIG. 32A is a top view for describing a manufacturing method example of a memory device.
Figure 32B:
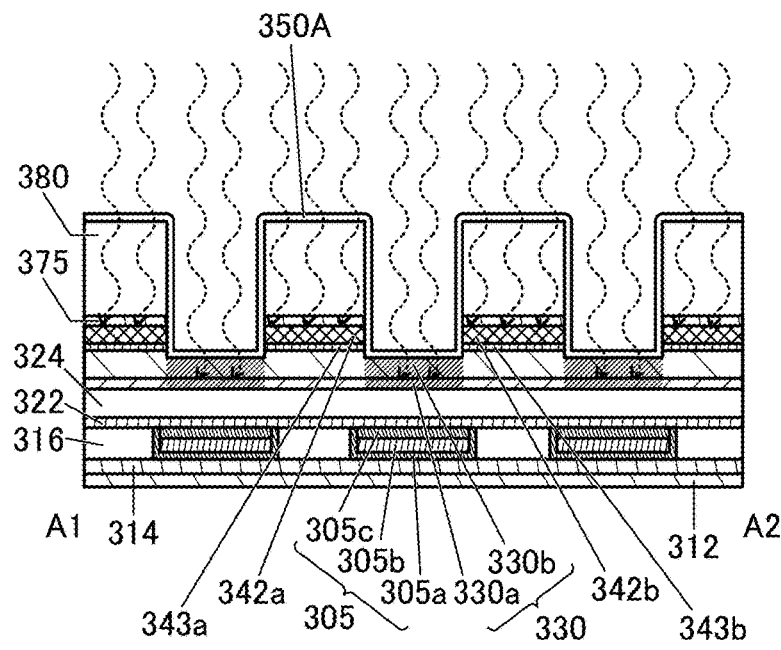
FIGS. 32B to 32D are cross-sectional views for describing the manufacturing method example of the memory device.
Figure 32C:
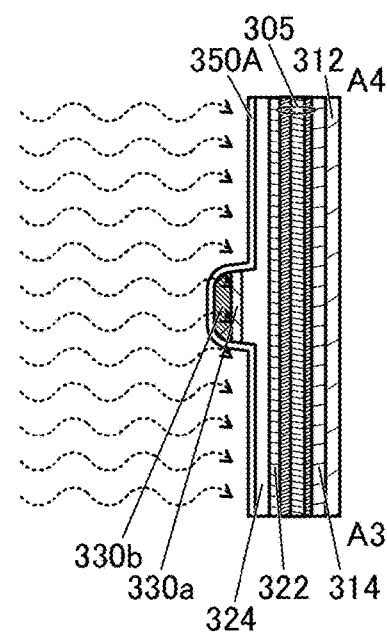
Figure 32D:
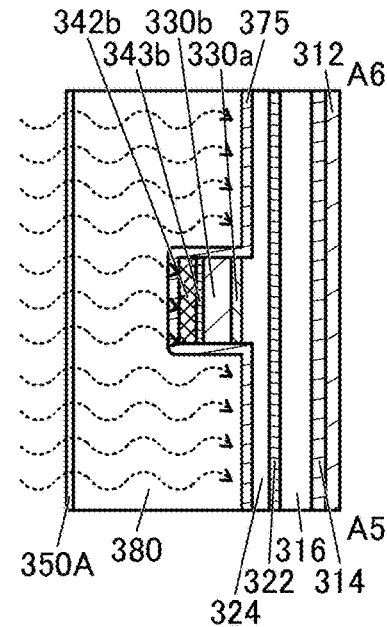
Figure 33A:
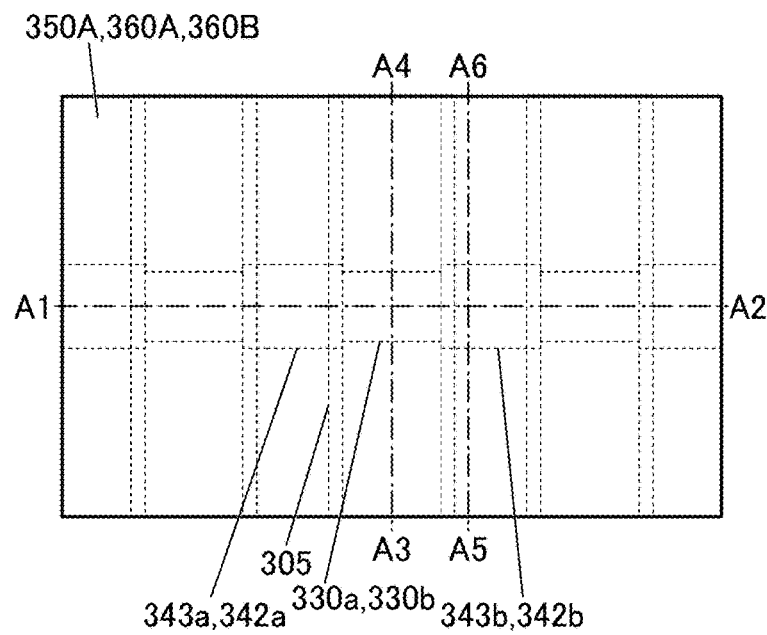
FIG. 33A is a top view for describing a manufacturing method example of a memory device.
Figure 33C:
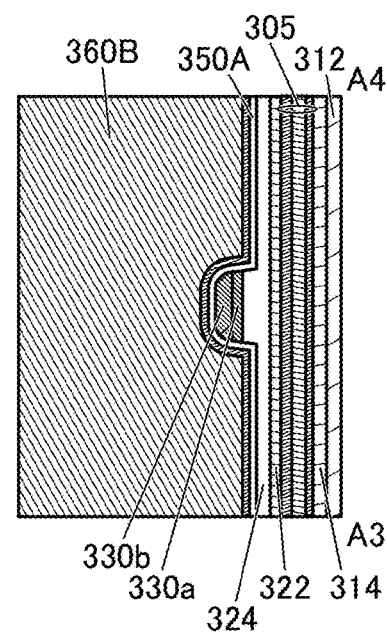
FIGS. 33B to 33D are cross-sectional views for describing the manufacturing method example of the memory device.
Figure 33B:
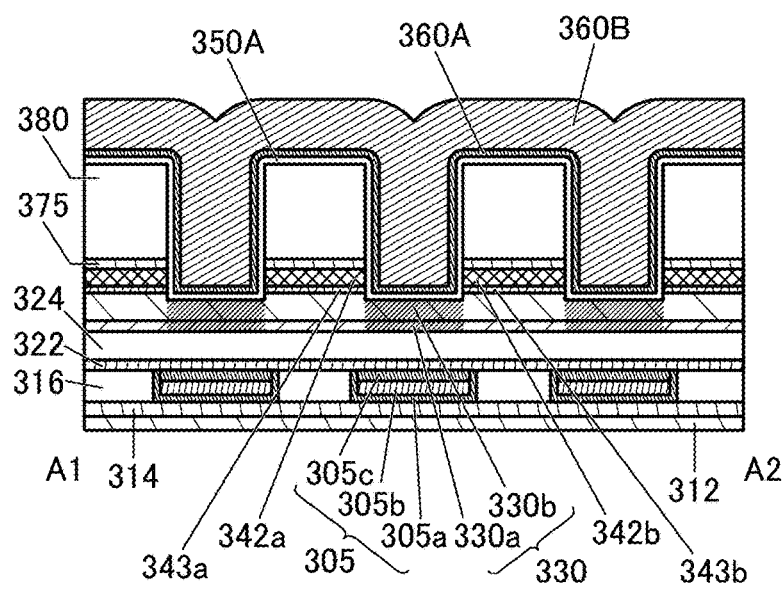
Figure 33D:
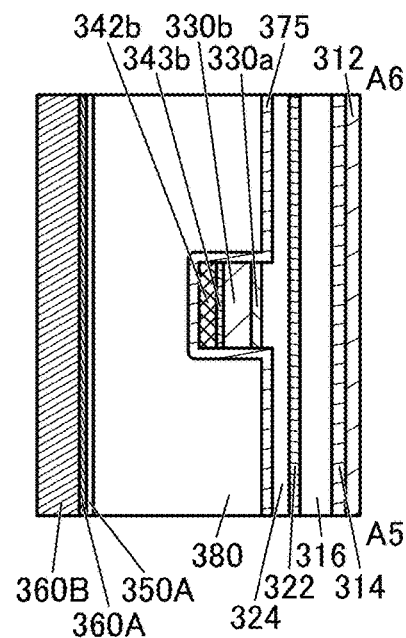

In contrast, the conductor 342a and the conductor 342b are provided over the region 333sd shown in FIG. 25. As shown in FIGS. 32B to 32D, the effects of the microwave, the high-frequency wave such as RF, the oxygen plasma, and the like are blocked by the conductor 342a and the conductor 342b, and thus, are not applied to the region 333sd. Hence, a reduction in VoH and supply of too much oxygen due to the microwave treatment do not occur in the region 333sd, preventing a decrease in carrier concentration in the region 333sd.

In the above manner, oxygen vacancies and VoH can be selectively removed from the region 333c in the oxide semiconductor, whereby the region 333c can be an i-type or substantially i-type region. Furthermore, supply of too much oxygen to the region 333sd functioning as the source or the drain region can be prevented and the n-type region can be maintained. Accordingly, a variation in the electrical characteristics of the transistor 112 can be reduced to inhibit variations in the electrical characteristics of the transistor 112 on the substrate plane.

Thus, a semiconductor device with a small variation in transistor characteristics can be provided. A highly reliable semiconductor device can also be provided. In addition, a semiconductor device having favorable electrical characteristics can be provided.

After the microwave treatment, heat treatment may be performed with the reduced pressure being maintained. Such treatment enables hydrogen in the insulating film 350A, the oxide 330b, and the oxide 330a to be removed efficiently. Part of hydrogen is gettered by the conductor 342 (the conductors 342a and 342b). It is possible to repeat the step of performing heat treatment with the reduced pressure being maintained after the microwave treatment. The repetition of the heat treatment enables hydrogen in the insulating film 350A, the oxide 330b, and the oxide 330a to be removed more efficiently. Note that the temperature of the heat treatment is preferably higher than or equal to 300° C. and lower than or equal to 500° C.

The microwave treatment improves the film quality of the insulating film 350A, thereby inhibiting diffusion of hydrogen, water, impurities, and the like. Accordingly, hydrogen, water, impurities, and the like can be inhibited from diffusing into the oxide 330b, the oxide 330a, and the like through the insulator 350 in the following step such as formation of a conductive film to be the conductor 360 or the following treatment such as heat treatment.

Although the microwave treatment is performed after the insulating film 350A is formed in this embodiment, the present invention is not limited thereto. For example, the microwave treatment may be performed before the insulating film 350A is formed or before or after the barrier insulating film is formed. The microwave treatment may be performed once or plural times. In the case where the insulating film 350A and the barrier insulating film are formed by a PEALD method, treatment with a reactant (oxidizer) excited by plasma in a PEALD apparatus may be substituted for the microwave treatment. Here, an oxygen gas may be used as the reactant (oxidizer).

Next, a conductive film 360A to be the conductor 360a and a conductive film 360B to be the conductor 360b are formed in this order (see FIGS. 33A to 33D). The conductive film 360A and the conductive film 360B are formed by a sputtering method, a CVD method, an MBE method, a PLD method, an ALD method, or the like. In this embodiment, the conductive film 360A and the conductive film 360B are formed by a CVD method.

Then, the insulating film 350A, the conductive film 360A, and the conductive film 360B are polished by CMP treatment until the insulator 380 is exposed. This polishing step makes the insulator 350, the conductor 360a, and the conductor 360b (see FIGS. 34A to 34D). As a result, the insulator 350 is formed so as to cover the opening that reaches the oxide 330b and the inner wall (side wall and bottom surface) of the groove of the oxide 330b. The conductor 360 is formed so as to fill the opening and the groove through the insulator 350.

Then, heat treatment may be performed under conditions similar to those of the above heat treatment. In this embodiment, the heat treatment is performed at 400° C. in a nitrogen atmosphere for one hour. This heat treatment can reduce the concentration of moisture and hydrogen in the insulators 350 and 380. The insulator 385 may be formed successively after the heat treatment without exposure to the air.

Figure 34A:
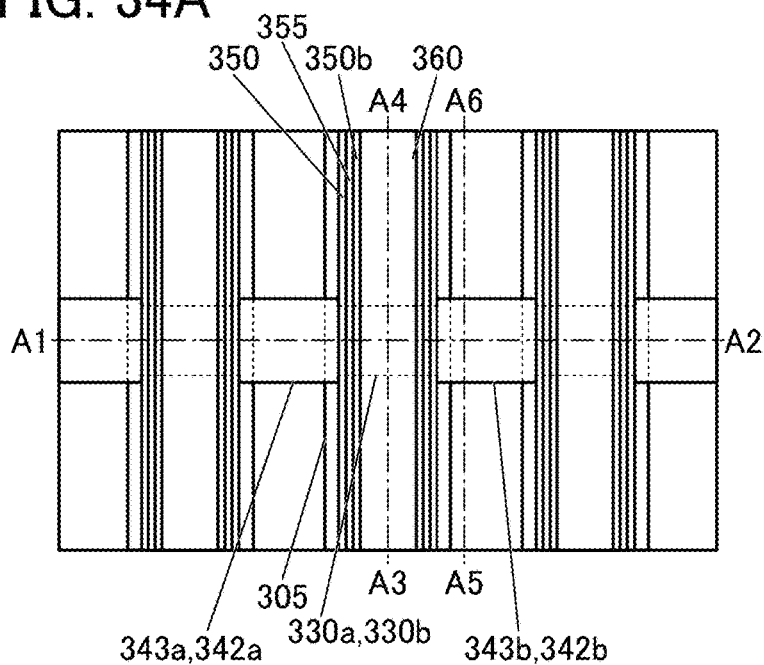
FIG. 34A is a top view for describing a manufacturing method example of a memory device.
Figure 34B:
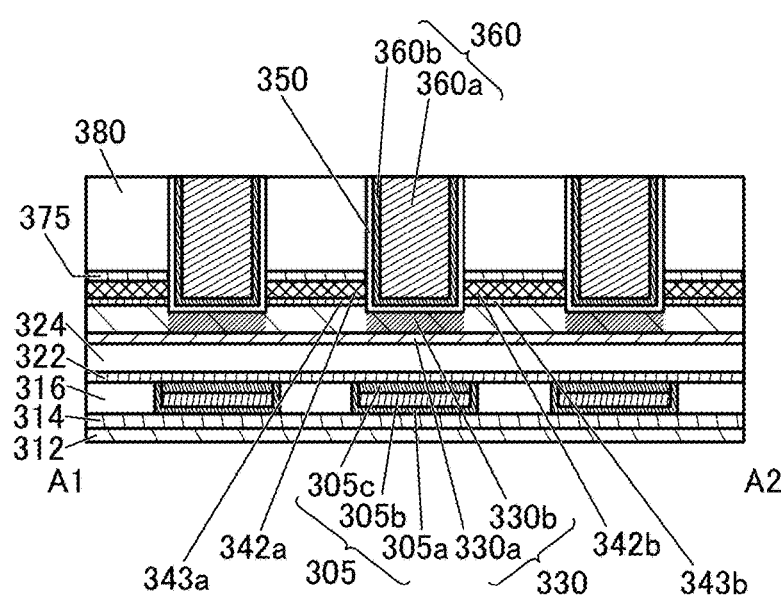
FIGS. 34B to 34D are cross-sectional views for describing the manufacturing method example of the memory device.
Figure 34C:
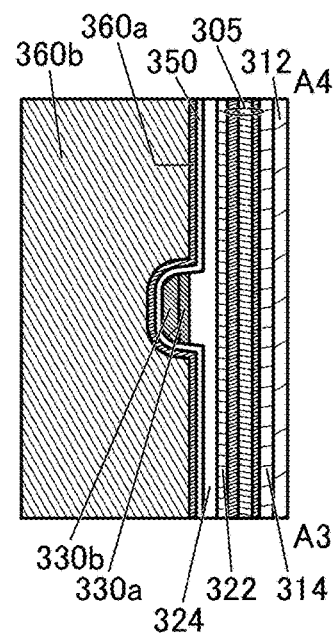
Figure 34D:
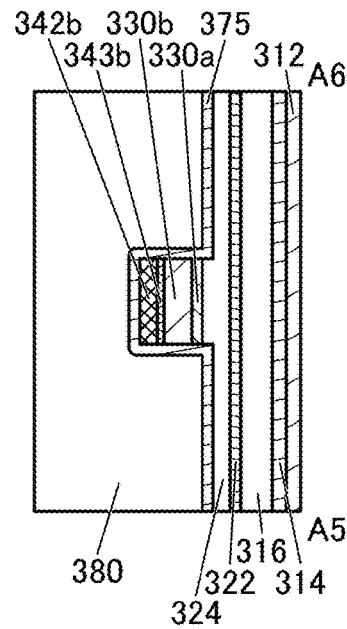

Through the above steps, the transistor 112 can be manufactured. FIG. 34B shows a cross section of three transistors 112. After that, the transistor 111 is provided over the transistor 112. The transistor 111 can be manufactured in substantially the same process as the transistor 112. The memory device 100 can be fabricated through the above steps.

This embodiment can be implemented in combination with any of the structures described in the other embodiments and the like, as appropriate.

Embodiment 5

In this embodiment, an example of a chip 1200 on which the memory device of the present invention is mounted, which is a type of semiconductor device, will be described with reference to FIGS. 35A and 35B. A plurality of circuits (systems) are mounted on the chip 1200. The technique for integrating a plurality of circuits (systems) on one chip is referred to as system on chip (SoC) in some cases.

Figure 35A:
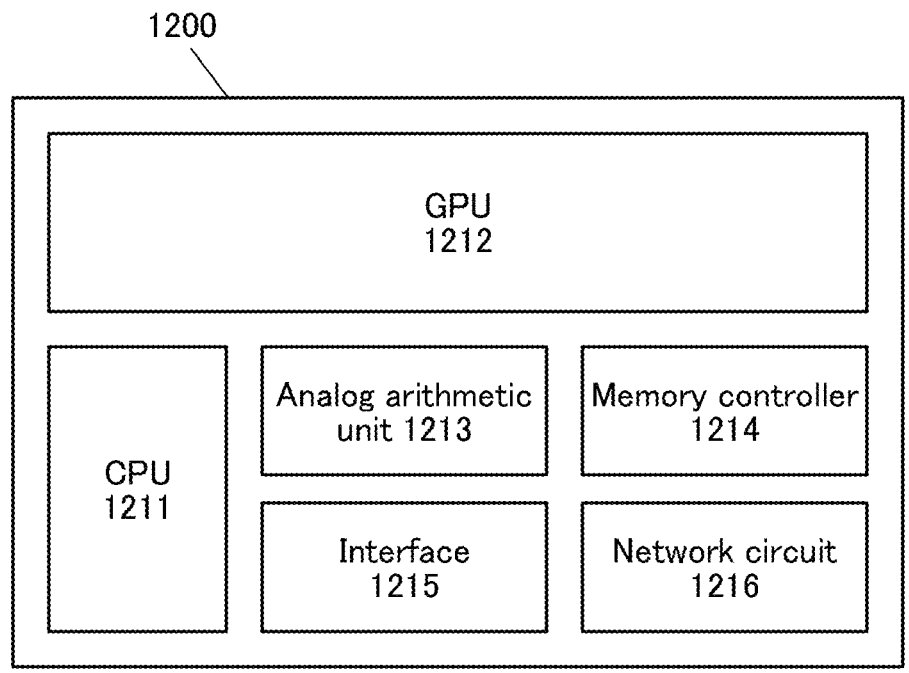
FIG. 35A is a schematic diagram of a semiconductor device and FIG. 35B is a perspective view of the semiconductor device.

As illustrated in FIG. 35A, the chip 1200 includes a CPU 1211, a GPU 1212, at least one analog arithmetic unit 1213, at least one memory controller 1214, at least one interface 1215, at least one network circuit 1216, and the like.

Figure 35B:
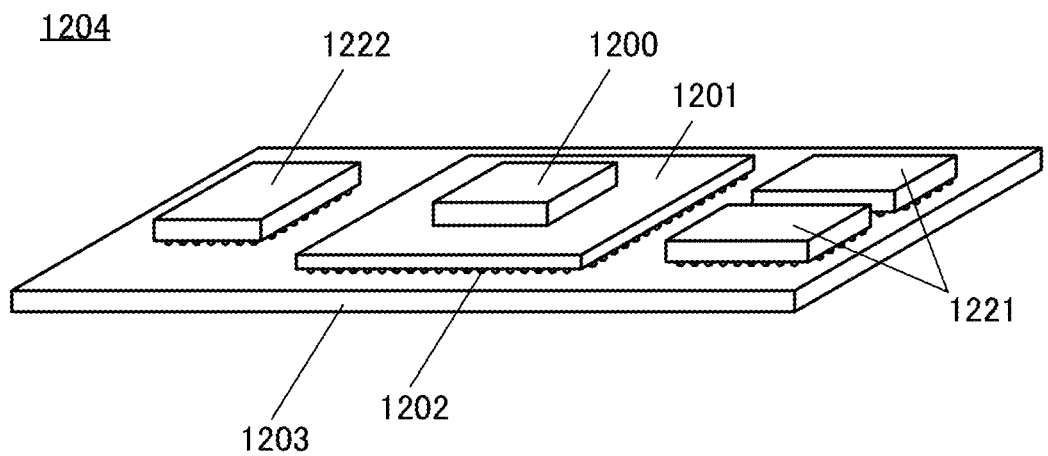

A bump (not illustrated) is provided on the chip 1200, and as illustrated in FIG. 35B, the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. As the flash memory 1222, any of the semiconductor devices described in the above embodiments is preferably used. When any of the semiconductor devices described in the above embodiments is used as the flash memory 1222, the flash memory 1222 can have large storage capacity.

The CPU 1211 preferably includes a plurality of CPU cores. The GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The GPU 1212 is suitable for parallel computation of a number of data and thus can be used for image processing or product-sum operation. When an image processing circuit or a product-sum operation circuit is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an analog/digital (A/D) converter circuit and a digital/analog (D/A) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for connection with an external connection device such as a display device, a speaker, a microphone, a camera, or a controller. Examples of the controller include a mouse, a keyboard, and a game controller. As such an interface, universal serial bus (USB), high-definition multimedia interface (HDMI) (registered trademark), or the like can be used.

The network circuit 1216 includes a circuit for a network such as a local-area network (LAN). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low costs.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement techniques such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structures described in this embodiment can be used in appropriate combination with any of the structures described in the other embodiments.

Embodiment 6

In this embodiment, application examples of a semiconductor device using any of the memory devices described in the above embodiments will be described. The memory device described in the above embodiments can be applied to removable memory devices such as memory cards (e.g., SD cards), USB memories, and solid state drives (SSD). FIGS. 36A to 36E schematically illustrate some structure examples of removable memory devices. For example, any of the semiconductor devices described in the above embodiments is processed into a packaged memory chip and used in a variety of storage devices and removable memories.

Figure 36A:
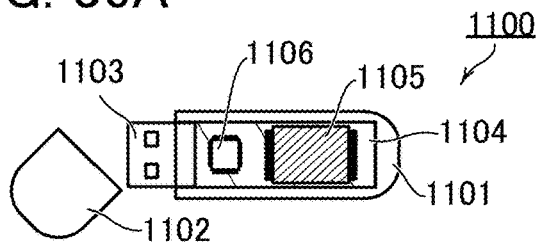
FIGS. 36A to 36E show examples of memory devices.

FIG. 36A is a schematic diagram of a USB memory. A USB memory 1100 includes a housing 1101, a cap 1102, a USB connector 1103, and a substrate 1104. The substrate 1104 is placed in the housing 1101. A memory chip 1105 and a controller chip 1106 are attached to the substrate 1104, for example. The memory device or the semiconductor device described in the above embodiments can be incorporated in the memory chip 1105 or the like.

Figure 36B:
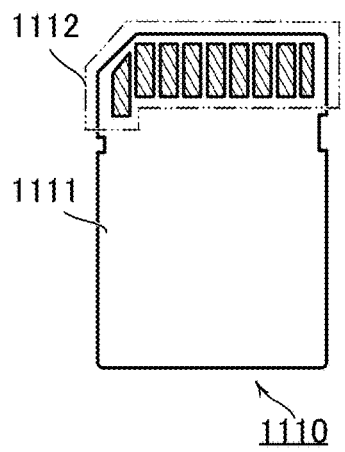
Figure 36C:
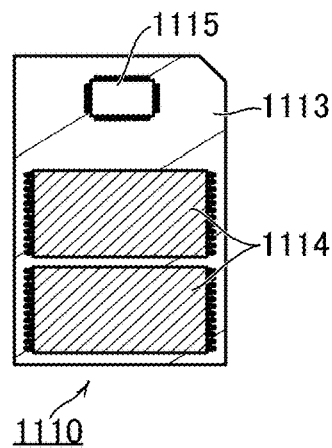

FIG. 36B is a schematic external diagram of an SD card, and FIG. 36C is a schematic diagram illustrating the internal structure of the SD card. An SD card 1110 includes a housing 1111, a connector 1112, and a substrate 1113. The substrate 1113 is placed in the housing 1111. A memory chip 1114 and a controller chip 1115 are attached to the substrate 1113, for example. The memory chip 1114 provided on the rear side of the substrate 1113 increases the capacity of the SD card 1110. In addition, a wireless chip with a wireless communication function may be provided on the substrate 1113. This enables data reading and writing of the memory chip 1114 by wireless communication between a host device and the SD card 1110. The memory device or the semiconductor device described in the above embodiments can be incorporated in the memory chip 1114 or the like.

Figure 36D:
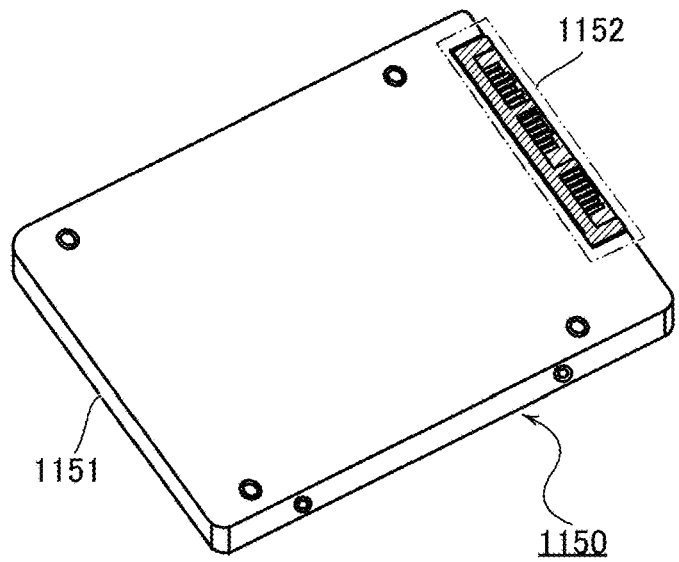
Figure 36E:
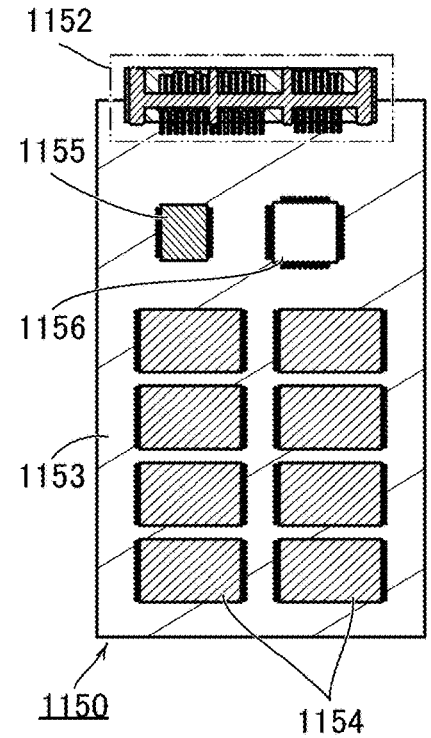

FIG. 36D is a schematic external diagram of an SSD, and FIG. 36E is a schematic diagram illustrating the internal structure of the SSD. An SSD 1150 includes a housing 1151, a connector 1152, and a substrate 1153. The substrate 1153 is placed in the housing 1151. A memory chip 1154, a memory chip 1155, and a controller chip 1156 are attached to the substrate 1153, for example. The memory chip 1155 is a work memory for the controller chip 1156, and a DOSRAM chip can be used, for example. The memory chip 1154 provided on the rear side of the substrate 1153 increases the capacity of the SSD 1150. The memory device or the semiconductor device described in the above embodiments can be incorporated in the memory chip 1154 or the like.

This embodiment can be implemented in combination with any of the structures described in the other embodiments and the like, as appropriate.

Embodiment 7

FIGS. 37A to 37G show specific examples of electronic devices each including the memory device or the semiconductor device of one embodiment of the present invention.
<Electronic Devices and Systems>

The memory device or the semiconductor device of one embodiment of the present invention can be used for a variety of electronic devices. Examples of electronic devices include an information terminal, a computer, a smartphone, an e-book reader, a television device, digital signage, a large game machine (e.g., a pachinko machine), a digital camera, a digital video camera, a digital photo frame, a mobile phone, a portable game console, a video recording/reproducing device, a navigation system, and an audio reproducing device. Here, computers refer not only to tablet computers, notebook computers, and desktop computers, but also to large computers such as server systems.

The electronic device of one embodiment of the present invention may include an antenna. With the antenna receiving a signal, the electronic device can display an image, data, or the like on a display portion. When the electronic device includes an antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.
[Information Terminals]

With the memory device or the semiconductor device of one embodiment of the present invention, a memory device for storing a microcontroller program can be configured. Thus, according to one embodiment of the present invention, the size of a microcontroller chip can be reduced.

Figure 37A:
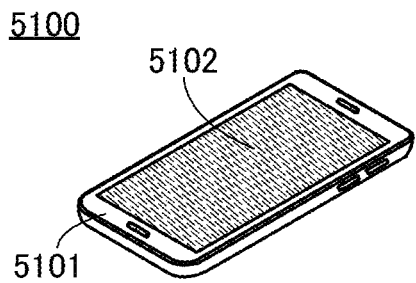
FIGS. 37A to 37G show examples of electronic devices.

FIG. 37A illustrates a mobile phone (smartphone), which is a type of information terminal. The information terminal 5100 includes a housing 5101 and a display portion 5102. As input interfaces, a touch panel and a button are provided in the display portion 5102 and the housing 5101, respectively. The use of a downsized microcontroller of one embodiment of the present invention allows effective use of a limited space in the mobile phone. The memory device of one embodiment of the present invention may be used for storage of the mobile phone. This results in an increase in the storage capacity per unit area of the storage.

Figure 37B:
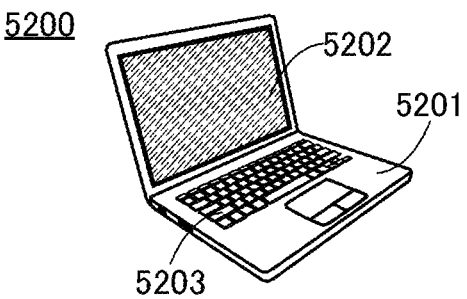

FIG. 37B illustrates a notebook information terminal 5200. The notebook information terminal 5200 includes a main body 5201 of the information terminal, a display portion 5202, and a keyboard 5203. The use of a downsized microcontroller of one embodiment of the present invention allows effective use of a limited space in the notebook information terminal. The memory device of one embodiment of the present invention may be used for storage of the notebook information terminal. This results in an increase in the storage capacity per unit area of the storage.

Note that although FIGS. 37A and 37B illustrate the smartphone and the notebook information terminal as examples of electronic devices, one embodiment of the present invention can also be applied to an information terminal other than the smartphone and the notebook information terminal. Examples of the information terminals other than the smartphone and the notebook information terminal include a personal digital assistant (PDA), a desktop information terminal, and a workstation.
[Game Machines]

Figure 37C:
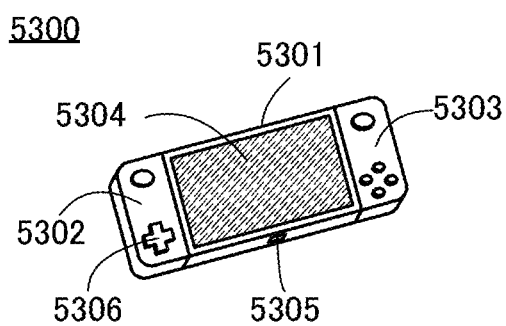

FIG. 37C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to a different video device (not illustrated). In that case, the housing 5302 and the housing 5303 can each function as an operating unit. Thus, a plurality of players can perform a game at the same time. The memory device or the semiconductor device of one embodiment of the present invention can be incorporated in a chip or the like provided on a substrate of the housings 5301, 5302, and 5303.

Figure 37D:
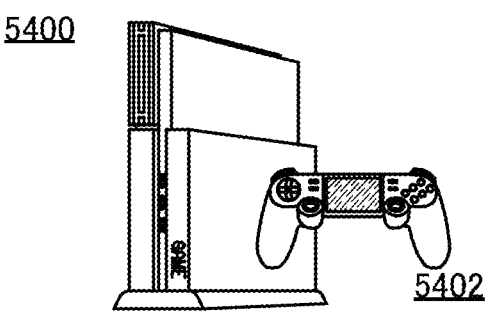

FIG. 37D illustrates a stationary game machine 5400 as another example of a game machine. A controller 5402 is wired or connected wirelessly to the stationary game machine 5400.

The use of a downsized microcontroller of one embodiment of the present invention for the game machine such as the portable game machine 5300 or the stationary game machine 5400 allows effective use of a limited space in the game machine. The memory device, the semiconductor device, or the like of one embodiment of the present invention may be used for storage of the portable game machine. This results in an increase in the storage capacity per unit area of the storage.

Although FIGS. 37C and 37D illustrate the portable game machine and the stationary game machine as examples of game machines, the game machines employing the microcontroller of one embodiment of the present invention are not limited thereto. Examples of the game machines employing the microcontroller of one embodiment of the present invention include an arcade game machine installed in an entertainment facility (e.g., a game center and an amusement park) and a throwing machine for batting practice installed in sports facilities.
[Large Computer]

The memory device, the semiconductor device, and the like of one embodiment of the present invention can be used in a large computer.

Figure 37E:
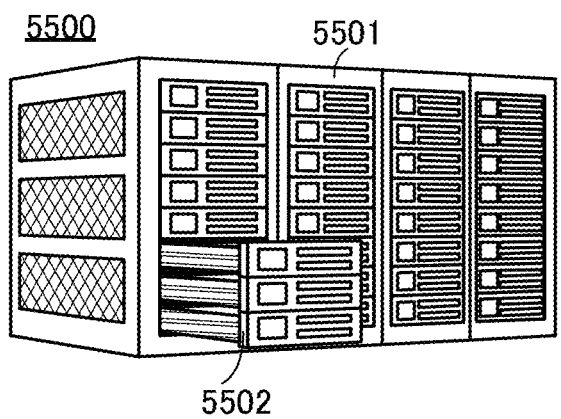
Figure 37F:
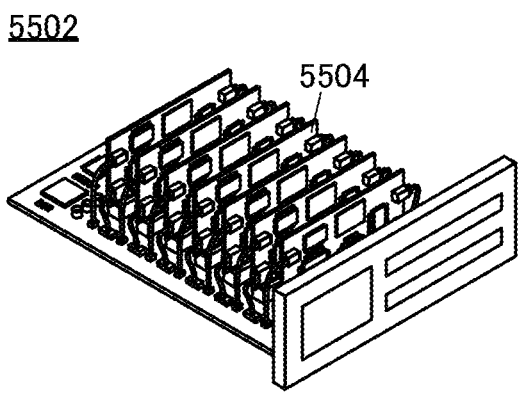

FIG. 37E illustrates a supercomputer 5500 as an example of a large computer. FIG. 37F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computers 5502 are provided with a plurality of substrates 5504, on which a microcontroller of one embodiment of the present invention can be mounted. The use of a downsized microcontroller of one embodiment of the present invention allows effective use of a limited space in the large computer. The memory device, the semiconductor device, or the like of one embodiment of the present invention may be used for storage of the large computer. This results in an increase in the storage capacity per unit area of the storage.

Although FIGS. 37E and 37F illustrate the supercomputer as an example of large computers, the large computer employing the microcontroller of one embodiment of the present invention is not limited thereto. Examples of the large computer employing the microcontroller of one embodiment of the present invention include a computer that provides service (a server) and a large general-purpose computer (a mainframe).

[Household Appliance]

Figure 37G:
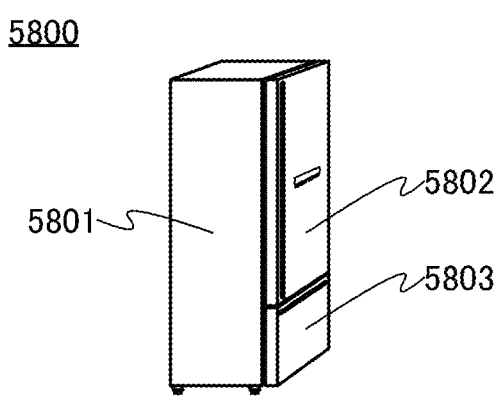

FIG. 37G illustrates an electric refrigerator-freezer 5800 as an example of a household appliance. The electric refrigerator-freezer 5800 includes a housing 5801, a refrigerator door 5802, a freezer door 5803, and the like.

The memory device, the semiconductor device, or the like of one embodiment of the present invention can also be used for the electric refrigerator-freezer 5800. For example, the use of a downsized microcontroller of one embodiment of the present invention for the electric refrigerator-freezer 5800 allows effective use of a limited space in the electric refrigerator-freezer.

The electric refrigerator-freezer is described here as an example of a household appliance; other examples of household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices described in this embodiment, and the functions, effects, and the like of the electronic devices can be combined as appropriate with the description of another electronic device.

This embodiment can be implemented in combination with any of the structures described in the other embodiments and the like, as appropriate.

This application is based on Japanese Patent Application Serial No. 2019-129816 filed with Japan Patent Office on Jul. 12, 2019, and Japanese Patent Application Serial No. 2019-133529 filed with Japan Patent Office on Jul. 19, 2019, the entire contents of which are hereby incorporated by reference.

What is claimed is:

1. A memory device comprising a first memory cell, a second memory cell, a first wiring, a second wiring, a third wiring, a first transistor, and a second transistor,
   wherein the first memory cell and the second memory cell each comprise a third transistor and a fourth transistor,
   wherein a source of the third transistor included in the first memory cell is electrically connected to the third wiring,
   wherein a drain of the third transistor included in the first memory cell is directly connected to a source of the third transistor included in the second memory cell,
   wherein a gate of the third transistor included in the first memory cell is electrically connected to the first wiring,
   wherein a gate of the third transistor included in the second memory cell is electrically connected to the second wiring,
   wherein a source of the fourth transistor included in the first memory cell is electrically connected to the first transistor,
   wherein a drain of the fourth transistor included in the first memory cell is electrically connected to a source of the fourth transistor included in the second memory cell,
   wherein a gate of the fourth transistor included in the first memory cell is electrically connected to the drain of the third transistor included in the first memory cell,
   wherein a gate of the fourth transistor included in the second memory cell is electrically connected to a drain of the third transistor included in the second memory cell,
   wherein a drain of the fourth transistor included in the second memory cell is electrically connected to the second transistor, and
   wherein the fourth transistor included in the first memory cell and the fourth transistor included in the second memory cell each include a back gate.

2. The memory device according to claim 1, wherein the drain of the third transistor included in each of the memory cells is provided with a capacitor.

3. The memory device according to claim 1, wherein the third transistor included in each of the memory cells comprises an oxide semiconductor in a semiconductor layer.

4. The memory device according to claim 1, wherein the fourth transistor included in each of the memory cells comprises an oxide semiconductor in a semiconductor layer.

5. The memory device according to claim 4, wherein the oxide semiconductor comprises one or more of indium and zinc.

6. The memory device according to claim 1, wherein the drain of the fourth transistor included in the first memory cell is directly connected to the source of the fourth transistor included in the second memory cell.

7. The memory device according to claim 1, wherein different signals are supplied to the gate of the third transistor included in the first memory cell and the gate of the third transistor included in the second memory cell.

8. A memory device comprising n (n is an integer of 3 or more) memory cells, n word lines, a bit line, a first transistor, and a second transistor,
   wherein the n memory cells each comprise a third transistor and a fourth transistor,
   wherein a source of the third transistor included in a first memory cell is electrically connected to the bit line,
   wherein a drain of the third transistor included in the first memory cell is electrically directly connected to a source of the third transistor included in a second memory cell,
   wherein a gate of the third transistor included in the first memory cell is electrically connected to a first word line,
   wherein a source of the fourth transistor included in the first memory cell is electrically connected to the first transistor, wherein a drain of the fourth transistor included in the first memory cell is electrically connected to a source of the fourth transistor included in the second memory cell, wherein a gate of the fourth transistor included in the first memory cell is electrically connected to the drain of the third transistor included in the first memory cell, wherein a source of the third transistor included in an i-th (i is an integer greater than or equal to 2 and less than n) memory cell is electrically connected to a drain of the third transistor included in an i−1-th memory cell, wherein a drain of the third transistor included in the i-th memory cell is electrically connected to a source of the third transistor included in an i+1-th memory cell, wherein a gate of the third transistor included in the i-th memory cell is electrically connected to an i-th word line, wherein a source of the fourth transistor included in the i-th memory cell is electrically connected to a drain of the fourth transistor included in the i−1-th memory cell, wherein a drain of the fourth transistor included in the i-th memory cell is electrically connected to a source of the fourth transistor included in the i+1-th memory cell, wherein a gate of the fourth transistor included in the i-th memory cell is electrically connected to the drain of the third transistor included in the i-th memory cell, wherein a source of the third transistor included in an n-th memory cell is electrically connected to a drain of the third transistor included in an n−1-th memory cell, wherein a gate of the third transistor included in the n-th memory cell is electrically connected to an n-th word line, wherein a source of the fourth transistor included in the n-th memory cell is electrically connected to a drain of the fourth transistor included in the n−1-th memory cell, wherein a drain of the fourth transistor included in the n-th memory cell is electrically connected to the second transistor, wherein a gate of the fourth transistor included in the n-th memory cell is electrically connected to a drain of the third transistor included in the n-th memory cell, and wherein the fourth transistor included in each of the n memory cells includes a back gate.

9. The memory device according to claim 8, wherein the drain of the third transistor included in each of the memory cells is provided with a capacitor.

10. The memory device according to claim 8, wherein the third transistor included in each of the memory cells comprises an oxide semiconductor in a semiconductor layer.

11. The memory device according to claim 8, wherein the fourth transistor included in each of the memory cells comprises an oxide semiconductor in a semiconductor layer.

12. The memory device according to claim 11, wherein the oxide semiconductor comprises one or more of indium and zinc.

13. The memory device according to claim 8, wherein the drain of the fourth transistor included in the first memory cell is directly connected to the source of the fourth transistor included in the second memory cell.

14. A memory device comprising n (n is an integer of 3 or more) memory cells, n word lines, a first wiring, a first bit line, a second bit line, a first transistor, a second transistor, and a fifth transistor, wherein the n memory cells each comprise a third transistor and a fourth transistor, wherein a source of the third transistor included in a first memory cell is electrically connected to the first bit line, wherein a drain of the third transistor included in the first memory cell is directly connected to a source of the third transistor included in a second memory cell, wherein a gate of the third transistor included in the first memory cell is electrically connected to a first word line, wherein a source of the fourth transistor included in the first memory cell is electrically connected to the first transistor, wherein a drain of the fourth transistor included in the first memory cell is electrically connected to a source of the fourth transistor included in the second memory cell, wherein a gate of the fourth transistor included in the first memory cell is electrically connected to the drain of the third transistor included in the first memory cell, wherein a source of the third transistor included in an i-th (i is an integer greater than or equal to 2 and less than n) memory cell is electrically connected to a drain of the third transistor included in an i−1-th memory cell, wherein a drain of the third transistor included in the i-th memory cell is electrically connected to a source of the third transistor included in an i+1-th memory cell, wherein a gate of the third transistor included in the i-th memory cell is electrically connected to an i-th word line, wherein a source of the fourth transistor included in the i-th memory cell is electrically connected to a drain of the fourth transistor included in the i−1-th memory cell, wherein a drain of the fourth transistor included in the i-th memory cell is electrically connected to a source of the fourth transistor included in the i+1-th memory cell, wherein a gate of the fourth transistor included in the i-th memory cell is electrically connected to the drain of the third transistor included in the i-th memory cell, wherein a source of the third transistor included in an n-th memory cell is electrically connected to a drain of the third transistor included in an n−1-th memory cell, wherein a gate of the third transistor included in the n-th memory cell is electrically connected to an n-th word line, wherein a source of the fourth transistor included in the n-th memory cell is electrically connected to a drain of the fourth transistor included in the n−1-th memory cell, wherein a drain of the fourth transistor included in the n-th memory cell is electrically connected to the second transistor, wherein a gate of the fourth transistor included in the n-th memory cell is electrically connected to a drain of the third transistor included in the n-th memory cell, wherein the drain of the third transistor included in the n-th memory cell is electrically connected to a source of the fifth transistor, wherein a drain of the fifth transistor is electrically connected to the second bit line, wherein a gate of the fifth transistor is electrically connected to the first wiring, and wherein the fourth transistor included in each of the n memory cells includes a back gate.

15. The memory device according to claim 14, wherein the drain of the third transistor included in each of the memory cells is provided with a capacitor.

16. The memory device according to claim 14,
wherein the third transistor included in each of the memory cells comprises an oxide semiconductor in a semiconductor layer.

17. The memory device according to claim 14,
wherein the fourth transistor included in each of the memory cells comprises an oxide semiconductor in a semiconductor layer.

18. The memory device according to claim 17,
wherein the oxide semiconductor comprises one or more of indium and zinc.

19. The memory device according to claim 14,
wherein the drain of the fourth transistor included in the first memory cell is directly connected to the source of the fourth transistor included in the second memory cell.

* * * * *